(12) United States Patent
Lejosne et al.

(10) Patent No.: US 11,114,730 B2
(45) Date of Patent: Sep. 7, 2021

(54) ACCUMULATOR BATTERY PACK, COMPRISING DEVICES FOR PASSIVE MAGNETIC BETWEEN ACCUMULATORS AND BUSBARS, AND, WHERE APPROPRIATE, PASSIVE SHUNT OF ONE OR MORE ACCUMULATORS IN CASE OF FAILURE OF THESE ONES

(71) Applicant: COMMISSARIAT A L'ENERGIE ATOMIQUE ET AUX ENERGIES ALTERNATIVES, Paris (FR)

(72) Inventors: Johann Lejosne, Grenoble (FR); Pierre Jost, Grenoble (FR); Pierre Perichon, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 167 days.

(21) Appl. No.: 16/568,307

(22) Filed: Sep. 12, 2019

(65) Prior Publication Data

US 2020/0083515 A1 Mar. 12, 2020

(30) Foreign Application Priority Data

Sep. 12, 2018 (FR) ..................................... 18 58188

(51) Int. Cl.
*H01M 2/02* (2006.01)
*H01M 50/543* (2021.01)
(Continued)

(52) U.S. Cl.
CPC ....... *H01M 50/543* (2021.01); *H01M 10/052* (2013.01); *H01M 10/4235* (2013.01);
(Continued)

(58) Field of Classification Search
CPC ............. H01M 50/543; H01M 50/502; H01M 50/531; H01M 50/572; H01M 50/172;
(Continued)

(56) References Cited

U.S. PATENT DOCUMENTS 3,686,530 A * 8/1972 Bogut ....................... H02H 3/05
361/57
8,642,205 B2 * 2/2014 Maleki .................. H01M 10/42
429/158

(Continued)

FOREIGN PATENT DOCUMENTS

KR 10-2014-0039451 A 4/2014

OTHER PUBLICATIONS

French Preliminary Search Report dated Apr. 10, 2019 in French Application 18 58188, filed on Sep. 12, 2018 (with English Translation of categories of Cited Documents).

(Continued)

*Primary Examiner* — Raymond Alejandro
(74) *Attorney, Agent, or Firm* — Oblon, McClelland, Maier & Neustadt, L.L.P.

(57) ABSTRACT

A battery pack wherein each battery is mechanically and electrically connected by a magnetic device to a busbar. In case of failure of any accumulator, it is disconnected completely passively because its failure generates an inactivation of the magnetic device. The disconnection causes the gravity drop of the accumulator and the possibly completely passive implementation of an accumulator shunt.

21 Claims, 25 Drawing Sheets

(51) Int. Cl.
  *H01M 10/643* (2014.01)
  *H01M 10/654* (2014.01)
  *H01M 10/6553* (2014.01)
  *H01M 10/052* (2010.01)
  *H01M 10/42* (2006.01)
  *H05K 3/32* (2006.01)
  *H01M 50/155* (2021.01)
  *H01M 50/172* (2021.01)
  *H01M 50/502* (2021.01)
  *H01M 50/531* (2021.01)
  *H01M 50/572* (2021.01)

(52) U.S. Cl.
  CPC ....... *H01M 10/643* (2015.04); *H01M 10/654* (2015.04); *H01M 10/6553* (2015.04); *H01M 50/155* (2021.01); *H01M 50/172* (2021.01); *H01M 50/502* (2021.01); *H01M 50/531* (2021.01); *H01M 50/572* (2021.01); *H05K 3/326* (2013.01); *H01M 2200/10* (2013.01); *H05K 2201/083* (2013.01)

(58) Field of Classification Search
  CPC ............. H01M 50/155; H01M 10/643; H01M 10/654; H01M 10/6553; H01M 10/052; H01M 10/4235; H01M 2200/10; H05K 3/326; H05K 2201/083
  See application file for complete search history.

(56) References Cited

U.S. PATENT DOCUMENTS

| | | | |
|---|---|---|---|
| 10,193,422 B2 * | 1/2019 | Kouda | ................... B25B 21/00 |
| 10,749,361 B2 * | 8/2020 | Jeon | ........................ H02J 7/342 |
| 2011/0223776 A1 | 9/2011 | Ferber, Jr. | |
| 2013/0089990 A1 | 4/2013 | Ferber, Jr. | |

OTHER PUBLICATIONS

Soka, M. et al. "Role of Thermomagnetic Curves at Preparation of NiZn Ferrites with Fe Ions Deficiency", Journal of Electrical Engineering, vol. 61, No. 7/s, 2010 pp. 163-165.
Murakami, K. "The Characteristics of Ferrite Cores with Low Curie Temperature and their Application", IEEE Transactions on Magnetics, 1965, 5 pages.
Feng, X. et al. "Key Characteristics for Thermal Runaway of Li-ion Batteries", Energy Procedia 158, 2019, pp. 4684-4689.

* cited by examiner

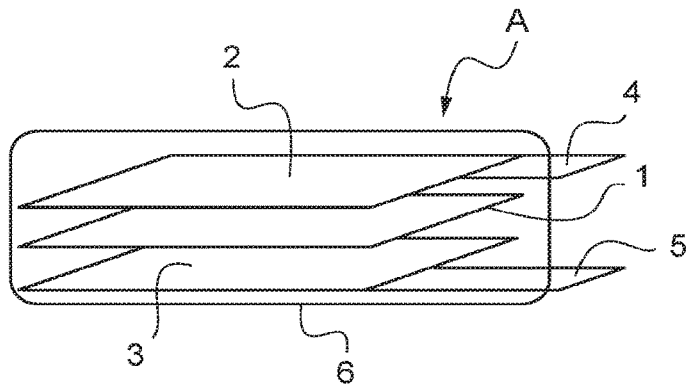
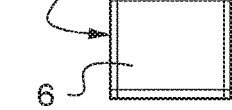
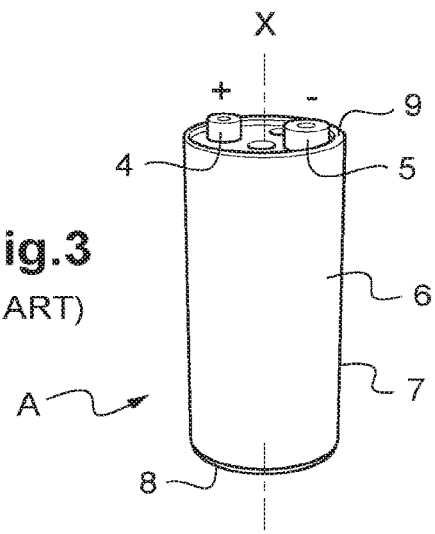
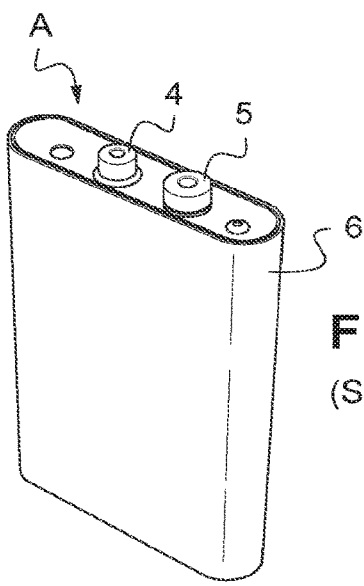
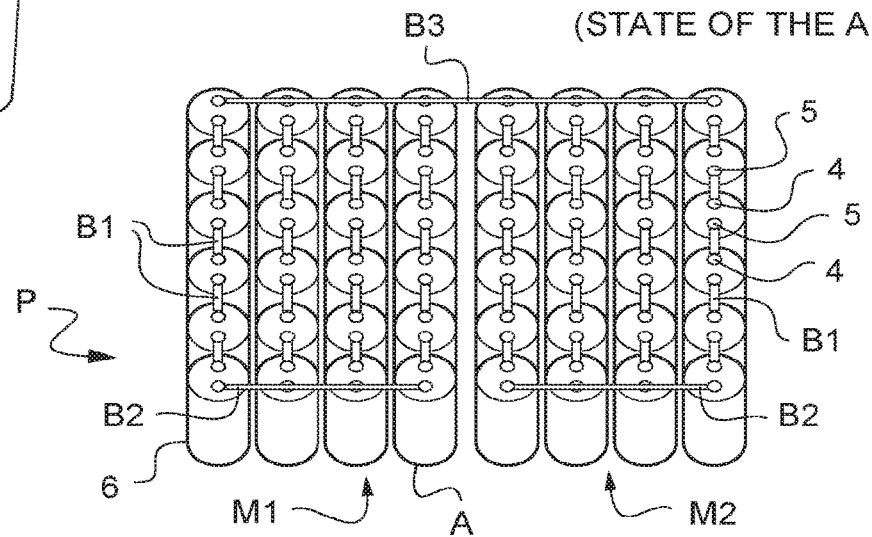

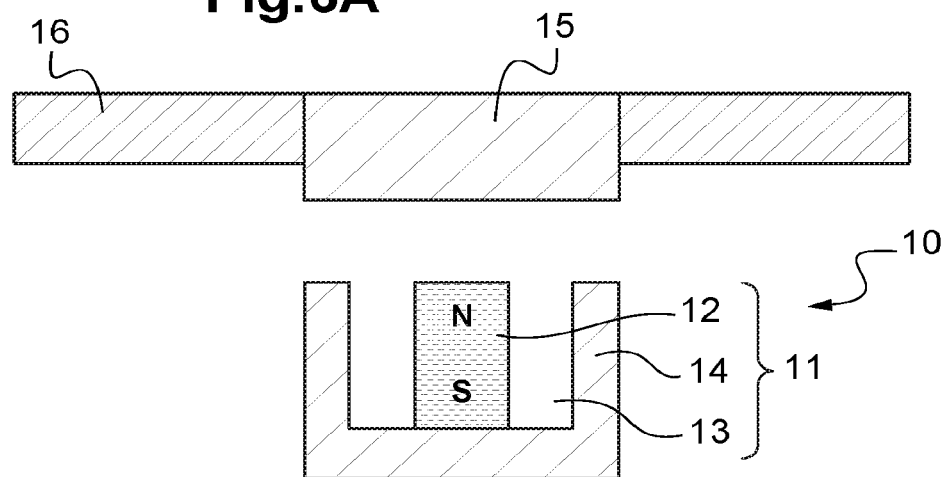
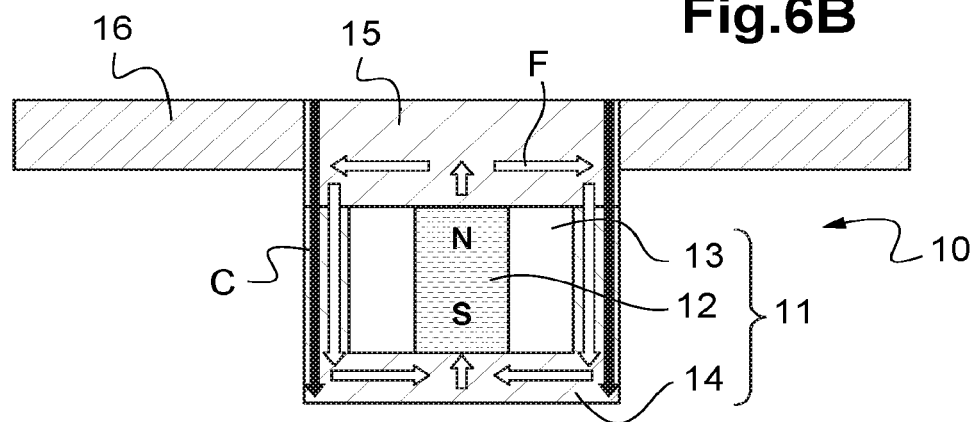

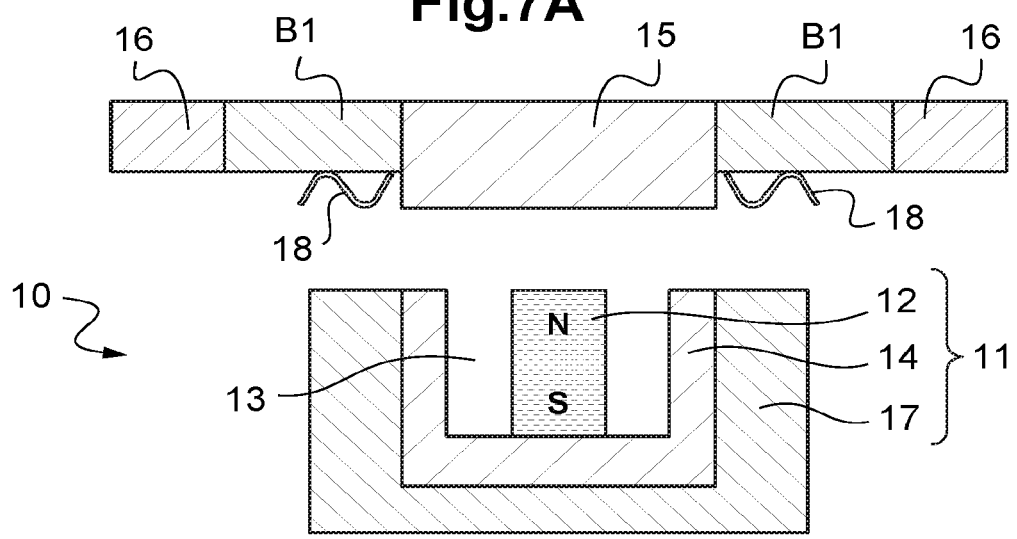
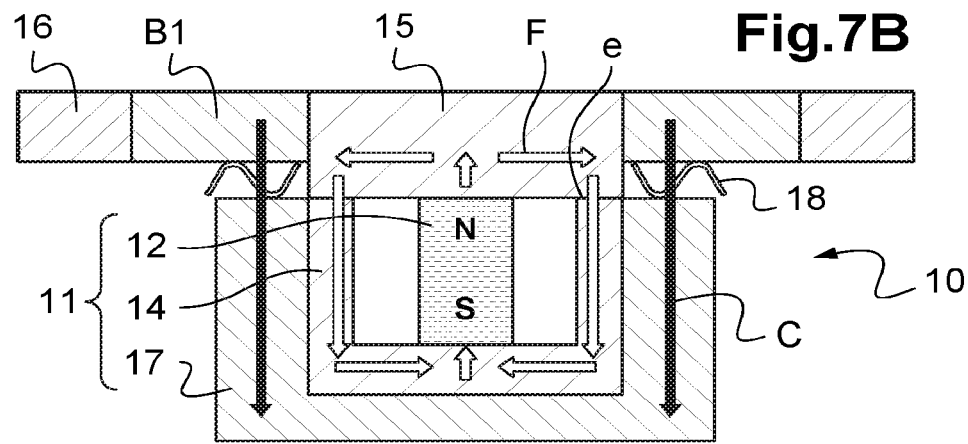
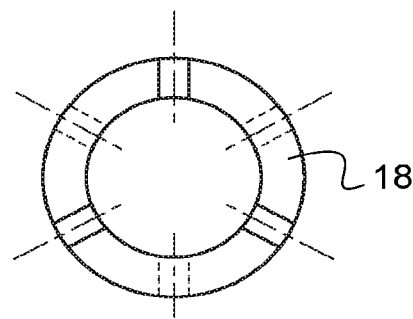
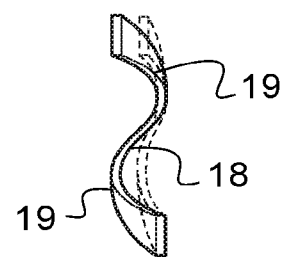

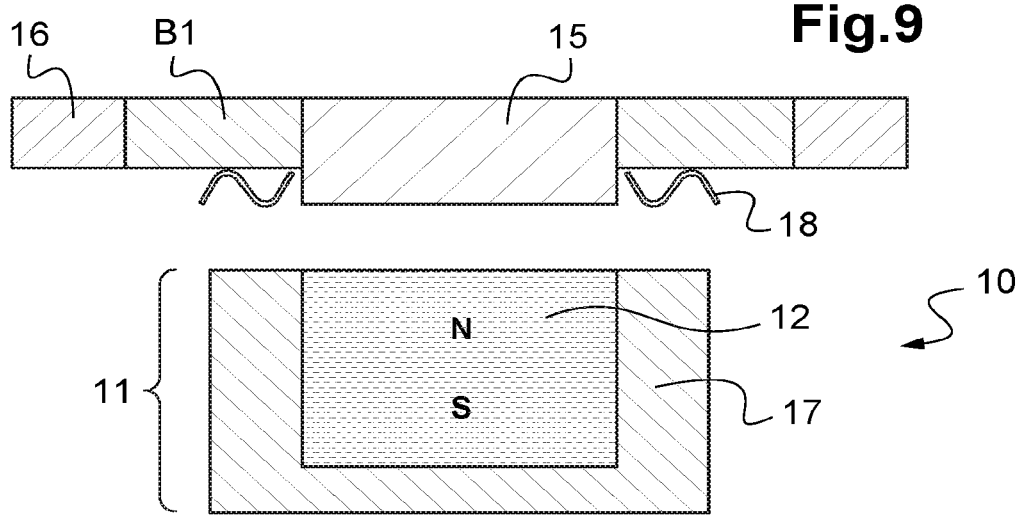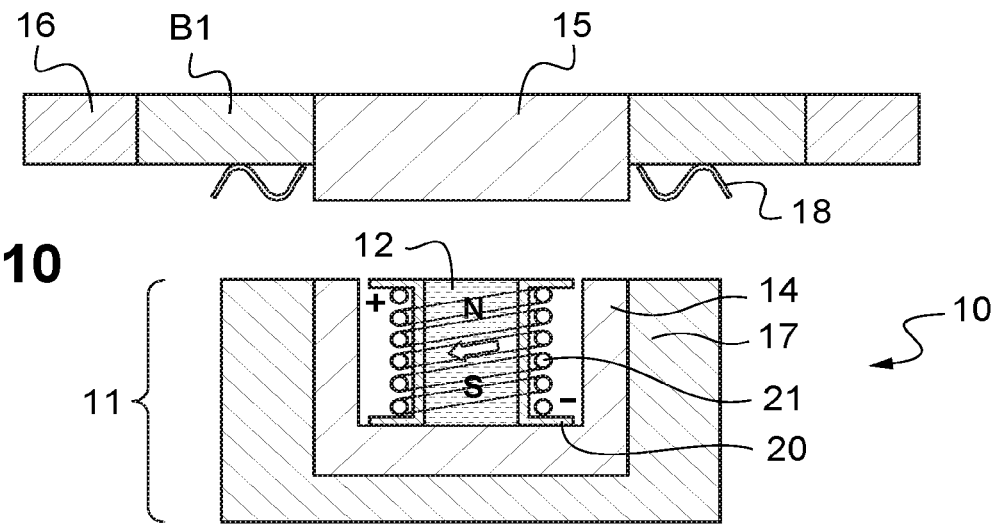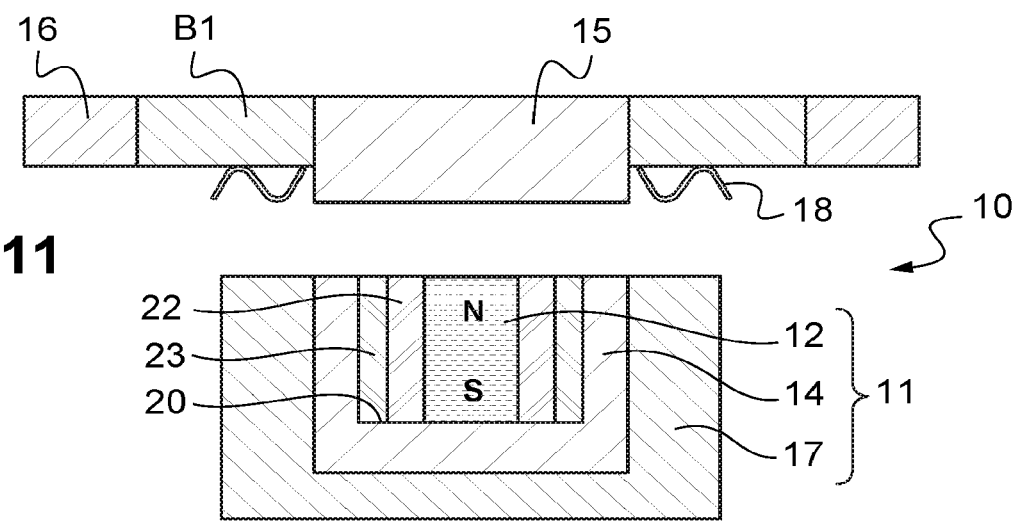

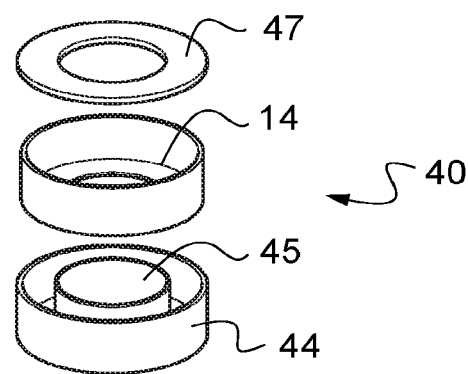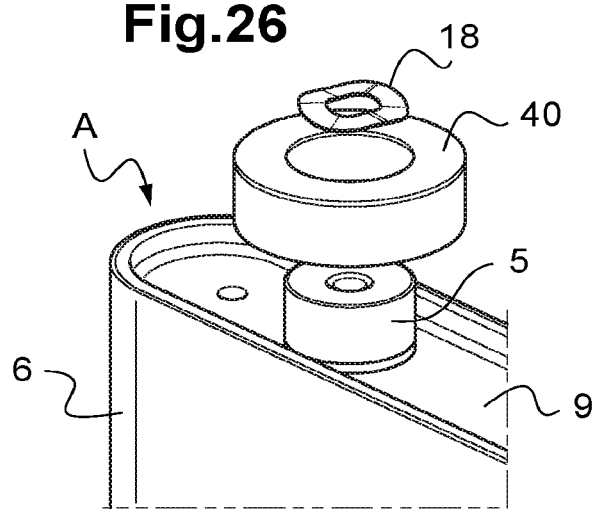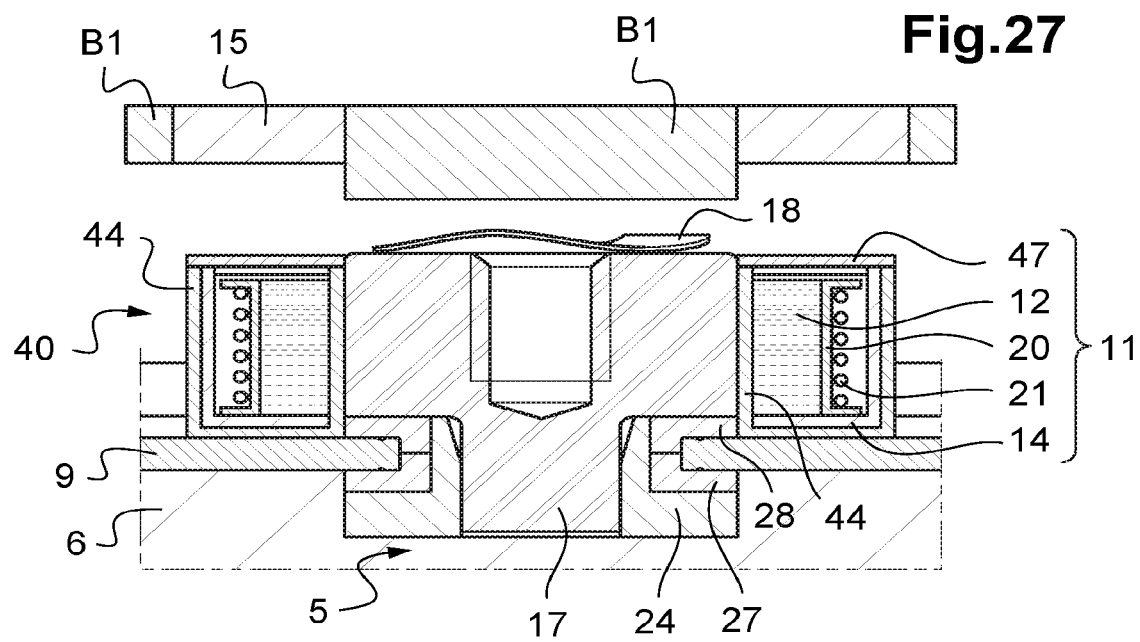

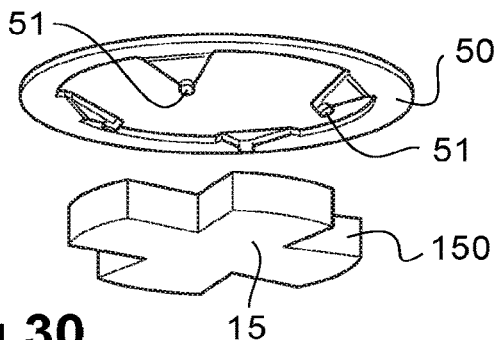
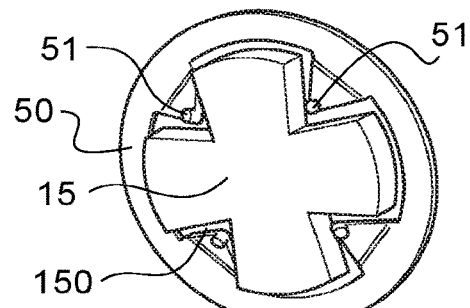
Fig.30  Fig.31
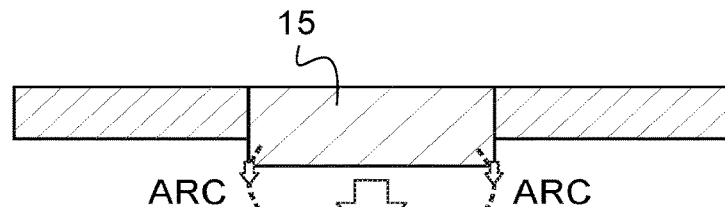
Fig.32
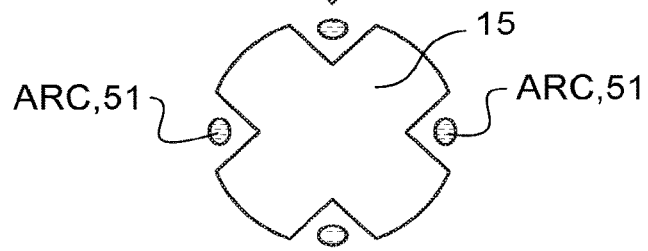
Fig.33A
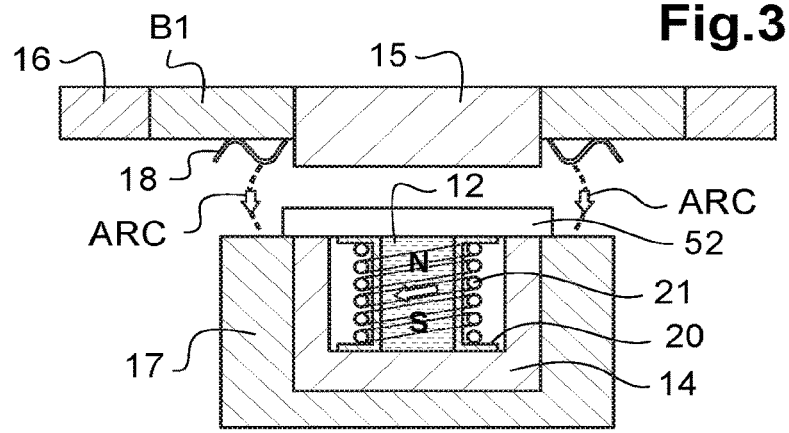
Fig.33B
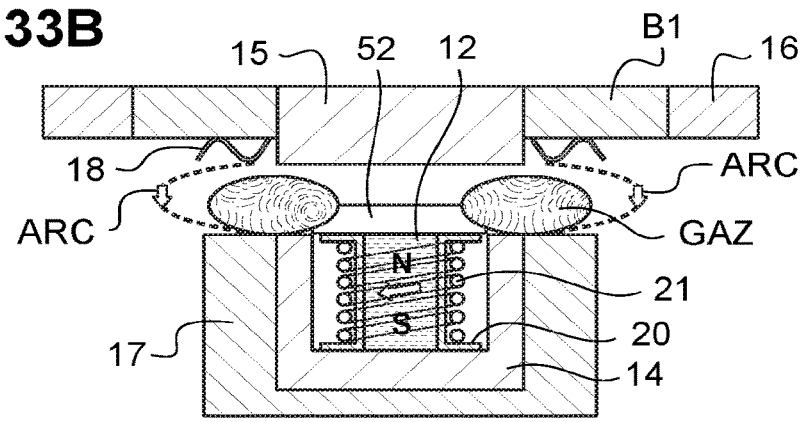

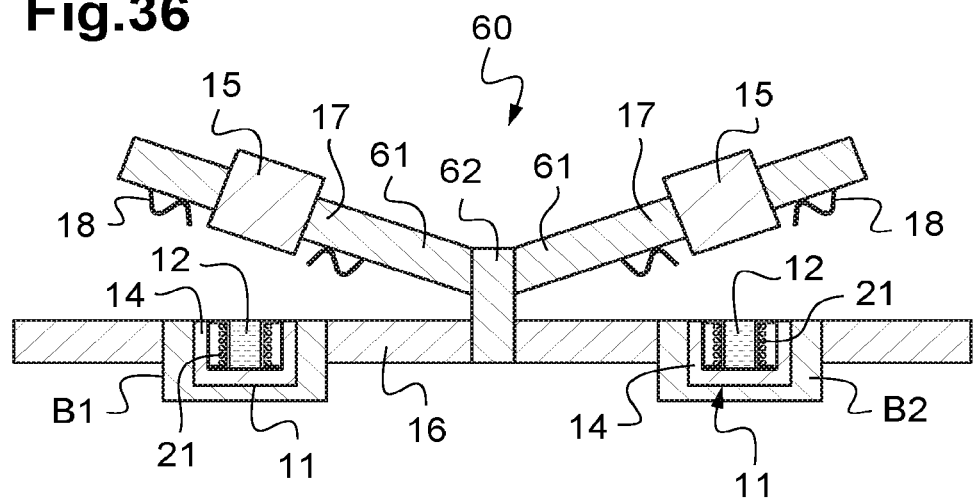
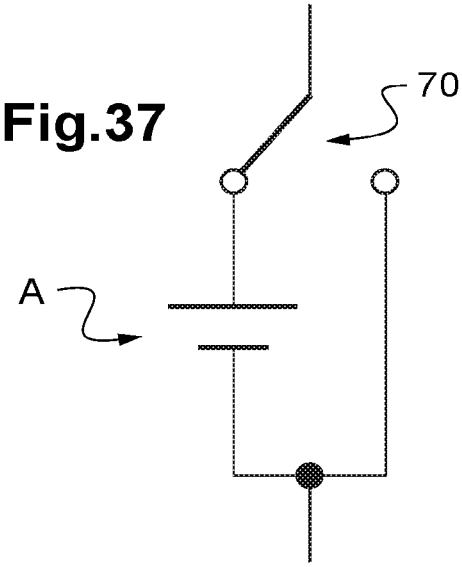
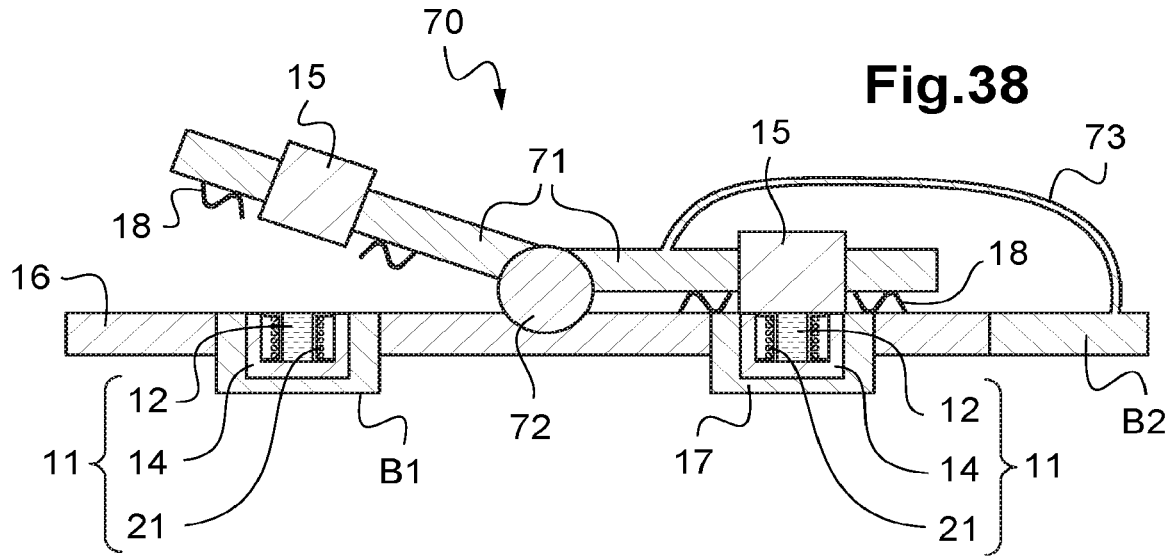

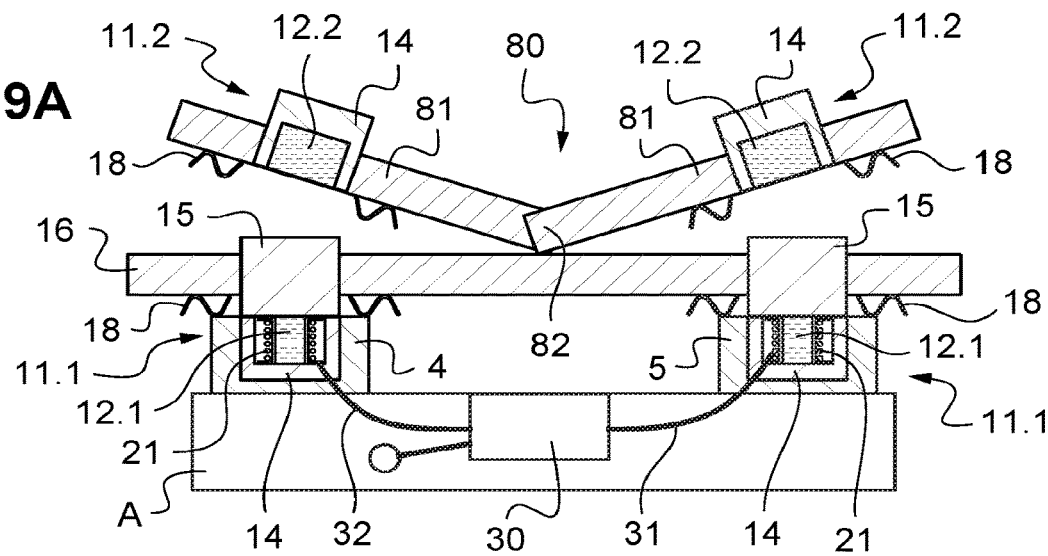
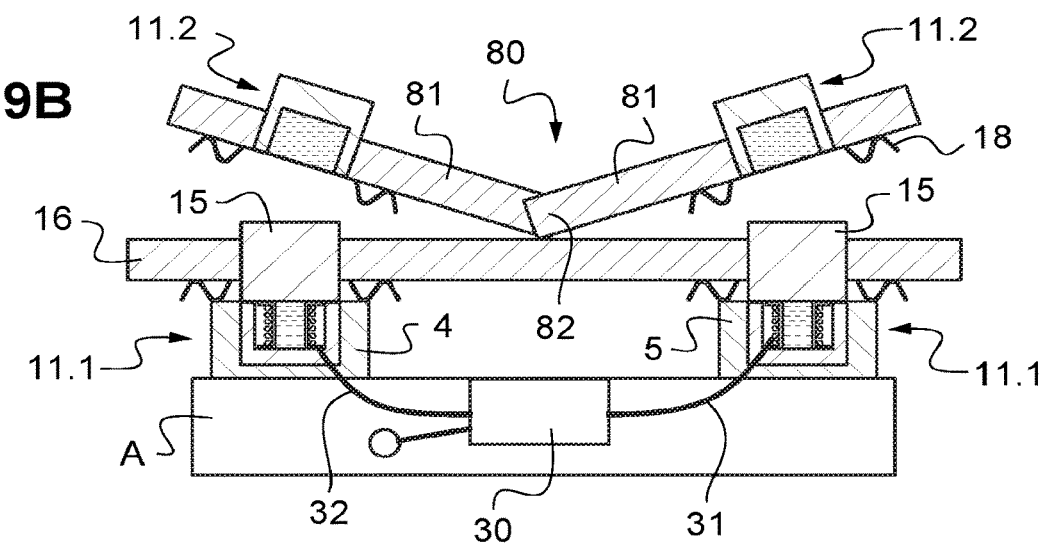
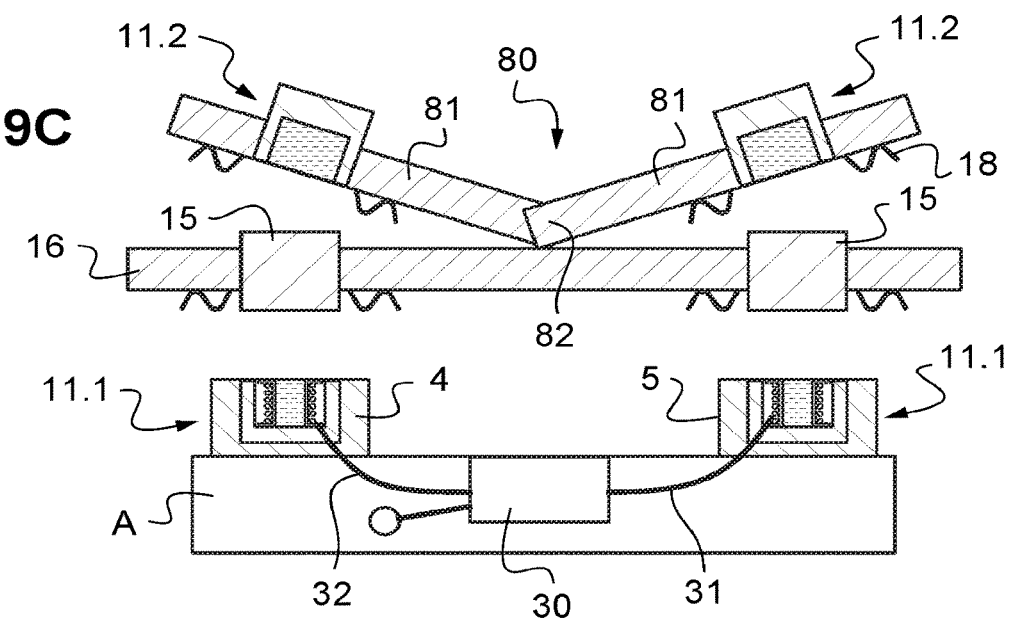

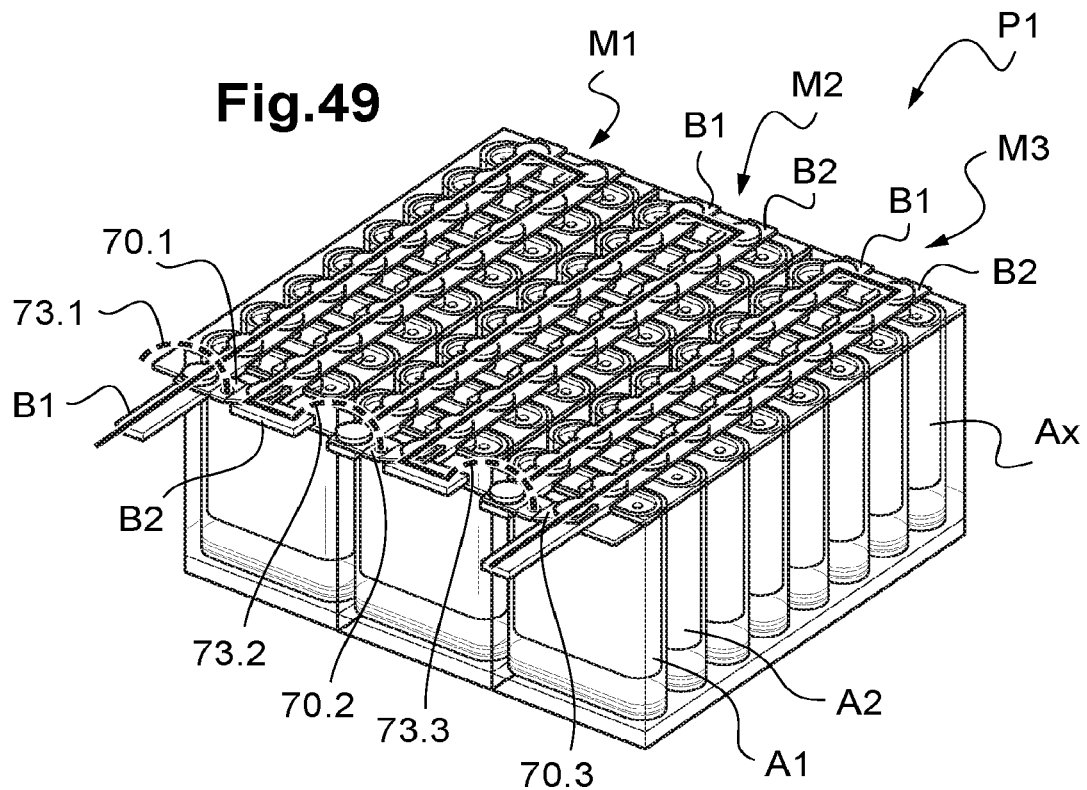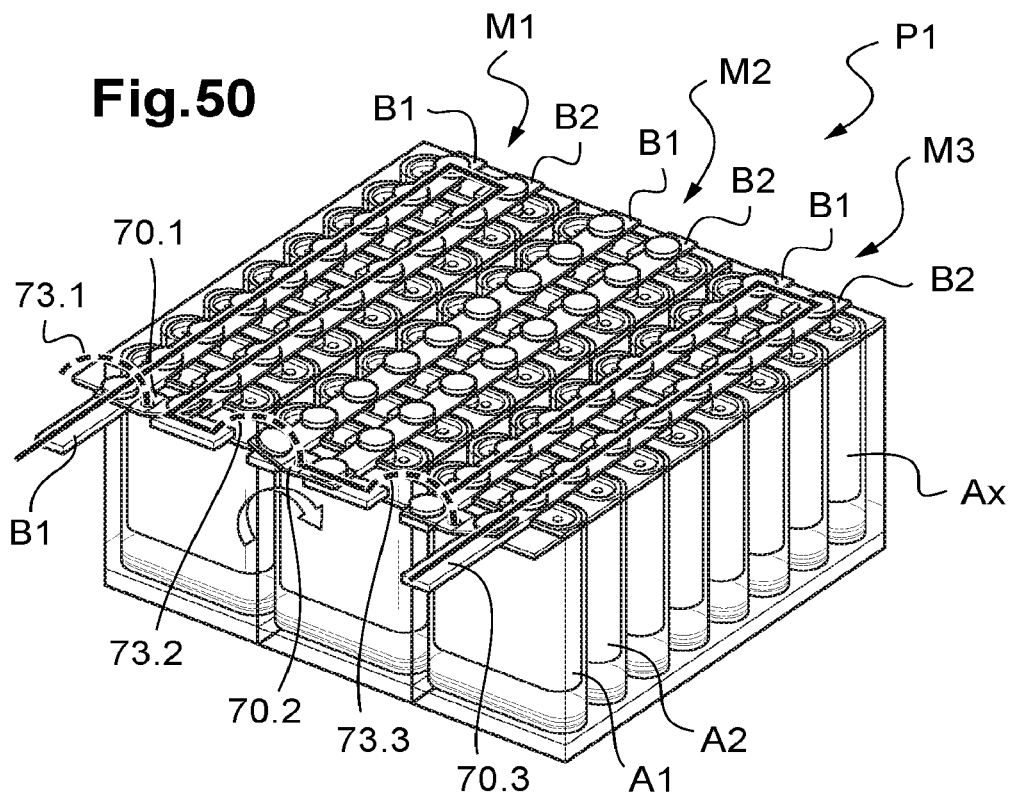

ACCUMULATOR BATTERY PACK, COMPRISING DEVICES FOR PASSIVE MAGNETIC BETWEEN ACCUMULATORS AND BUSBARS, AND, WHERE APPROPRIATE, PASSIVE SHUNT OF ONE OR MORE ACCUMULATORS IN CASE OF FAILURE OF THESE ONES

TECHNICAL FIELD

The present invention relates to the field of metal-ion or other chemistry (lead, etc.) batteries or accumulators.

The invention firstly targets improving the attendant assembly, cost and safety of a battery pack with a plurality of batteries or accumulators with electrically connecting bars, called busbars.

For that, the invention proposes connection/disconnection and, if necessary, shunt devices based on magnetic locking/unlocking for each unitary accumulator or for a branch of accumulators within a battery pack.

These devices based on magnetic locking/unlocking further make it possible to obtain an active or passive control of the battery pack through one or more electronic control systems (BMS), particularly in order to modulate the effective power of the pack and to guarantee a safety and continuity of operation of the pack in case of failure of one or more accumulators.

Although described with reference to a lithium-ion accumulator, the invention applies to any metal-ion electrochemical accumulator, that is to say also sodium-ion, magnesium-ion, aluminum-ion, even other chemistries (lead, etc.).

PRIOR ART

As illustrated schematically in FIGS. 1 and 2, a lithium-ion battery or accumulator usually comprises at least one electrochemical cell C composed of an electrolyte-soaked separating component 1 between a positive electrode or cathode 2 and a negative electrode or anode 3, a current collector 4 connected to the cathode 2, a current collector 5 connected to the anode 3 and, finally, a packaging 6 arranged to contain the electrochemical cell with seal-tightness while being passed through by a part of the current collectors 4, 5.

Several types of accumulator architecture geometry are known:
  a cylindrical geometry as disclosed in the patent application US 2006/0121348,
  a prismatic geometry as disclosed in the U.S. Pat. Nos. 7,348,098, 7,338,733;
  a stack geometry as disclosed in the patent applications US 2008/060189, US 2008/0057392, and the U.S. Pat. No. 7,335,448.

The electrolyte component 1 can be of solid, liquid or gel form. In the latter form, the component can comprise a separator made of polymer, of ceramic or of microporous composite soaked with organic electrolyte(s) or of ionic liquid type which allows the displacement of the lithium ion from the cathode to the anode for a charge and in reverse for a discharge, which generates the current. The electrolyte is generally a mixture of organic solvents, for example carbonates to which is added a lithium salt, typically LiPF6.

The positive electrode or cathode 2 is composed of lithium cation inserting materials which are generally composite, such as $LiFePO_4$, $LiCoO_2$, $LiNi_{0.33}Mn_{0.33}Co_{0.33}O_2$.

The negative electrode or anode 3 is very often composed of graphite carbon or of $Li_4TiO_5O_{12}$ (titanate material), possibly also based on silicon or on composite formed based on silicon.

The current collector 4 connected to the positive electrode is generally made of aluminum.

The current collector 5 connected to the negative electrode is generally made of copper, of nickel-plated copper or of aluminum.

A lithium-ion battery or accumulator can of course comprise a plurality of electrochemical cells which are stacked one on top of the other.

Traditionally, an Li-ion battery or accumulator uses a pair of materials at the anode and at the cathode allowing it to operate with a high voltage level, typically equal to 3.6 volts.

According to the type of application targeted, the aim is to produce either a thin and flexible lithium-ion accumulator or a rigid accumulator: the packaging is then either flexible or rigid and in the latter case constitutes a kind of housing.

The flexible packagings are usually manufactured from a multi-layer composite material, composed of a stack of aluminum layers covered by one or more glue-laminated polymer film(s).

The rigid packagings are, for their part, used when the targeted applications are restrictive or a long life span is sought, with, for example, very much higher pressures to be withstood and a stricter required level of seal-tightness, typically lower than $10^{-8}$ mbar·1/s, or in media with high stresses such as the aeronautical or space domain.

Also, to date, a rigid packaging used is composed of a housing, generally made of metal, typically of stainless steel (inox 316L or inox 304) or of aluminum (Al 1050 or Al 3003), or even of titanium. Furthermore, aluminum is generally preferred for its high coefficient of thermal conductivity as explained hereinbelow.

The geometry of most of the rigid housings of Li-ion accumulator packagings is cylindrical, because most of the electrochemical cells of the accumulators are wound by winding according to a cylindrical geometry around a cylindrical mandrel. Prismatic housing forms have also already been produced by winding around a prismatic mandrel.

One of the types of rigid housing of cylindrical form, usually manufactured for a high-capacity Li-ion accumulator, is illustrated in FIG. 3.

A rigid housing of prismatic form is also shown in FIG. 4.

The housing 6 comprises a cylindrical lateral jacket 7, a bottom 8 at one end, a cover 9 at the other end, the bottom 8 and the cover 9 being assembled with the jacket 7. The cover 9 supports the current poles or output terminals 4, 5. One of the output terminals (poles), for example the positive terminal 4, is welded onto the cover 9 whereas the other output terminal, for example the negative terminal 5, passes through the cover 9 with the insertion of a seal which is not represented which electrically insulates the negative terminal 5 from the cover.

The type of rigid housing widely manufactured also consists in a stamped cup and a cover, welded together over their periphery by laser-welding. On the other hand, the current collectors comprise a bushing with a part protruding on the top of the housing and which forms a terminal, also called visible pole of the battery.

The difficulty in producing such a terminal lies primarily in the assembly of the various components of the battery in order to have a robust design. The nature of the materials used is also important in order to be compatible with certain electrochemical pairings. In effect, the Li-ion technology preferably requires the purest possible aluminum grade to be selected within the accumulator to avoid the presence of pollutions and the generation of galvanic couples in the presence of the electrolyte potentially leading to corrosion.

In addition, a terminal as seal-tight bushing needs to be mechanically robust and observe the following conditions:
- not be deformed during the steps of assembly of the accumulator;
- allow the assembly of the accumulator with a busbar and ensure the passage of the current with the latter;
- remain whole throughout the life span of an accumulator in its application, that is to say withstand vibrations, mechanical impacts, temperature and pressure variations, and the like, without deformation and without leaking;
- allow the draining of high currents that can exceed 50 A, in the case of an accumulator on its own, of rated capacity lower than 5 Ah, in order to be able to be used in power applications.

Generally, the seal-tight bushings forming the output terminals of Li-ion accumulators are made of nickel-plated copper because the negative electrode is very often composed of graphite and therefore coated on copper but can also be made of aluminum for materials such as titanate, sodium or silicon which have particular features of being coated on an aluminum substrate.

Patent application FR2989836 discloses a bushing forming an output terminal of a metal-ion accumulator which makes it possible to make very high currents, typically of the order of 100 A, circulate.

A battery pack P is composed of a variable number of accumulators that can be as high as several thousand, which are electrically linked in series or in parallel to one another and generally by mechanical and electrical connecting bars or tracks, usually called busbars.

Generally, several electrical architectures can be defined within a battery pack P. Thus, accumulators can be linked to one another in parallel, that is to say with all the positive terminals linked to one another and all the negative terminals also linked to one another. These links form a branch which can be linked in series to another branch. It is also possible to have accumulators linked to one another in series, that is to say that the positive terminals are linked to the negative terminals. These links form a branch which can be linked in parallel to another branch.

Whatever the architecture, each branch in series or in parallel can generally comprise from two to several tens of accumulators.

The accumulators of the current battery packs are generally assembled on one or more busbars by welding, screwing or hooping.

An example of battery pack P is shown in FIG. 5. This pack is composed of two modules M1, M2 of Li-ion accumulators A that are identical and linked to one another in series, each module M1, M2 being composed of four rows of accumulators linked in parallel, each row being composed of a number equal to six of Li-ion accumulators.

As represented, the mechanical and electrical connection between two Li-ion accumulators of one and the same row is produced by screwing busbars B1, advantageously made of copper, each linking a positive terminal 4 to a negative terminal 5. The connection between two rows of accumulators in parallel within one and the same module M1 or M2 is ensured by a busbar B2, also advantageously made of copper. The connection between the two modules M1, M2 is ensured by a busbar B3, also advantageously made of copper.

Such assembly is relatively lengthy with relatively high production costs.

Moreover, the live accumulators which have to be handled require the operator to obtain restrictive accreditations, of TST type.

The patent CN 2285515 presents a magnetic support for a low-voltage accumulator which offers the advantage of rapid connection without gripping of the accumulator. This fixing can be used for different charging/discharging applications, etc. with low-energy accumulators. However, it is not compatible with high-voltage accumulators placed in series on a busbar within a battery pack.

In the development and the manufacturing of lithium-ion batteries, for each charge/discharge profile specific to each new demand, whatever the market players, this requires accurate dimensioning (series/parallel electrical, mechanical, thermal and other architectures) to optimally design a powerful and safe battery pack.

A lithium electrochemical system, whether it be on cell, module or pack scale, produces exothermic reactions whatever the given cycling profile. Thus, on the scale of a unitary accumulator, depending on the chemistries considered, the optimal operation of the lithium-ion accumulators is limited within a certain temperature range.

An accumulator must monitor its temperature, typically generally below 70° C. on its outer housing surface, in order to avoid thermal runaway which could be followed by a generation of gas and explosion and/or fire.

Also, maintaining a temperature lower than 70° C. makes it possible to increase its life span, because, the higher the operating temperature of an accumulator, the more reduced its life span will be.

Furthermore, some accumulator chemistries require an operating temperature well above ambient temperature and consequently, it proves necessary to regulate their temperature level by an initial preheating of the accumulators, even by permanently maintaining the accumulators at a temperature.

In a battery, or battery pack with several high-energy Li-ion accumulators, typically higher than 1 kW·h, several accumulators are placed in series to obtain the level of voltage required and are of parallel connection to obtain the current to be supplied. The series/parallel connection can be done at the level of the accumulators, of the modules, with a wide variety of wiring topology.

The series or parallel connection of more or less different accumulators can have consequences on the resultant performance levels and durability for the pack.

It is thus recognized that, in a battery pack, for example of an electric vehicle, the aging dispersions can be high as a function, for example, of the position of the accumulators, as a result of aging dissymmetries between the accumulators or of usage differences (thermal variations between the core and the edges of the pack, current gradient, etc.). Thus, differences in state of health SOH of the order of 20% between accumulators of one and the same pack can be observed.

Also, in order to limit the premature aging of the pack, it is necessary to optimize the operating temperature and the temperature dispersion from one accumulator to another. An accumulator (or accumulators) which ages (age) faster than the others can have a direct impact on the electrical performance levels of the complete battery pack.

Generally, a failure of one accumulator in a battery pack can have several impacts:
- the release, on the one hand, of the energy stored in the faulty accumulator and, on the other hand, of the energy of other accumulators of the pack. Depending on the topology chosen for the pack, the energy added by the other accumulators of the pack can lead to a risk of fire or of explosion which did not exist on the accumulator on its own;

electrochemical reactions at the core of the accumulators can lead to the destruction of the unitary accumulators and provoke a propagation of a fault internal to the accumulator (generally an internal short circuit) leading to the explosion of the pack. The degradation energy of the internal components can thus be high. In this case, it is also necessary to have recourse to a control system (BMS) in order to protect the other cells of the pack, as specified hereinbelow;

the complete pack may no longer be used for the application or be in degraded mode (lower energy for example). Thus, if a fault of one accumulator in a pack is observed, it is important to isolate it rapidly, make it inert, and ensure a continuity of service of the remaining pack. For example, a lithium-ion battery of an APU incorporated in an aircraft must not disrupt the operation of said aircraft and ensure optimal safety during the flight.

Producing a bypass for a failing metal-ion accumulator within a battery pack has already been proposed.

Thus, the U.S. Pat. No. 5,438,173 presents a sensor capable of producing such a bypass: this sensor makes it possible to detect a failure of the battery and a switch then automatically opens another electrical path around the failing accumulator, circumventing the failure and allowing the rest of the battery system to continue to operate. The bypass switch of the accumulator is designed to be placed in parallel with the accumulator that it protects. This switch comprises two sets of electromechanical actuators which are mounted on the top end of the accumulator housing to actuate two pistons. Each of the electromechanical actuators comprises two coil halves which are held together by a tight winding of a retaining wire which is terminated by a bridge wire linking two electrical terminals of an actuator. Each coil, by virtue of the winding of the retaining wire, can retain a spring plunger. When a sufficient electrical current passes through the terminals and the bridge wire, the latter heats up and breaks, which provokes the unwinding of the retaining wire, and, thereby, the separation of the coils and therefore the freeing of the piston.

The mechanical system described in this patent is in effect complex to implement and does not make it possible to detect the failure by the accumulator itself.

The U.S. Pat. No. 6,093,896 presents a similar system with the same drawbacks, which makes it possible to establish an automatic bypass of a failing accumulator connected in series within a battery pack.

In other words, to date, all of the systems for bypassing a failing accumulator within a battery pack, which have been proposed, are mechanical, generally with an accumulator fault sensor which actuates an electrical bypass of the circuit.

So, to date, there is neither any system designed for an accumulator to shunt it and ensure a continuity of operation of a battery pack, nor any system for disconnecting an accumulator from the busbar of a high-voltage battery pack, typically of several kW, and, a fortiori, any system combining the disconnecting and the inerting of a failing accumulator, in order to avoid a thermal propagation of the fault to the rest of the pack.

"Inerting" is understood here and in the context of the invention to mean the act of stopping the runaway of an accumulator which is generated by undesirable electrochemical reactions within the accumulator.

Moreover, on the module and pack scale, typically below 0° C. for example, it may be necessary to have recourse to a particular control via a BMS, in order to limit the power demanded of the pack and to avoid a degradation of the accumulators.

It is recalled here that the BMS (acronym for "Battery Management System") is used in order to track the state of the different accumulators (total voltage or voltage of each accumulator, temperature, state of charge, depth of discharge, state of health, coolant flow rate, current value, etc.) and to control the different safety elements, such as currents that must not be too high, unsuitable potentials (too high or too low), limit temperatures, and that the function of the BMS is therefore in particular to stop the supply of current as soon as threshold voltage values are reached, i.e. a difference in potential between the two active insertion materials. The BMS therefore stops the operation (charge, discharge) as soon as threshold voltages are reached. A BMS monitors the state of the different elements of a battery pack, such as:

the total voltage or that of the individual accumulators, the temperature, that is to say at least one of the temperatures chosen from the average temperature, coolant intake temperature, coolant output temperature, or the temperature of each accumulator, the state of charge (SOC) or the depth of discharge (DOD) which indicates the level of charge of the pack, the state of health (SOH) which is a defined measurement of the general state of the pack, the flow rate of the heat transfer fluid for cooling all or part of the pack, the electrical current within or outside of the pack, etc.

Beyond a higher temperature, typically of the order of 70° C., it is also necessary to be vigilant because electrochemical reactions can lead to the destruction of the unitary accumulators and provoke a propagation of a fault internal to the accumulator, typically an internal short circuit, to the rest of the components of the battery pack, which can, in the extreme case, lead to the explosion of the pack. In this case, it is also necessary to have recourse to the BMS, in order to protect the accumulators. Consequently, a battery pack generally requires at least one very powerful BMS, in order to generate voltage equalizations. In a battery pack, there can be one or even several BMSs within the pack, even one BMS per accumulator.

Generally, solutions for controlling a battery pack by the BMS to switch accumulators of the pack on demand have already been proposed.

The patent application FR2972306 thus proposes a device for managing individual accumulators of a battery to optimize the charge and the use of the battery. Each individual accumulator of a stage can be controlled on the basis of information measured locally within that very stage.

The patent FR2972307B1 discloses a battery comprising local means for controlling a switch associated with the individual electrochemical cell of the battery. The control circuit of the power transistors is powered directly by the voltage available at the corresponding stage.

Also, the patent FR2926168B1 proposes an electrical circuit, intended in particular for motor vehicles, which comprises an edge network, powering switching members, an electrical energy generator means, and at least one switchable electrical storage means comprising elements capable of supplying a variable voltage, which can also be switched successively so that the switchable electrical storage means can supply a regulated voltage.

All of these patents therefore propose switching-enabling electronic/electrical devices which notably have several supervisory functions. However, they can be complex, require numerous redundancies which are costly and are dependent on the electronics.

To sum up, there is a need to improve:
the solutions for assembling metal-ion accumulators with busbars, in particular in order to reduce their assembly time and cost;
the solutions for disconnecting and shunting one or more failed accumulators within a battery pack, while guaranteeing the continuity of operation thereof in total safety;
the on-demand controlling of the battery pack electrical circuit, in particular in order to render it simpler with less redundancy and lower cost.

The aim of the invention is to at least partly address these needs.

SUMMARY OF THE INVENTION

To do this, the invention relates, in one of its aspects, to a battery pack comprising:
a plurality of electrochemical batteries or accumulators, each comprising:
a housing or a flexible packaging,
a first output terminal and a second output terminal of an opposite polarity to the first output terminal;
at least one of the output terminals comprising:
an electrically conductive part,
a magnetic lock comprising a permanent magnet;
at least one ferromagnetic part secured to an electrical connecting bar, called busbar, forming a closure plate of a magnetic circuit with the magnetic lock of the output terminal;
the battery pack being configured such that:
i/ in normal operation of the accumulator, the magnetic attraction force of the permanent magnet of the output terminal on the closure plate of a first busbar, in the closed magnetic circuit configuration, ensures the mechanical and electrical connection between the output terminal and the first busbar,
ii/ upon a failure of the accumulator provoking an overheating thereof, the permanent magnet of the output terminal heats up and at least to a temperature from which it loses its magnetic properties, to the point of mechanical disconnection between the output terminal and the first busbar, which causes the accumulator to drop through gravity.

The temperature can be the so-called Curie temperature.

Thus, the invention essentially consists of a battery pack in which each battery is mechanically and electrically connected by a magnetic device to a busbar. In case of failure of any accumulator, it is disconnected completely passively because its failure generates an inactivation of the magnetic device. The disconnection causes the fall by gravity of the accumulator and the possibly completely passive implementation of a shunt of the accumulator.

According to an advantageous embodiment, the battery pack comprises at least one flexible electrically conductive blade fixed at one of its ends to another busbar or other portion of busbars, comprising a permanent magnet;
the battery pack being configured so that:
during step i/, the permanent magnet of the flexible blade is repelled by that of the output terminal such that the flexible blade cannot be in electrical contact with the first busbar,
during step ii/, because of the absence of magnetic repulsion of the faulty accumulator having fallen, the electrical connection between the first and the other busbar through respectively the flexible blade, which realizes hence the shunt of the accumulator "Flexible blade" is understood here and in the context of the invention to mean a blade adapted to be deformed by flexing by a few mm, to ensure the switch from a connection to an electrical disconnection.

"Rigid blade" is understood here and in the context of the invention to mean a blade which does not undergo deformation by flexing for the connection, but a rotation about its point of articulation.

According to an advantageous embodiment, the Curie temperature of the permanent magnet is chosen to be between a value close to 90% of the self-heating temperature (T1) and a value close to 110% of the thermal runaway temperature (T2) of the pack accumulators.

As regards the phenomenon of thermal runaway, reference will be made to the publication [1] and the protocol described in this publication. The so-called "self-heating" and "thermal runaway" temperatures are respectively denoted T1 and T2 in this publication.

The temperature T1, typically 70° C., in FIG. 2 of the publication, is the temperature from which the accumulator heats up without external source at a typical rate of 0.02° C./min under adiabatic conditions.

The temperature T2, typically 150° C., in FIG. 2 of the publication, is the temperature from which the accumulator heats up to a typical heating rate of 10° C./min under adiabatic conditions, which leads to the melting of the separator in the electrochemical bundle of the accumulator, a short circuit and therefore the collapse of the voltage.

By "thermal runaway", it is thus possible to understand here and in the context of the invention, a ratio between the value of the derivative of the temperature of heating and that of the time at least equal to 0.02° C. per min.

Reference can be made to publications [2] and [3] and more particularly to the curves of their respective FIG. 1 which show that the magnetic properties of ferrites are modified as a function of temperature. More particularly, a collapse of the magnetic properties is evident at the passage of the Curie temperature.

In addition, these publications [2] and [3] explain two distinct manufacturing methods for obtaining ferrites with Curie temperatures that can be adjusted to manufacture:
in the publication [2], the manufacturing process is modified with the same ferrite composition, which varies the Curie temperature between 130° C. and 250° C. It is also demonstrated that with a different ferrite composition, the Curie temperature can be around 100-110° C.;
in the publication [3], the authors vary the composition of the material. They were able to obtain ferrites with Curie temperatures between 35 and 65° C. With compositional adjustments, it is very likely to be able to achieve Curie temperatures below 100° C., while remaining high enough not to be reached by the environment of a metal-ion battery.

For example, Curie temperatures that would be obtained in the range 80-150° C., by adaptation of the manufacturing process and/or the composition of the ferromagnetic materials, would be optimal with respect to the temperature of thermal runaway pack accumulators, the lower part of the range, between 80 and 90° C., probably optimal for the minimization of the means controlled by heating or by current injection in the context of the invention.

The permanent magnet may be a sintered magnet or a plasto-magnet. A permanent magnet, usually referred to as "plasto-magnet", is a composite material consisting of a thermoplastic or thermosetting binder and a magnetic powder. The manufacture of these plasto-magnets is carried out by cold compression (thermosetting binder) or by pressure injection (thermoplastic binder). The magnetization can be carried out either during molding (anisotropic material) or after molding.

The sintered magnet or the plastomagnet is advantageously based on rare earths, preferably samarium-cobalt or neodymium-iron-boron, or in ferrite. The sintered magnet may also be aluminum-nickel-cobalt alloy.

According to another advantageous embodiment, at least one of the two output terminals comprises at least one second ferromagnetic part arranged around or inside the electrically conductive part, the second ferromagnetic part being closed by the closure plate in the configuration of closure of the magnetic circuit.

According to this embodiment, it can be provided at least a third ferromagnetic part arranged around the second ferromagnetic part forming an annular housing in which is housed a plasto-magnet, the coil being arranged inside the first ferromagnetic part.

Preferably, each ferromagnetic part is made of soft iron.

Preferably, each flexible blade is made of copper-beryllium.

Preferably, each electrically conductive part of each lock is made of the same material as an accumulator output terminal.

Preferably, each electrically conductive part of each lock is made of aluminum or of copper.

According to a first advantageous embodiment, the battery pack comprises an electrically conductive crinkle washer or tooth lockwasher, arranged such that, in the configuration of closure of the magnetic connection circuits, it ensures an electrical contact between one of the output terminal equipped with a lock and one of the busbars.

According to a second advantageous embodiment, the battery pack comprises comprising an electrically conductive crinkle washer or tooth lockwasher, arranged such that, in the configuration of closure of the magnetic shunt circuits, it ensures an electrical contact between the blade and one of the busbars.

Preferably, each washer is made of copper-phosphorus alloy.

According to a first configuration, the first or second output terminals are arranged on one face of the case or the flexible packaging, while, respectively, the second or the first output terminal is arranged on an opposite face of the case or the flexible packaging, the accumulator being arranged horizontally so that its fall by gravity along ii/ takes place perpendicularly to its longitudinal axis.

According to a second configuration, the first and second output terminals are both arranged on the same face of the housing or the flexible packaging, the accumulator being arranged vertically so that its fall by gravity along ii/ takes place along its longitudinal axis.

Preferably, each accumulator comprises a BMS fixed on the housing or the flexible packaging of the accumulator and electrically powered by the latter.

According to an advantageous embodiment, the battery pack comprises a honeycomb structure comprising a plurality of recesses each suitable for receiving an accumulator falling by gravity; each recess being capable of being filled with a heat transfer liquid at least once the fall of the accumulator carried out, in order to cool the latter.

The heat transfer liquid may be that of a cooling circuit of the battery pack, or a liquid independent of said cooling circuit, the supply of which in each housing is controlled by the BMS of the battery pack, or a liquid resulting from the change of state of a phase change material (PCM) obtained by the heating of the accumulator.

Each battery or accumulator can be of Li-ion type and comprise:
- a negative electrode(s) material chosen from the group comprising graphite, lithium, titanium oxide Li4TiO5O12;
- a positive electrode(s) material chosen from the group comprising LiFePO4, LiCoO2, LiNi0.33Mn0.33Co0.33O2.

The invention concerns also, in one of its aspects, and according to a first alternative, to a battery pack comprising:
- a plurality of electrochemical batteries or accumulators linked in electrical series and/or parallel to one another by means of a plurality of electrically conductive connecting bars, called busbars;
- one or more electronic control systems (BMS) each suitable for charging and monitoring the states of at least a part of the plurality of accumulators;
- at least one simple switching means, intended to produce electrical connections/disconnections, on demand, of one or more accumulators to/from the rest of the pack, the simple switching means comprising:
  - at least one flexible electrically conductive blade, fixed at one of its ends to a fixing point,
  - at least one first ferromagnetic part forming a magnetic closure plate, inserted respectively into the flexible blade or into one of the busbars,
  - at least one element forming a magnetic lock, comprising an electrically conductive part around or within which is housed a permanent magnet and an electrically conductive wire which is wound forming a coil intended to generate a magnetic field parallel to the magnetic field of the permanent magnet; the electrically conductive part being in electrical contact respectively in one of the busbars or in the blade;

the simple switching means being configured such that, in succession:

i/ when the coil of a magnetic lock is electrically powered by the control of one of the BMSs in a given direction, it produces a magnetic field which, together with that of the permanent magnet, generates an attraction or repulsion force greater than the mechanical force of the elastic blade, which provokes the convergence or the separation of the closure plate with respect to its permanent magnet, thus producing an electrical connection or disconnection of one or more accumulators;

ii/ when the coil of the magnetic lock is no longer electrically powered, the magnetic force of the permanent magnet is greater than the mechanical force of the flexible blade, which maintains the electrical contact or the separation between the blade and one of the busbars and thus the electrical connection or disconnection of the accumulator or accumulators;

iii/ when the coil is electrically powered by control of the BMS in a direction opposite to that given, it produces a magnetic field opposite to that of the step i/, to the point of obtaining an attraction or repulsion force lower than the mechanical force of the elastic blade, which provokes the separation or the convergence of the closure plate of the magnetic lock with respect to its permanent magnet and therefore the opening or the closing of the magnetic circuit and the breaking or the making of the electrical contact between the blade and one of the busbars, thus producing an electrical disconnection or reconnection of the accumulator or accumulators from or to the rest of the pack.

The invention relates also, according to a second alternative, to a battery pack comprising:
- a plurality of electrochemical batteries or accumulators (A1-An) linked in electrical series and/or parallel to one another by means of a plurality of electrically conductive connecting bars, called busbars;
- one or more electronic control systems (BMS) each suitable for charging and monitoring the states of at least a part of the plurality of accumulators;
- at least one electrical switching means, called reversing switch, intended to produce electrical connections/disconnections, on demand, of one or more accumulators to/from the rest of the pack while ensuring electrical continuities within all of the pack or the rest of the pack, the reversing switch comprising:
  - at least one rigid electrically conductive blade, comprising two parts inclined relative to one another, the blade being mounted to pivot at its joint between the two parts;
  - at least two first ferromagnetic parts each forming a magnetic closure plate, inserted respectively into a part of the rigid blade or into one of the busbars;
  - at least two elements each forming a magnetic lock, each comprising an electrically conductive part around or within which is housed a permanent magnet and an electrically conductive wire which is wound forming a coil intended to generate a magnetic field parallel to the magnetic field of the permanent magnet; each electrically conductive part being inserted by being in electrical contact respectively with the busbar or in a part of the rigid blade;
  - a metal braid linking the rigid blade to one of the busbars;
- the reversing switch being configured such that:
  j/ when neither of the two coils is initially electrically powered, the magnetic circuit of one of the two locks is in closed initial configuration through its permanent magnet which exerts an attraction torque, defined as being the product between the attraction force and the length of one of the parts of the blade, greater than that of the other permanent magnet which therefore leaves the magnetic circuit of the other of the two locks in open initial configuration with its closure plate away from its permanent magnet;
  jj/ when the coil of the initially closed lock is electrically powered by the control of one of the BMSs in a given direction, it produces a magnetic field which opposes that of its permanent magnet, which provokes the reduction of the closure torque thereby until it is lower than the attraction torque exerted by the permanent magnet of the initially open lock, which provokes the switchover by pivoting of the blade and thus the closure of the magnetic circuit of the initially open lock and simultaneously the opening of the magnetic circuit of the initially closed lock, thus producing an electrical disconnection of one or more accumulators while ensuring an electrical continuity within the rest of the pack;
  the steps j/ and jj/ being able to be performed reciprocally from the closed lock to revert to the initial configuration by thus producing an electrical reconnection of the accumulator or accumulators to the rest of the pack with an electrical continuity within all of the pack.

Thus, the invention consists also in defining magnetic locks with permanent magnet and inductive coil that can be controlled instantaneously on demand within a battery pack by injection of a low electrical current from one or more BMSs.

Whatever the positioning of the magnetic locks within the battery pack, one or more controlling BMSs can be positioned either on each accumulator or busbar, or on a branch to control all of the accumulators in electrical series or parallel, in the branch, either singly or at overall pack level.

The on-demand switching of the accumulators or of the accumulator branches by the magnetic locks makes it possible to ensure different desirable functions, such as a distribution of the voltage or of current according to the demand profile, the shunt of a unitary accumulator or of a group of accumulators, the safe removal of failing elements, and so on, and do so without provoking any short circuit and while ensuring the electrical continuity over all or part of the pack.

Furthermore, the invention makes it possible to measure different parameters within the accumulator and/or a branch of accumulators and/or a module and/or the resulting battery pack.

According to an alternative embodiment, the permanent magnet is provided with an electrically insulating mandrel around which the coil is wound.

According to an advantageous embodiment, the simple switching means or the reversing switch comprises at least one second ferromagnetic part arranged between the electrically conductive part and the permanent magnet, the second ferromagnetic part being closed by the closure plate in the configuration of closure of the magnetic circuit. According to this embodiment, at least one third ferromagnetic part arranged around the second ferromagnetic part can be formed by forming an annular housing in which a plastomagnet is housed, the coil being arranged inside the first ferromagnetic part.

Preferably, each ferromagnetic part is made of soft iron.

Preferably, the flexible blade is made of copper-beryllium.

Advantageously, the electrically conductive part of the lock is made of the same material as an accumulator output terminal.

Preferably, the electrically conductive part of the lock is made of aluminum or of copper.

According to another advantageous embodiment, the simple switching means or reversing switch comprises an electrically conductive crinkle washer or tooth lockwasher, arranged such that, in the configuration of closure of the magnetic circuit, it ensures an electrical contact between the electrically conductive part and a part of the blade or one of the busbars.

Preferably, the washer being made of copper-phosphorus alloy.

Advantageously, the coil of the lock can be electrically powered by any one of the accumulators of the battery pack.

According to an advantageous variant embodiment, the switching means comprises at least one blade, at least one closure plate and at least one magnetic lock; the closure plate or the magnetic lock being inserted into one of the blades or into one of the busbars while, such that in the closed magnetic circuit configuration, the electrical continuity is produced by one of the busbars linked electrically with another busbar.

Advantageously, the first and second busbars are supported by one and the same electrically insulating substrate onto which are fixed the ends of the two flexible blades, preferably through a rivet.

According to a first advantageous embodiment, the battery pack comprises:
  at least two branches each comprising at least one accumulator,
  at least one first and one second simple switching means, arranged such that:
  when the first simple switching means is in a closed electrical circuit configuration, the two branches are in electrical series, and simultaneously the second simple switching means is in an open electrical circuit configuration,
  when the first simple switching means is in an open electrical circuit configuration, the two branches are electrically disconnected, and simultaneously the second simple switching means is in a closed electrical circuit configuration, producing an electrical continuity in the rest of the pack.

According to a second advantageous embodiment, the battery pack comprises:
  at least two branches each comprising at least one accumulator,
  at least one reversing switch arranged such that:
  when the reversing switch is in a configuration with one of its two circuits closed, the two branches are in electrical series, and simultaneously the other of its two circuits is open,
  when the reversing switch is in a reverse configuration, the two branches are electrically disconnected, producing an electrical continuity in the rest of the pack.

Preferably, the battery pack comprises at least two branches each comprising at least two accumulators in electrical parallel and at least one electrical switching means.

The invention relates also to a method for active control of a battery pack (P) as described previously, according to which, on demand, the BMS of said branch controls the electrical powering of at least one of the coils of a simple switching means or of the reversing switch to connect or disconnect said branch while ensuring an electrical continuity in the rest of the pack.

The invention relates also, in one of its aspects, and according to a first alternative, to a connection/disconnection device between an accumulator and an electrical connecting bar, called busbar, comprising:
  an output terminal of the metal-ion accumulator comprising:
  an electrically conductive part,
  a magnetic lock comprising a permanent magnet,
  a first ferromagnetic part secured to the busbar, forming a closure plate of a magnetic circuit with the magnetic lock, the closed magnetic circuit ensuring a mechanical and electrical connection between the output terminal and the busbar.

According to a second alternative, the invention relates to a connection/disconnection device between an accumulator and an electrical connecting bar, called busbar, comprising:
  a busbar comprising:
  an electrically conductive part,
  a magnetic lock comprising a permanent magnet,
  an output terminal of the accumulator comprising a first ferromagnetic part, forming a closure plate of a magnetic circuit with the magnetic lock, the closed magnetic circuit ensuring a mechanical and electrical connection between the output terminal and the busbar.

The invention relates also, in one of its aspects, and according to a first alternative, to a connection/disconnection device between an accumulator and an electrical connecting bar, called busbar, comprising:
  an interface adapter comprising:
  a body comprising at least one recess passing through an output terminal of the accumulator and incorporating within it at least one magnetic lock comprising a permanent magnet,
  at least one electrically conductive part suitable for being fixed with electrical contact to an output terminal of the accumulator,
  at least one first ferromagnetic part, secured to the busbar, forming a closure plate of a magnetic circuit with the magnetic lock, the closed magnetic circuit ensuring a mechanical and electrical connection between the output terminal and the busbar.

According to a second alternative, the invention relates to a connection/disconnection device between an accumulator and an electrical connecting bar, called busbar, comprising:
  an interface adapter comprising:
  a body comprising at least one through-recess for housing an output terminal of the accumulator and incorporating within it at least one first ferromagnetic part, secured to the busbar, forming a closure plate of a magnetic circuit,
  at least one electrically conductive part suitable for being fixed with electrical contact to an output terminal of the accumulator,
  at least one magnetic lock comprising a permanent magnet, secured to the busbar, the magnetic circuit between the lock and the closed closure plate ensuring a mechanical and electrical connection between the electrically conductive part and the busbar.

The invention relates also, in one of its aspects, and according to a first alternative, to a device for connection/disconnection between an accumulator and electrical connecting bars, called busbars, and for shunt of the accumulator, comprising:
  a battery or accumulator comprising:
  a housing or a flexible packaging,
  at least one output terminal comprising:
  an electrically conductive part,
  a magnetic lock comprising a permanent magnet and an electrically conductive wire which is wound forming a coil;
  an electrical control system (BMS) suitable for charging and monitoring the states of the accumulator;
  at least one ferromagnetic part secured to a first electrical connecting bar, called busbar, forming a closure plate of a magnetic circuit with the magnetic lock of the output terminal;
  at least one flexible electrically conductive blade, fixed to a fixing point on one of the busbars, comprising a permanent magnet;
  the device being configured such that:
  i/ when the coils are not electrically powered, the magnetic attraction force of the permanent magnets of the output terminal on the closure plate, in the closed magnetic circuit configuration, ensures the mechanical and electrical connection of the output terminal to the first busbar; and the permanent magnet of the flexible blade is repulsed by that of the output terminal such that the flexible blade cannot be in electrical contact with the first busbar, ii/ when, on control of the BMS, the coil of the output terminal is powered electrically in a direction such that it generates a magnetic force opposite to the magnetic attraction force of the permanent magnet of the output terminal to the point of ensuring the mechanical disconnection between this output terminal and the first busbar, which causes the accumulator to drop through gravity and simultaneously, by virtue of the absence of magnetic repulsion, the closure of the magnetic circuit between the permanent magnet of the flexible blade and the closure plate of the first busbar and the electrical connection between the first and another busbar respectively through this flexible blade, and thereby the shunt of the accumulator.

According to a second alternative, the invention relates to a device for connection/disconnection between an accumulator and electrical connecting bars, called busbars, and for shunt of the accumulator in case of failure thereof comprising:
- a battery or accumulator comprising:
  - a housing or a flexible packaging,
  - at least one output terminal comprising:
    - an electrically conductive part,
    - a magnetic lock comprising a permanent magnet provided with an electrical heating resistor;
  - an electronic control system (BMS) suitable for charging and monitoring the states of the accumulator;
  - at least one ferromagnetic part secured to a first electrical connecting bar, called busbar, forming a closure plate of a magnetic circuit with the magnetic lock of the output terminal;
  - at least one flexible electrically conductive blade, fixed to a fixing point on one of the busbars, comprising a permanent magnet;
  - the device being configured such that:
  - i/ when the heating resistor is not electrically powered, the magnetic attraction force of the permanent magnet of the output terminal on the closure plate, in the closed magnetic circuit configuration, ensures the mechanical and electrical connection of the output terminal to the first busbar; and the permanent magnet of the flexible blade is repulsed by that of the output terminal such that the flexible blade cannot be in electrical contact with the first busbar,
  - ii/ when, on control of the BMS, the heating resistor of the output terminal is electrically powered, the permanent magnet of the output terminal heats up to at least a temperature from which it loses its magnetic properties, to the point of mechanical disconnection between the output terminal and the first busbar, which causes the accumulator to drop through gravity and simultaneously, by virtue of the absence of magnetic repulsion, the closure of the magnetic circuit between the permanent magnet of the flexible blade and the closure plate of the first busbar and the electrical connection between the first and another busbar through the flexible blade, and, thereby, the shunt of the accumulator.

The invention relates also, in one of its aspects, to a method for assembling a battery pack and with busbars, comprising the following steps:
a/ provision of a plurality of accumulators each comprising:
- a housing or a flexible packaging,
- a first output terminal and a second output terminal of an opposite polarity to the first output terminal, at least one of the two output terminals comprising:
  - an electrically conductive part,
  - a magnetic lock comprising a permanent magnet and an electrically conductive wire which is wound forming a coil intended to generate a magnetic field parallel to the magnetic field of the permanent magnet;

b/ provision of an electrically insulating substrate comprising a first and a second electrically conductive connecting bar, called busbars, on at least one of which are fixed a ferromagnetic part, forming a closure plate of a magnetic circuit with the magnetic lock of the output terminal;

c/ provision of a honeycomb structure comprising a plurality of recesses each suitable for receiving an accumulator;

d/ fixing of the honeycomb structure onto the insulating substrate;

e/ insertion of each accumulator into one of the recesses of the honeycomb structure such that each accumulator is in magnetic levitation facing the insulating substrate by virtue of the magnetic repulsion of its permanent magnet by at least one other permanent magnet;

f/ variation of the magnetic field of the other permanent magnet by displacing it or by activating a coil facing the permanent magnet of the accumulator in order for it to exert its attraction force on each closure plate and thus allow the fixing with magnetic locking of the output terminal of each accumulator with the busbar.

The invention relates also, in one of its aspects, and according to a first alternative, to an electrical arc blowing device between an accumulator output terminal and an electrical connecting bar, called busbar, comprising:
- an output terminal of the accumulator comprising:
  - an electrically conductive part,
  - a magnetic lock comprising a permanent magnet,
  - an electrically conductive crinkle washer or tooth lockwasher, ensuring an electrical contact between the output terminal and the busbar,
  - a part with low melting point, preferably lower than 250° C., arranged inside the washer;
- a first ferromagnetic part secured to the busbar, forming a closure plate of a magnetic circuit with the magnetic lock, the closed magnetic circuit ensuring a mechanical connection between the output terminal and the busbar while allowing electrical contact between them;

the device being configured such that when electrical arcs occur between the output terminal and the busbar, the heat given off by the arcs vaporizes the part with low melting point, which generates a gas under pressure which elongates the arcs outward from the part with low melting point and thus cools them in the ambient medium until they are extinguished by blowing.

According to a second alternative, the invention relates to an electrical arc blowing device between an accumulator output terminal and an electrical connecting bar, called busbar, comprising:
- a busbar comprising:
  - an electrically conductive part,
  - a magnetic lock comprising a permanent magnet,
  - an electrically conductive crinkle washer or tooth lockwasher, ensuring an electrical contact between the output terminal and the busbar,
  - a part with low melting point, preferably lower than 250° C., arranged inside the washer;
- an output terminal of the accumulator comprising a first ferromagnetic part, forming a closure plate of a magnetic circuit with the magnetic lock, the closed magnetic circuit ensuring a mechanical connection between the output terminal and the busbar while allowing electrical contact between them;

the device being configured such that when electrical arcs occur between the output terminal and the busbar, the heat given off by the arcs vaporizes the part with low melting point, which generates a gas under pressure which elongates the arcs outward from the part with low melting point and thus cools them in the ambient medium until they are extinguished by blowing.

The invention relates also, in one of its aspects, and according to a first alternative, to an electrical arc extinction device between an accumulator output terminal and an electrical connecting bar, called busbar, comprising:
- an output terminal of the accumulator comprising:
  - an electrically conductive part,
  - a magnetic lock comprising a permanent magnet,
  - a first ferromagnetic part secured to the busbar, forming a closure plate of a magnetic circuit with the magnetic lock, the closed magnetic circuit ensuring a mechanical and electrical connection between the output terminal and the busbar,
- an electrically conductive crinkle washer or tooth lockwasher, having protuberances, the washer ensuring an electrical contact between the output terminal and the busbar;

the device being configured such that when electrical arcs occur between the output terminal and the busbar, the protuberances of the washer bring the arcs close to the closure plate which absorbs the heat given off and thus cool them until they are extinguished.

According to a second alternative, the invention relates to an electrical arc extinction device between an accumulator output terminal and an electrical connecting bar, called busbar, comprising:
- a busbar comprising:
  - an electrically conductive part,
  - a magnetic lock comprising a permanent magnet,
- an output terminal of the accumulator comprising a first ferromagnetic part secured to the busbar, forming a closure plate of a magnetic circuit with the magnetic lock, the closed magnetic circuit ensuring a mechanical and electrical connection between the output terminal and the busbar,
- an electrically conductive crinkle washer or tooth lockwasher, having protuberances, the washer ensuring an electrical contact between the output terminal and the busbar;

the device being configured such that when electrical arcs occur between the output terminal and the busbar, the protuberances of the washer bring the arcs close to the closure plate which absorbs the heat given off and thus cool them until they are extinguished.

The invention relates finally, in one of its aspects, and according to a first alternative, to a connection/disconnection device between an output terminal of an accumulator and an electrical connecting bar, called busbar, comprising:
- an interface adapter comprising an enclosure comprising an opening, suitable for being fixed to an output terminal of the accumulator, and a magnetic lock comprising a permanent magnet,
- at least one first ferromagnetic part, secured to the busbar, forming a closure plate of a magnetic circuit with the magnetic lock, the closed magnetic circuit ensuring a mechanical and electrical connection between the output terminal and the busbar.

According to a second alternative, the invention relates to a connection/disconnection device between an output terminal of an accumulator and an electrical connecting bar, called busbar, comprising:
- an interface adapter comprising an enclosure comprising an opening, suitable for being fixed to an output terminal of the accumulator, and at least one first ferromagnetic part,
- at least one magnetic lock comprising a permanent magnet, secured to the busbar, the closed magnetic circuit ensuring a mechanical and electrical connection between the output terminal and the busbar.

DETAILED DESCRIPTION

Other advantages and features of the invention will be better revealed on reading the detailed description of exemplary implementations of the invention given in an illustrative and nonlimiting manner with reference to the following figures in which:

FIG. 1 is an exploded perspective schematic view showing the various elements of a lithium-ion accumulator, FIG. 2 is a front view showing a lithium-ion accumulator with its flexible packaging according to the state of the art, FIG. 3 is a perspective view of a lithium-ion accumulator according to the state of the art with its rigid packaging composed of a housing of cylindrical form;

FIG. 4 is a perspective view of a lithium-ion accumulator according to the state of the art with its rigid packaging composed of a housing of prismatic form;

FIG. 5 is a perspective view of an assembly by means of busbars of lithium-ion accumulators according to the state of the art, forming a battery pack;

FIGS. 6A and 6B are longitudinal cross-sectional views respectively illustrating the magnetic disconnection and connection of a device according to the invention, intended to ensure the mechanical and electrical connection/disconnection between an output terminal of a low-current accumulator, typically lower than 1 A, and a busbar;

FIGS. 7A and 7B are longitudinal cross-sectional views respectively illustrating the magnetic disconnection and connection of a device according to the invention, intended to ensure the mechanical and electrical connection/disconnection between an output terminal of a high-current accumulator, typically higher than 1 A, and a busbar;

FIGS. 8 and 8A are respectively front and side views of an electrically conductive crinkle washer ensuring the electrical contact between busbar and electrically conductive part either of the output terminal or linked thereto, in a device according to FIGS. 7A and 7B;

FIG. 9 is a longitudinal cross-sectional schematic view of a variant of the device according to FIGS. 7A and 7B;

FIG. 10 is a longitudinal cross-sectional schematic view of an advantageous embodiment of the device according to FIGS. 7A and 7B, according to which control of the connection/disconnection between magnetic parts by coil is possible;

FIG. 11 is a longitudinal cross-sectional schematic view of a variant of the advantageous embodiment of the device according to FIG. 10;

FIG. 25 is a perspective and exploded schematic view of another interface adapter incorporating a magnetic lock according to the invention;

FIG. 26 is a perspective and partially exploded schematic view of an existing metal-ion accumulator of prismatic format with an interface adapter according to FIG. 25 to be fixed, fitted or screwed around an output terminal of the accumulator;

FIG. 27 is a partial longitudinal cross-sectional schematic view of a output terminal of an accumulator around which is fitted an interface adapter facing a ferromagnetic part which are inserted into a busbar forming a closure plate of the circuit with the magnetic lock incorporated in the adapter;

Figure 28A:
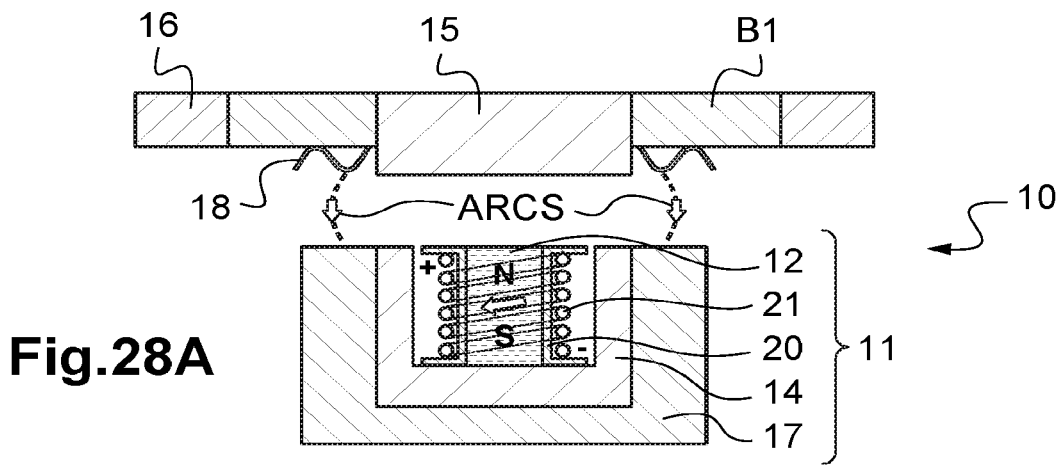
Figure 28B:
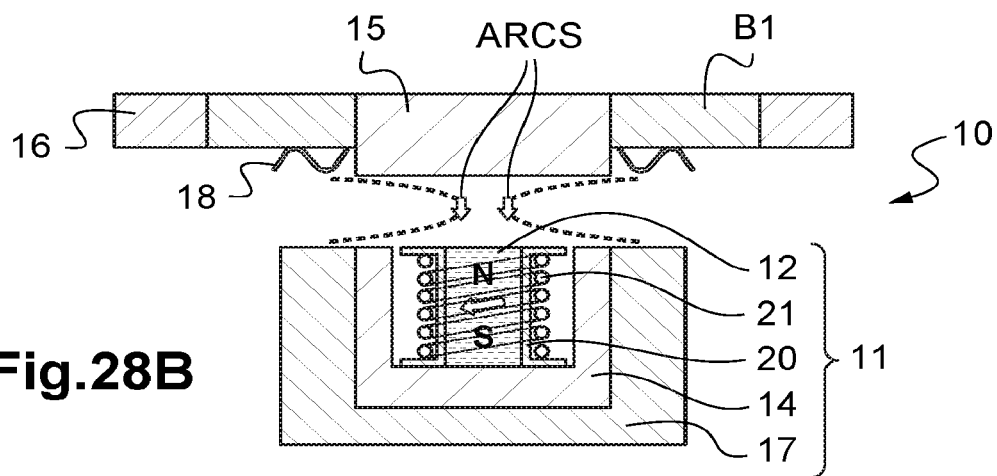
Figure 29A:
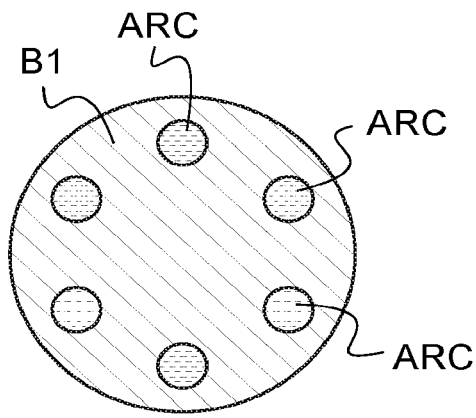
Figure 29B:
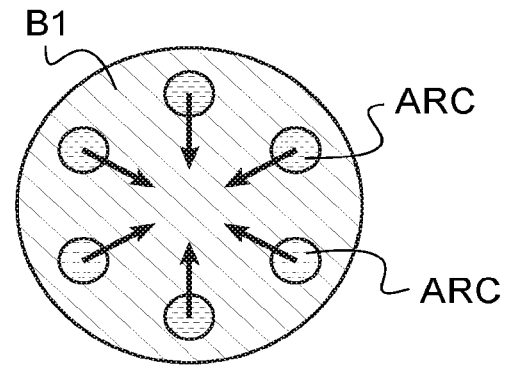
Figure 34:
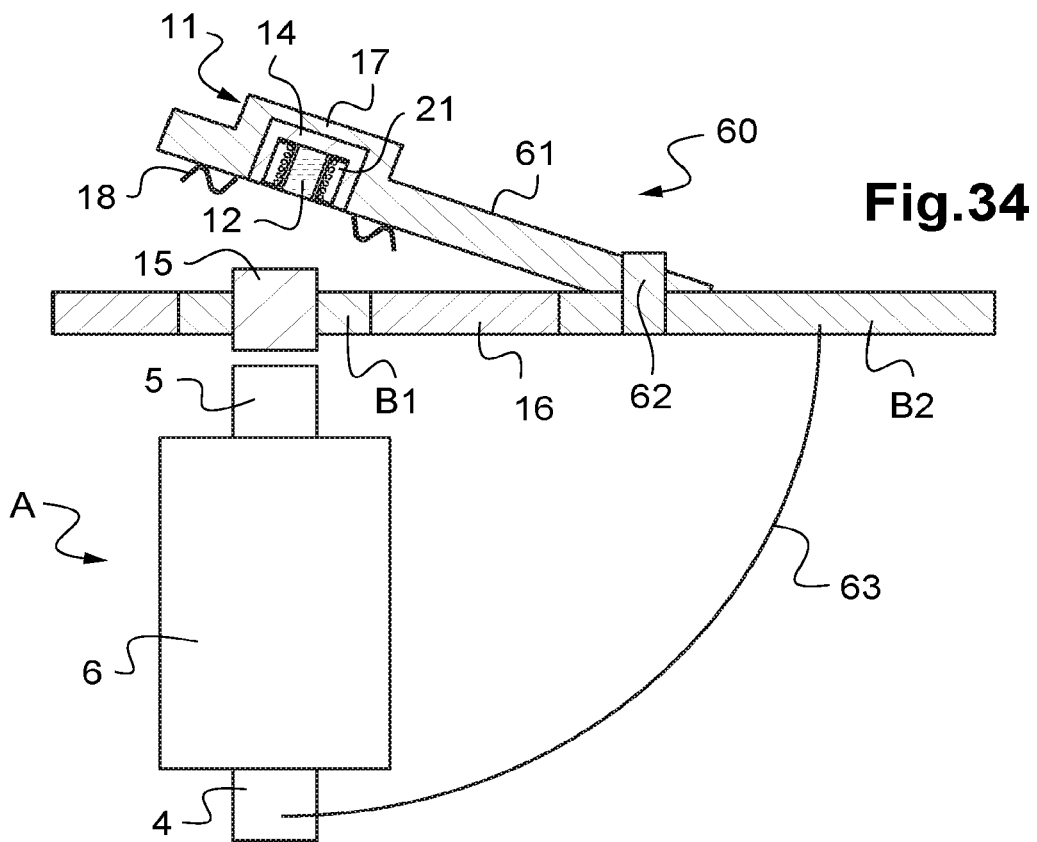
Figure 35:
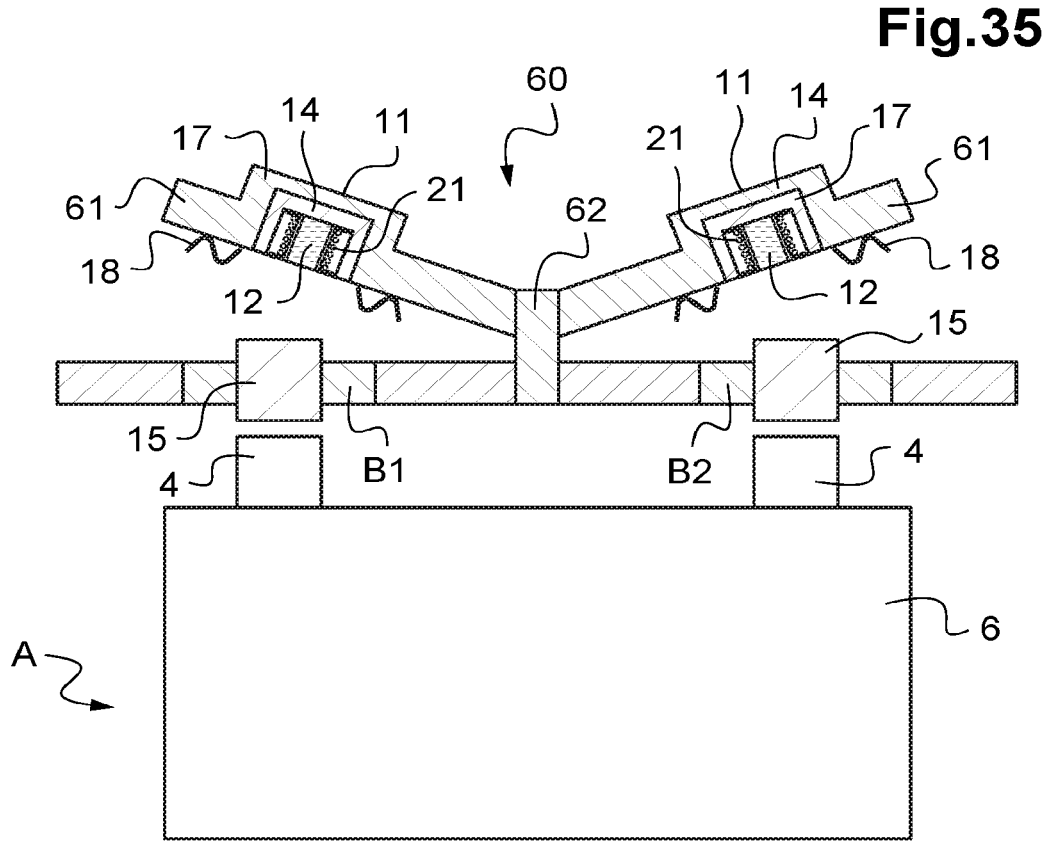
Figure 39D:
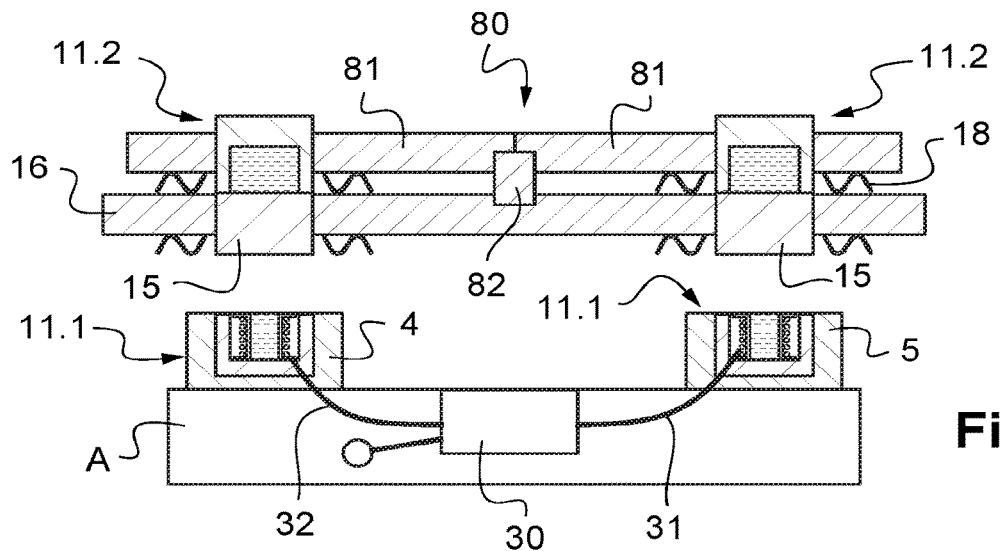
Figure 39E:
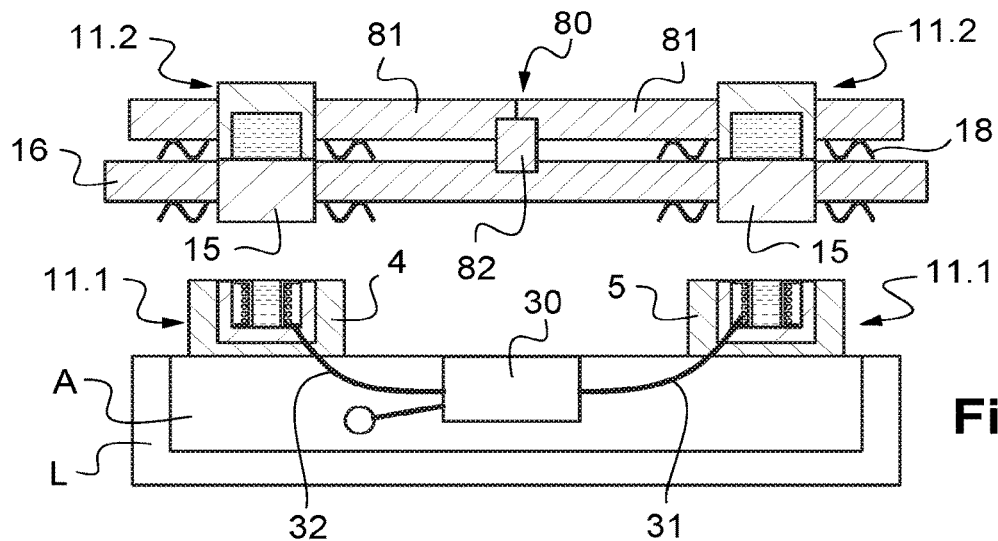
Figure 40:
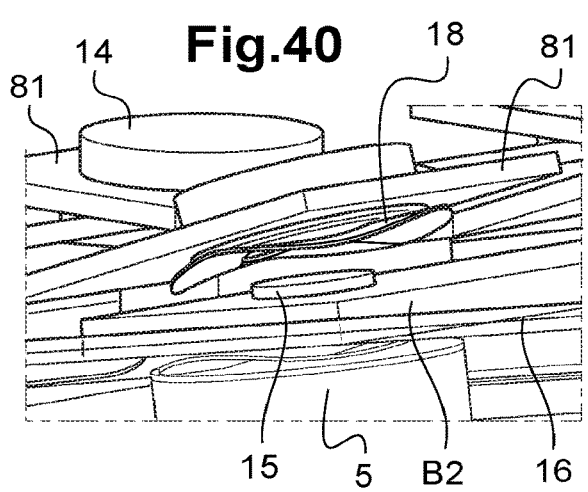
Figure 41:
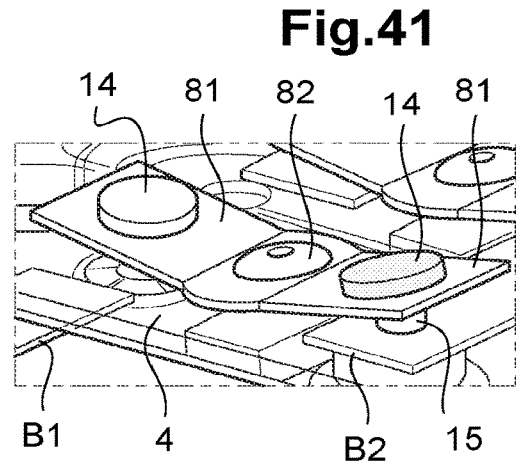
Figure 42A:
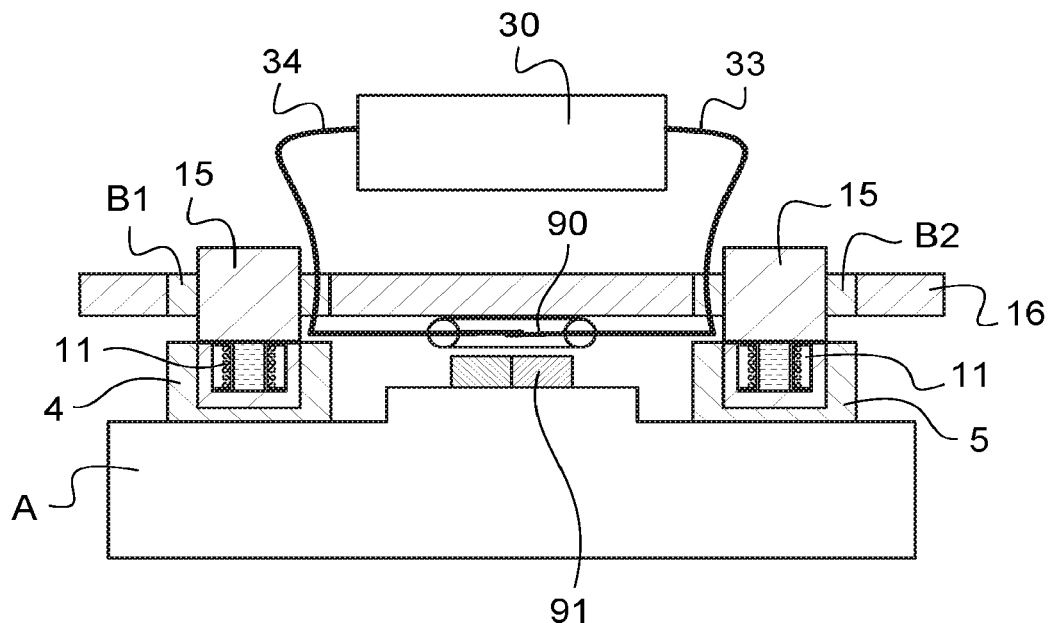
Figure 42B:
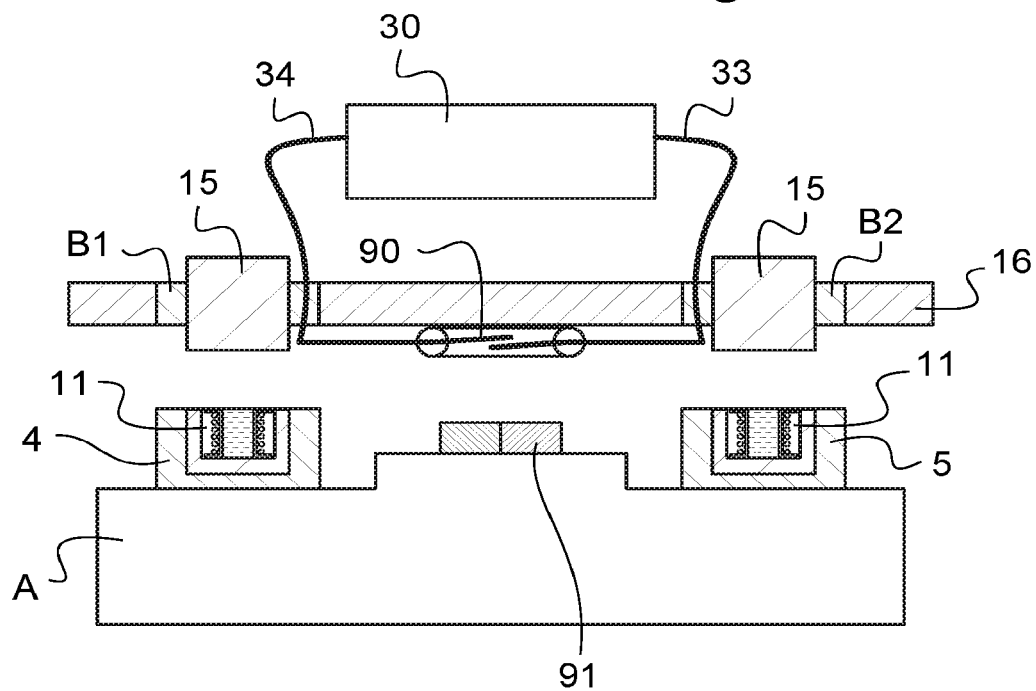
Figure 43:
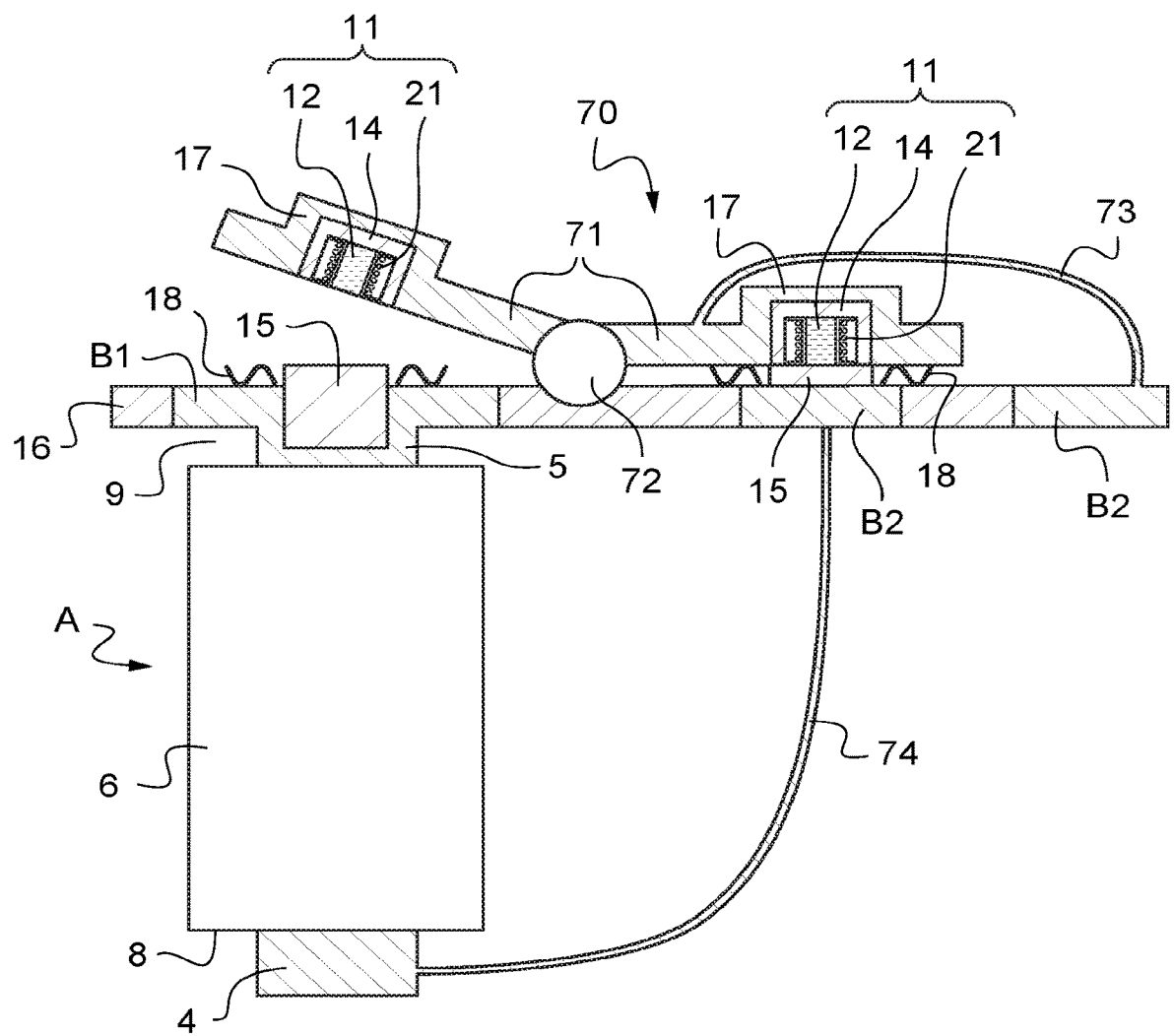
Figure 44:
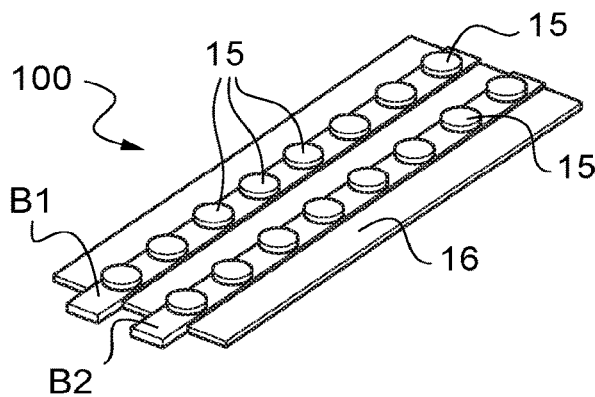
Figure 45:
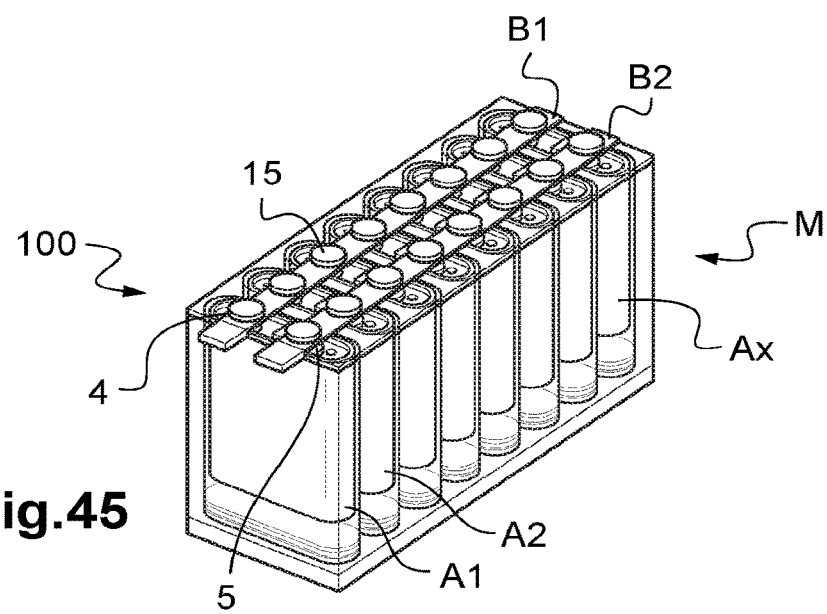
Figure 46:
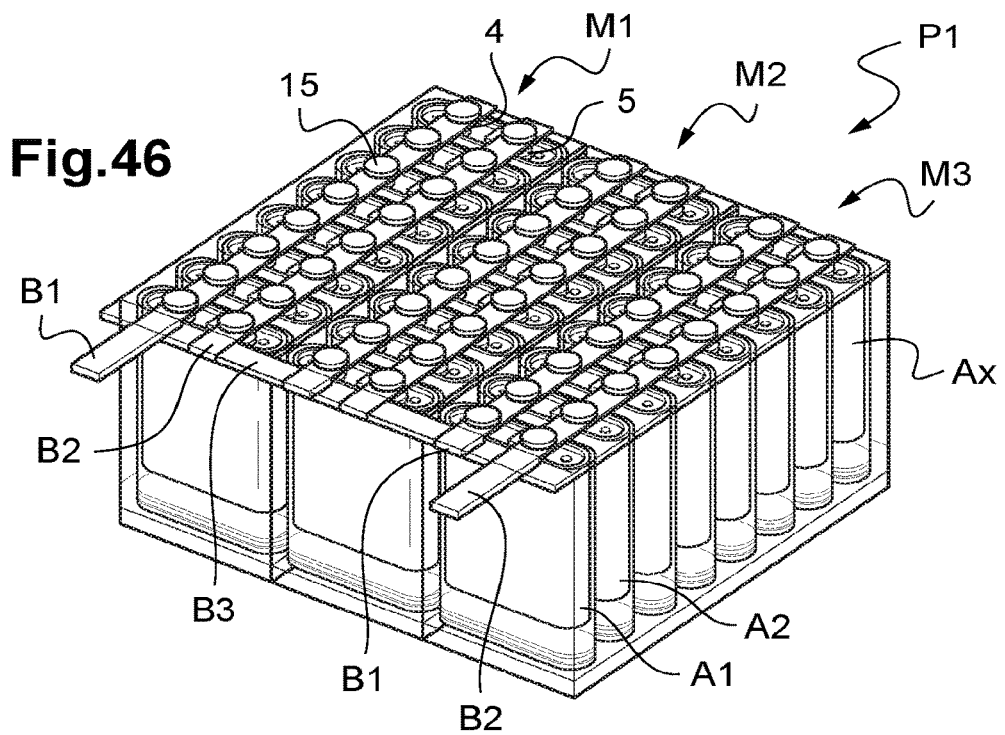
Figure 47:
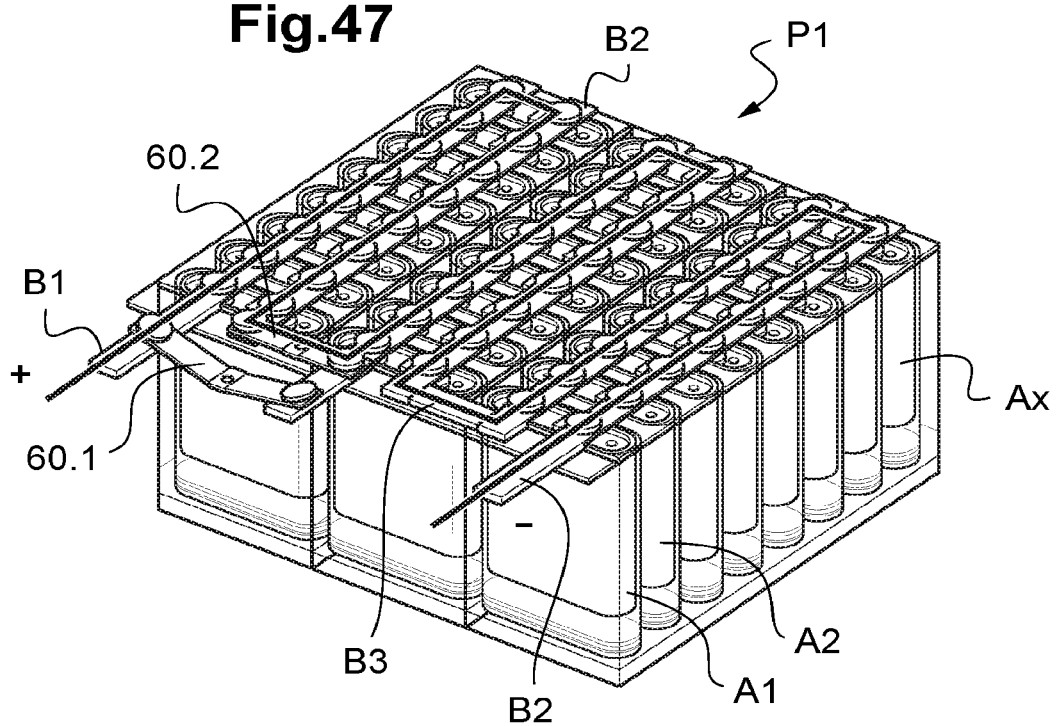
Figure 48:
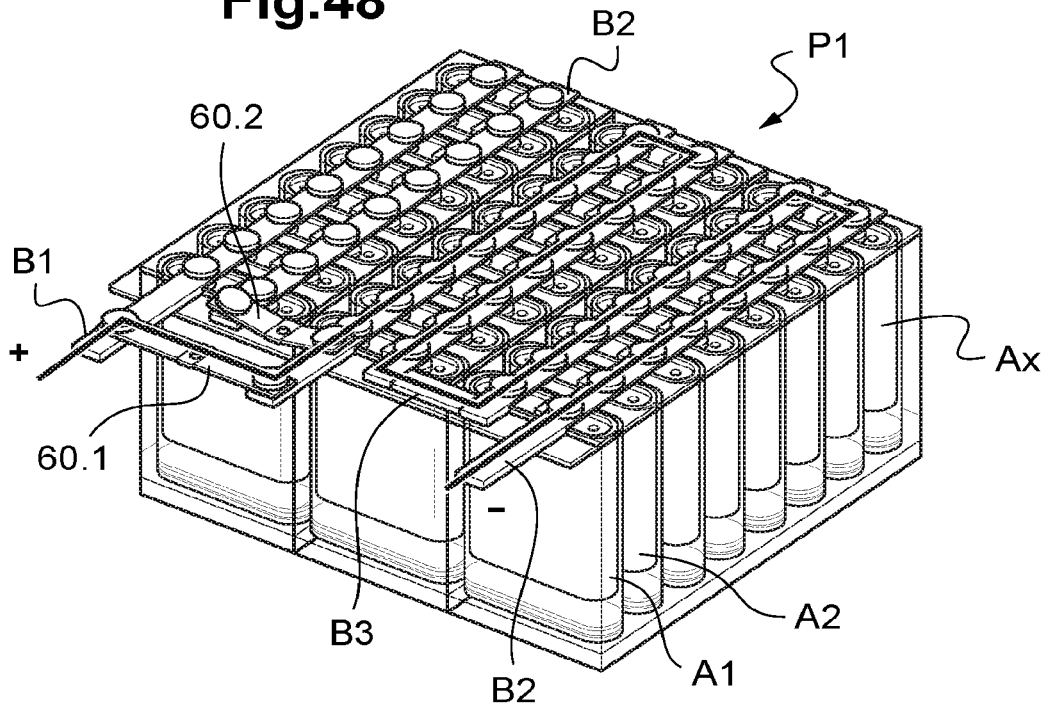
Figure 51:
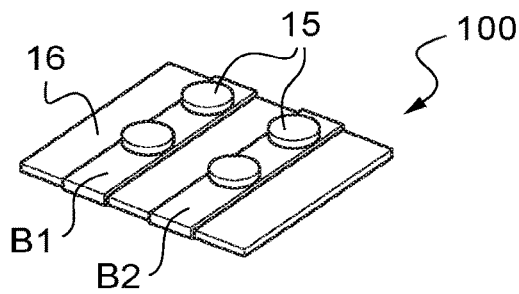
Figure 52:
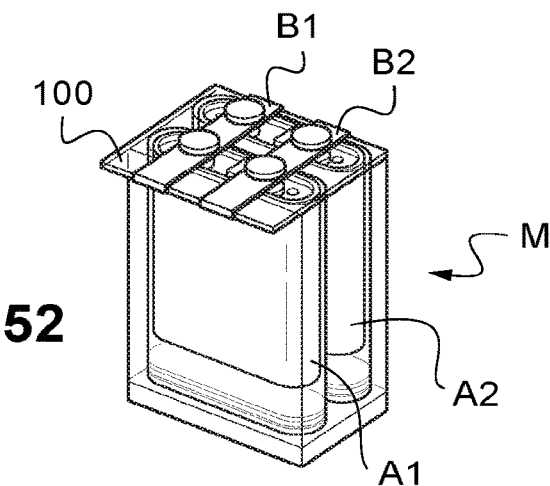
Figure 53:
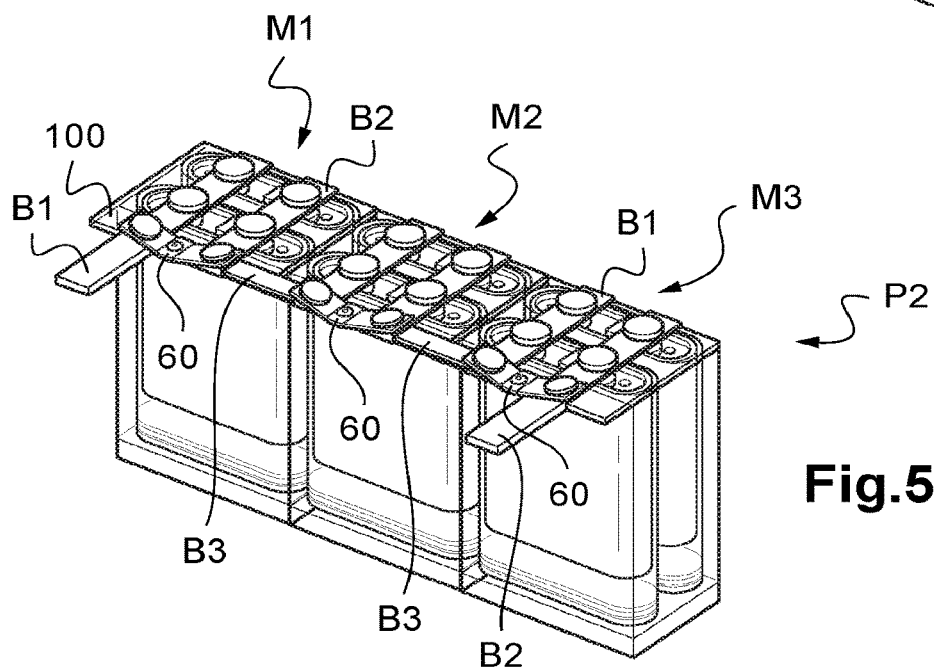
Figure 54:
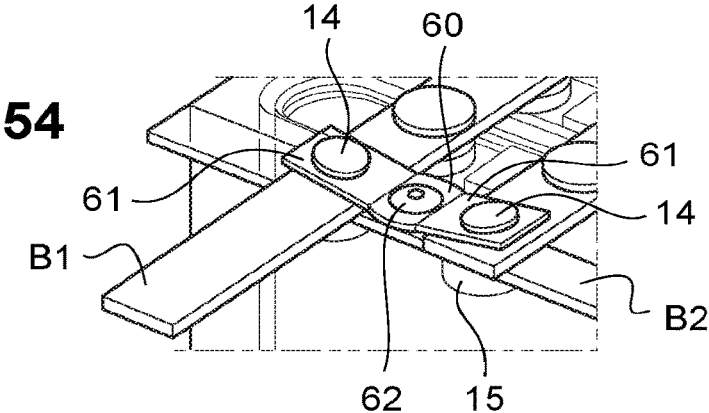
Figure 55:
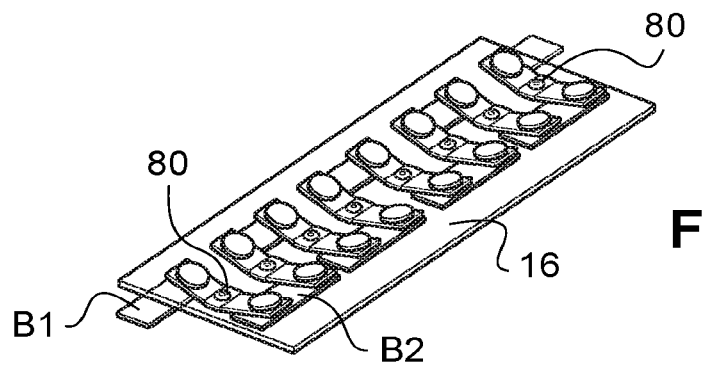
Figure 56:
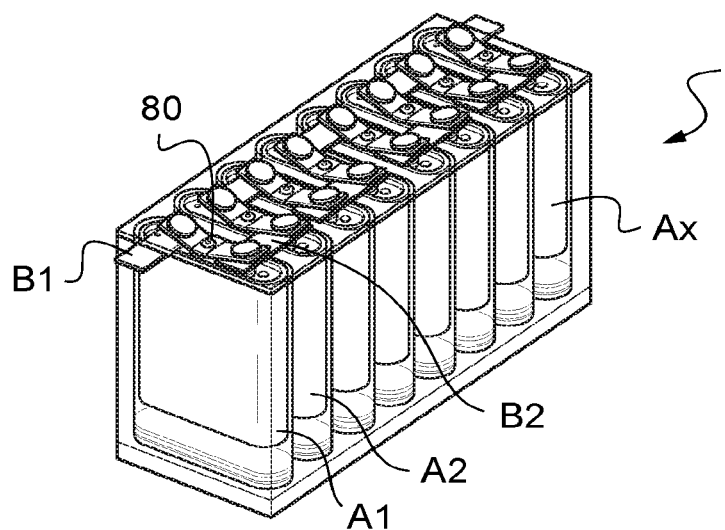
Figure 57:
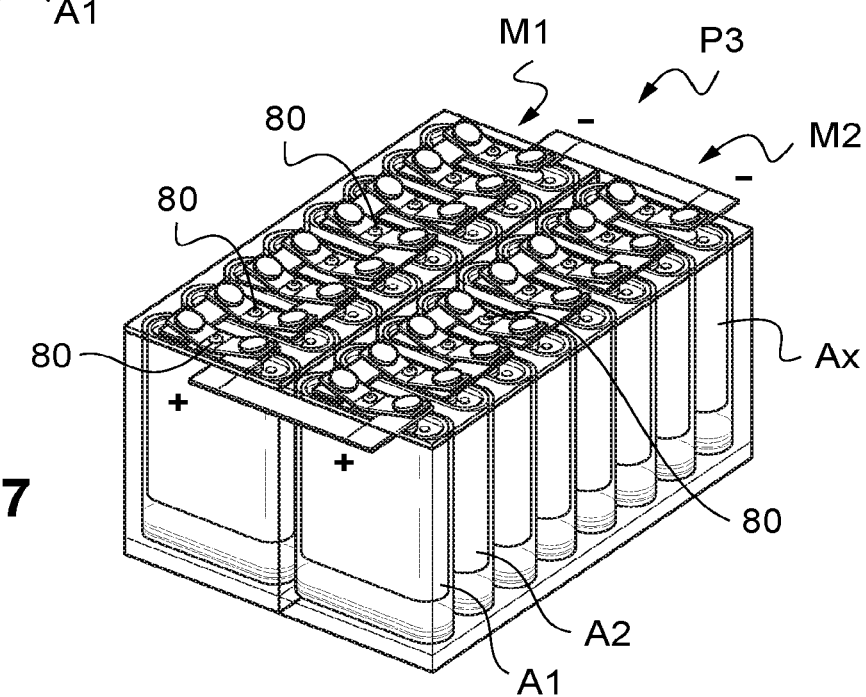
Figure 58:
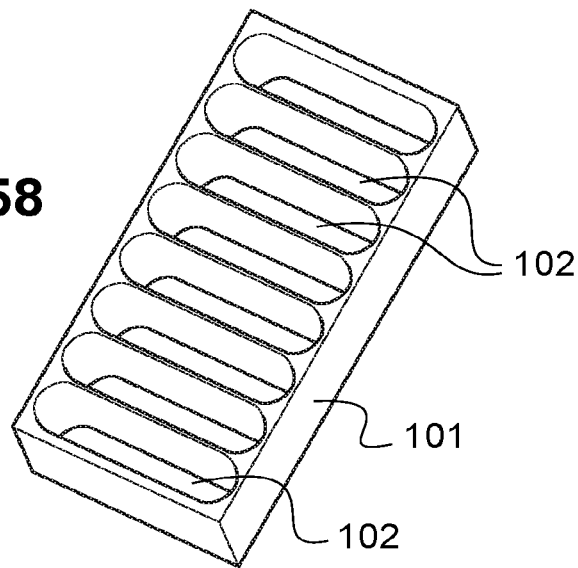
Figure 59:
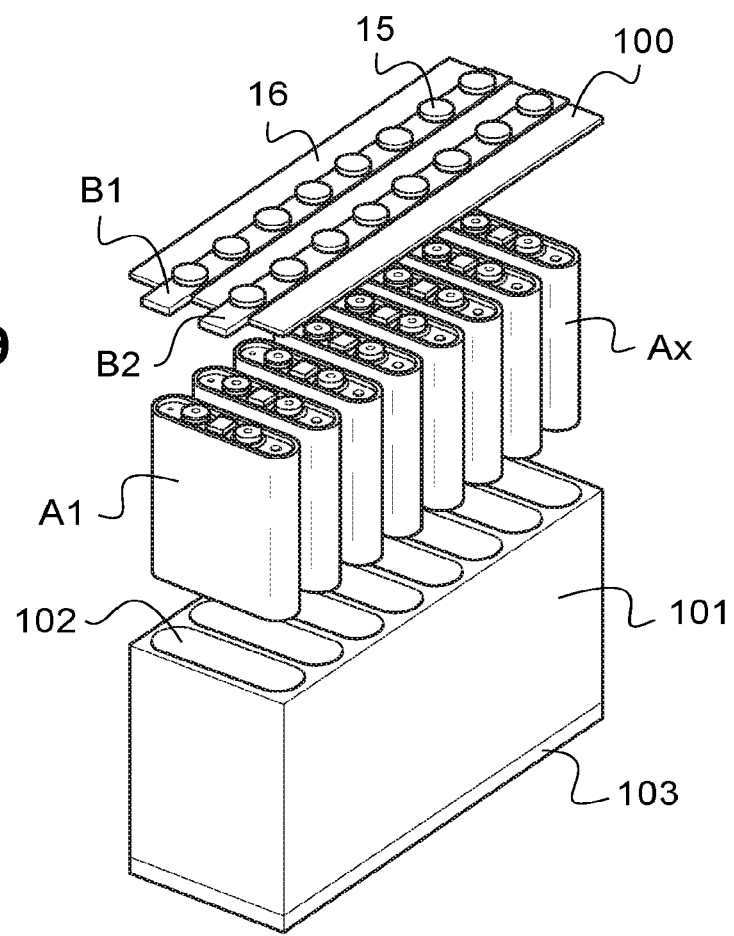

FIGS. 28A and 28B go back to the device of FIG. 10 and illustrate the steps of a first mode of blowing out electrical arcs likely to occur upon magnetic disconnection;

FIGS. 29A and 29B respectively go back in bottom view to FIGS. 28A and 28B and illustrate the locations of the points of creation of the electrical arcs and their convergence upon extinction;

FIGS. 30 and 31 are respectively exploded and assembled perspective schematic views of an advantageous variant of closure plate and electrical contacts producing the extinction of the arcs according to the first mode;

FIG. 32 illustrates, by side and plan schematic views, the formation of the electrical arcs with a closure plate and contacts according to FIGS. 30 and 31;

FIGS. 33A and 33B go back to the device of FIG. 10 and illustrate the steps of a second mode of extinction of the electrical arcs likely to occur upon magnetic disconnection;

FIG. 34 is a longitudinal cross-sectional schematic view of a device with flexible blade magnetic shunt according to the invention, intended to ensure the shunt between two busbars; the blade being fixed with electrical connection to one of the busbars;

FIG. 35 is a longitudinal cross-sectional schematic view of an advantageous embodiment of the device according to FIG. 35, according to which the shunt is duplicated, but with a fixing of each flexible blade produced on an insulating part;

FIG. 36 is a longitudinal cross-sectional schematic view of a variant of the magnetic shunt device according to FIG. 35;

FIG. 37 is an electrical diagram illustrating a device with magnetic shunt according to the invention, with reversing switch function in order to shunt an electrical circuit comprising a metal-ion accumulator;

FIG. 38 is a longitudinal cross-sectional schematic view of a device with rigid blade magnetic shunt according to the invention, intended to produce a reversing switch between two busbars as according to FIG. 37;

FIGS. 39A to 39E are longitudinal cross-sectional schematic views showing the different steps of operation of a device both for magnetic connection/disconnection between the two output terminals of an accumulator and two busbars and for magnetic shunt of the disconnected failing accumulator;

FIGS. 40 and 41 are perspective views of a connection/disconnection and magnetic shunt device according to FIGS. 39A to 39E, in a battery pack;

FIGS. 42A and 42B are longitudinal cross-sectional schematic views showing the different steps of operation of a variant of a device both for magnetic connection/disconnection between the two output terminals of an accumulator and two busbars, incorporating a passive detection of the magnetic disconnection by reed switch;

FIG. 43 is a longitudinal cross-sectional schematic view of a device both for magnetic connection/disconnection between an accumulator and two busbars and for magnetic shunt of the disconnected failing accumulator, the device consisting of a reversing switch and operating by disconnection of just one of the two accumulator output terminals;

FIGS. 44 to 46 illustrate, by perspective schematic view, the components at different stages of their assembly of a battery pack with several branches in series of accumulators in parallel within each branch, each accumulator being connected to two busbars by means of a magnetic connection/disconnection device according to the invention;

FIGS. 47 and 48 illustrate, by perspective view, a battery pack assembled as according to FIGS. 40 to 42 and which further incorporate a magnetic shunt device between two busbars;

FIGS. 49 and 50 illustrate, by perspective view, a battery pack assembled as according to FIGS. 44 to 45 and which further incorporate a reversing switch between two busbars;

FIGS. 51 to 53 illustrate, by perspective schematic view, the components at different stages of their assembly of a battery pack with several branches in series of accumulators in parallel within each branch, each accumulator being connected to two busbars by means of a magnetic connection/disconnection device according to the invention and the battery pack incorporates, on each branch, a magnetic shunt device between two busbars;

FIG. 54 is a perspective view of a magnetic shunt device according to FIG. 36, within the battery pack of FIG. 53;

FIGS. 55 to 57 illustrate, by perspective schematic view, the components at different stages of their assembly of a battery pack with several branches in parallel of accumulators in series within each branch, each accumulator being connected to two busbars by means of a magnetic connection/disconnection and magnetic shunt device according to the invention, as illustrated in FIGS. 39A to 39E;

FIG. 58 is a perspective schematic view of a honeycomb structure with individual recesses for unitary metal-ion accumulators of one and the same battery pack;

FIG. 59 is an exploded schematic view of a battery pack incorporating a honeycomb structure according to FIG. 56 and an electrically insulating substrate incorporating busbars connected magnetically to the accumulators.

FIGS. 1 to 5 relate to different examples of Li-ion accumulators, of housings and bushings forming terminals and a battery pack assembled by busbars according to the state of the art. These FIGS. 1 to 5 have already been commented on in the preamble and are not therefore discussed further hereinbelow.

In the interests of clarity, the same references denoting the same elements according to the state of the art and according to the invention are used for all the FIGS. 1 to 59.

Throughout the present application, the terms "lower", "upper", "down", "up", "below" and "above" are to be understood with reference to an Li-ion accumulator housing positioned vertically with its cover on the top and an output terminal-forming bushing protruding upward out of the housing.

FIGS. 6A and 6B show an example of a magnetic connection/disconnection device 10 according to the invention, intended to ensure the mechanical and electrical connection/disconnection between an output terminal of a low-current metal-ion accumulator and a busbar.

The device 10 here comprises a magnetic lock 11 comprising a permanent magnet 12, for example made of neodymium-cobalt, housed inside a cavity 13 formed in a ferromagnetic part 14, for example made of soft iron. This ferromagnetic part is linked electrically to the output terminal which is not represented here.

Another ferromagnetic part 15, also made of soft iron, is inserted into an insulating substrate 16 incorporating a busbar which is not represented here, and in contact with its electrically conductive part. This other plate 15 forms a closure plate of a magnetic circuit with the magnetic lock 11.

The closed magnetic circuit is illustrated in FIG. 6B: the passage of the current C is made through ferromagnetic parts 14, 15 and the magnetic flux F generated by the permanent magnet 12 circulates in closed loop both in the magnet 12 and in the ferromagnetic parts 14, 15.

Thus, in closed configuration, the closure plate 15 closes the ferromagnetic part 14 to allow a good circulation of the magnetic flux F generated by the magnet. This magnetic circuit exhibits a good magnetic permeability and its closure allows a significant force between the two subassemblies, and therefore guarantees a mechanical connection between the output terminal and the busbar while allowing the electrical contact between them.

In the example illustrated, the closure plate 15 is a solid plate. It is also perfectly possible to consider a closure plate in the form of a ferromagnetic washer which therefore, although hollowed internally, closes a magnetic circuit with the ferromagnetic part 14.

Since the power electrical current is not very intense, it can pass through the ferromagnetic material of the parts 14, 15 which ensures, in this configuration, the electrical conduction and the electrical contact between the two subassemblies of the device. Here, the closure plate 15 must be in direct electrical contact with the bottom ferromagnetic part 14 to allow an electrical conduction of the power current.

FIGS. 7A and 7B illustrate a magnetic connection/disconnection device for high power currents, typically higher than 1 A. In this case, the electrical conduction parts which ensure the passage of the power current and the quality of the electrical contact become important parameters.

Electrically conductive parts are therefore added. First of all, the top ferromagnetic part 15 is directly inserted into the electrically conductive busbar B1. The ferromagnetic part 15, typically made of soft iron, can be inserted by force-fitting or screwing or riveting to the busbar B1, typically made of copper.

Next, the bottom ferromagnetic part 14 is fixed, typically by fitting, into the cavity of an electrically conductive part 17. These two electrically conductive parts B1, 17 are electrical conductors of good quality, typically made of copper or aluminum. Since the resistivity of these conductors is very much lower than that of the ferromagnetic materials of the parts 14, 15, particularly the soft iron, most of the power current will pass through these conductors B1, 17.

In FIG. 7B, the magnetic circuit is closed: the circulation of the power current C passes into through the conductive parts B1, 17. The magnetic flux F of the permanent magnet is enclosed by the magnetic circuit to maximize the magnetic forces.

This FIG. 7B shows the presence of a small air gap e between ferromagnetic parts 14, 15, which does indeed very slightly reduce the connection force but advantageously makes it possible to allow a functional play between these parts.

Furthermore, an electrically conductive tooth lockwasher or crinkle washer 18 is arranged around the top ferromagnetic part 15. In the example illustrated, the ferromagnetic part 15 protrudes relative to the busbar B1 and the tooth lockwasher 18 is arranged around the protruding part of the part 15. Preferably, this washer 18 is made of copper-phosphorus alloy.

This washer 18 makes it possible to guarantee a good electrical contact. Indeed, a good electrical contact requires a significant contact surface and a force to compensate for the surface irregularities. The tooth lockwasher 18 makes it possible to establish several clearly defined points of contact by concentrating the force and by compensating for the mechanical plays.

The protuberances 19 of the washer 18 make it possible to establish several mutually parallel points of contact, which reduces the overall electrical resistance between the conductive parts B1, 17.

An exemplary advantageous form of tooth lockwasher according to the invention 18 is shown in FIGS. 8 and 8A.

Examples of dimensioning of tooth lockwashers 18 according to FIGS. 8 and 8A are indicated in the table below. The washers are shown here as circular but other forms can be envisaged, typically square or rectangular, depending on the form of the terminal.

| V (mm) Internal diameter | Tolerance | D (mm) External diameter | Tolerance | t (mm) Thickness | h (mm) Free position | Compressed Deformation F (mm) | height h-F | Load (N) | Compressed Deformation F (mm) | height h-F | Load (N) |
|---|---|---|---|---|---|---|---|---|---|---|---|
| 3 | +0.2 | 3.6 | 0 | 0.05 | 0.5 | 0.1 | 0.4 | 0.35 | 0.3 | 0.2 | 0.77 |
|   | 0 | 4.2 | −0.2 |   |   |   |   | 0.73 |   |   | 1.96 |
| 4 | +0.3 | 5 | 0 |   | 0.7 | 0.2 | 0.5 | 0.47 | 0.4 | 0.3 | 0.91 |
|   | 0 | 6 | −0.3 |   |   |   |   | 0.87 |   |   | 1.62 |
| 5 |   | 7 |   |   |   |   |   | 0.60 |   |   | 1.11 |
|   |   | 8 |   |   |   |   |   | 0.69 |   |   | 1.25 |
|   |   | 10 |   |   |   |   |   | 0.75 |   |   | 1.42 |
|   |   | 10 |   |   |   |   |   | 5.23 |   |   | 15.33 |
|   |   | 12 |   |   |   |   |   | 5.10 |   |   | 19.00 |
| 8 |   | 10 |   |   |   |   |   | 1.88 |   |   | 4.93 |
|   |   | 12 |   |   |   |   |   | 2.93 |   |   | 8.72 |
|   |   | 16 |   |   |   |   |   | 2.84 |   |   | 11.00 |
| 10 |   | 12 |   |   |   |   |   | 1.03 |   |   | 2.71 |
|   |   | 14 |   |   |   |   |   | 1.31 |   |   | 4.46 |
|   |   | 16 |   |   |   |   |   | 1.76 |   |   | 5.82 |
| 12 |   | 14 |   |   |   |   |   | 0.69 |   |   | 1.71 |
|   |   | 15 |   |   |   |   |   | 0.98 |   |   | 2.58 |
|   |   | 17 |   |   |   |   |   | 1.20 |   |   | 3.58 |
| 16 | +0.5 | 18 | 0 | 0.15 | 1.5 | 0.5 | 1.0 | 1.33 | 1.0 | 0.5 | 2.82 |
|   | 0 | 20 | −0.5 |   |   |   |   | 2.56 |   |   | 5.95 |
|   |   | 28 |   |   |   |   |   | 4.28 |   |   | 12.61 |
| 20 |   | 24 |   |   |   |   |   | 1.43 |   |   | 3.31 |
|   |   | 28 |   |   |   |   |   | 2.34 |   |   | 5.94 |
| 22 |   | 28 |   |   |   |   |   | 1.48 |   |   | 3.76 |
|   |   | 30 |   |   |   |   |   | 1.74 |   |   | 4.59 |
| 25 | +0.9 | 30 | +0.9 | 0.2 | 3.0 | 1.0 | 2.0 | 5.40 | 2.0 | 1.0 | 8.78 |
|   | 0 | 35 | 0 |   |   |   |   | 8.20 |   |   | 16.25 |
| 30 |   | 35 |   |   |   |   |   | 2.92 |   |   | 5.77 |
|   |   | 38 |   |   |   |   |   | 4.30 |   |   | 9.29 |

A variant of the device 10 is shown in FIG. 9: the bottom ferromagnetic part 14 previously described is eliminated. The magnetic flux F of the permanent magnet 12 is enclosed here in air, which means a greater dimensioning thereof to exert the same connection force as that of FIGS. 7A and 7B. The permanent magnet can for example occupy all the cavity of the conductive part 17, as shown in FIG. 9.

All the connection devices 10 which have just been described cannot be disconnected without outside intervention and therefore do not allow for dismantling between accumulator output terminal and busbar in live voltage/current conditions.

To resolve this problem, the device 10 is modified to be controlled by the supply of a current, as shown in FIG. 10.

Here, an electrically insulating mandrel 20 surrounds the permanent magnet 12, and an electrically conductive wire forming a coil 21 is wound around the insulating mandrel. The mandrel 20 can for example be made of insulating plastic, typically a thermoplastic of polyethylene type, and the coil wire can be made of copper.

The device 10 is thus configured such that:

i/ when the coil 21 is not initially electrically powered, the magnetic attraction force of the permanent magnet 12 on the closure plate 15, in the closed magnetic circuit configuration, maintains the mechanical connection between busbar B1 and conductive part 17, and therefore between busbar B1 and the output terminal. The electrical contract between them is produced through the washer 18.

ii/ when the coil 21 is electrically powered in a given direction, it produces a magnetic field opposite to that of the permanent magnet 12, to the point of cancelling the attraction force of the permanent magnet, which provokes the mechanical disconnection between busbar B1 and conductive part 17, or busbar B1 and output terminal. The electrical contact between them is eliminated.

This embodiment is also advantageous because it is possible to temporarily reinforce the attraction force of the permanent magnet 12 by injecting into the coil a current in the direction opposite to that of the phase ii/, which creates a magnetic field in the same direction as that of the permanent magnet 12. Thus, it is possible to more accurately control the closure between conductive parts B1, 17 or simply facilitate it.

Instead of a coil 21, it is possible to install an electrical heating resistor 22 as shown in FIG. 11.

More specifically, this heating resistor 22 surrounds, for example, the permanent magnet 12 and can be surrounded by a thermal insulation 23, whose function is to concentrate toward the permanent magnet 12 the heat produced by the heating resistor 22. Preferably, the thermal insulation 23 can be held by an electrically insulating mandrel 20 like that described above. Other geometrical configurations can be envisaged provided that the magnet is heated sufficiently.

A permanent magnet 12 is sensitive to the temperature and loses its magnetic properties (becomes amagnetic) beyond a critical temperature called Curie temperature. This temperature depends on the materials chosen for the permanent magnet and can vary from 100° C. to more than 250° C. In the context of the invention, the Curie temperature of the permanent magnet is chosen to be between a value close to 90% of the self-heating temperature (T1) and a value close to 110% of the thermal runaway temperature (T2) of the pack accumulators.

Thus, when it is electrically powered, the heating resistor 22 locally heats up the permanent magnet 12 dimensioned for its temperature to exceed the Curie temperature.

Since the magnet 12 no longer exerts attraction force, the mechanical and electrical disconnection occurs between conductive parts B1, 17. The demagnetization of the permanent magnet is definitive and therefore the disconnection according to this variant is too.

The electrical consumption required by the powering of the coil 21 or the electrical heating resistor 22 of a device 10 is very low, which is advantageous for a metal-ion accumulator which is intrinsically electrically autonomous.

Instead of an electrical heating resistor 22, the magnet can be heated up by the accumulator itself. Indeed, in the case of a metal-ion accumulator, its core temperature in thermal runaway mode is compatible with a permanent magnet demagnetization temperature. Thus, the electrical disconnection will be able to be obtained passively by virtue of the thermal runaway of the failing accumulator.

Several types of permanent magnets 12 exist and can be used for the devices described. The ferrite magnets or samarium cobalt are very powerful (strong coercive field) and are those used in the devices described above. These magnets with high performance (potentially expensive) are necessary in the design of a device according to the invention because the permanent magnet is of low volume.

Thus, the geometries shown in the devices previously described are schematic for illustrative purposes.

In practice, a permanent magnet 12 must advantageously be very thin: in fact, it behaves like an air gap e in the magnetic circuit C, and this gap must be as small as possible so that the flow and therefore the effort is maximum. Also, the diameter of the permanent magnet 12 is limited by the reduced device size.

Figure 12:
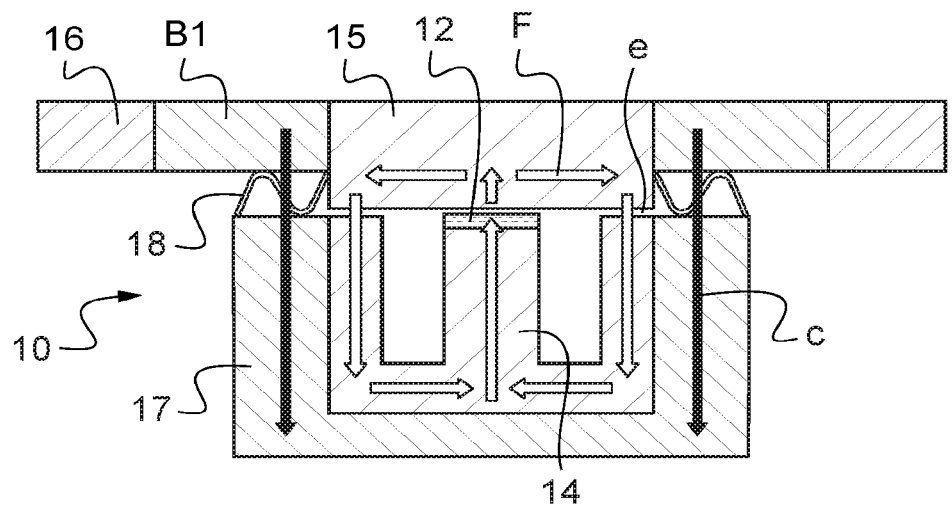
FIG. 12 is a schematic longitudinal sectional view of an advantageous embodiment of the device which is a concrete representation of the mode of FIGS. 7A and 7B.

FIG. 12 shows a type of permanent magnet 12 made of ferrite or cobalt samarium such that it can be concretely produced in the form of a disk and arranged in a device according to the invention, intended for the passage of strong currents. In this FIG. 12, it can be seen that the ferromagnetic cavity piece is replaced by a ferromagnetic piece 14 under an adapted shape, i.e. with a central wall at the upper end of which the magnet 12 in the form of a disc is supported. The ferromagnetic part is preferably hollowed out between its central wall and its empty peripheral wall to gain mass.

By way of example, the inventors have made a prototype of a samarium-cobalt magnet 12 in the form of a disk of a thickness of 1 mm and 10 mm in diameter, intended for an output terminal as a device connection/disconnection of approximately of 20 mm in diameter and 20 mm in height. The induction of such a magnet is 1.1 Tesla and the connection force obtained with this magnet 12 is 18N.

As a comparative example, by calculation, a permanent magnet 12 with a diameter of 10 mm and a height of 10 mm only generates a connection force of 0.5 N.

These sintered permanent magnets 12, high performance, are ideal for the applications sought in the context of the invention.

On the other hand, they can be expensive and the shaping that can be achieved with sintered ferromagnetic materials is limited to simple shapes, such as plates, discs, rings of small size.

This is why the inventors have thought of arranging a plasto-magnet in place of a permanent magnet sintered ferrite or samarium-cobalt.

Figure 13:
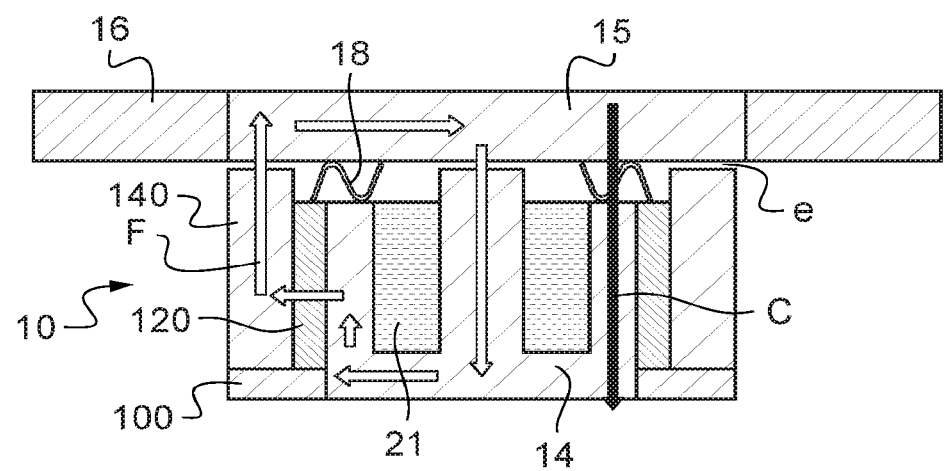
FIG. 13 is a schematic view in longitudinal section of an advantageous embodiment of the device which is an alternative to that of FIG. 10.

An example of a plasto-magnet arrangement in a connection device 10 according to the invention is shown in FIG. 13.

In this FIG. 13, the annular-shaped plastomagnet 120 which is arranged on the periphery of the contact with the magnetic circuit F made with two distinct ferromagnetic parts 14, 140 which form between it the annular volume in which is housed the plasto-magnet 120. The plastomagnet 120 thus has the shape of a cylinder of small thickness and high height.

A mechanical connection piece 100 may be force-fitted using a press or be welded to the interface between the two ferromagnetic parts 14, 140. Care is taken to ensure compatibility between the materials of the different parts, during their assembly.

As can be seen in this FIG. 13, the magnetic flux F is horizontal at the level of the plastomagnet 120.

Such a plasto-magnet 120 is advantageous because it allows to have a low air gap while benefiting from a large annular volume, and therefore to allow this less powerful magnet solution than the sintered magnets 12.

Figure 14:
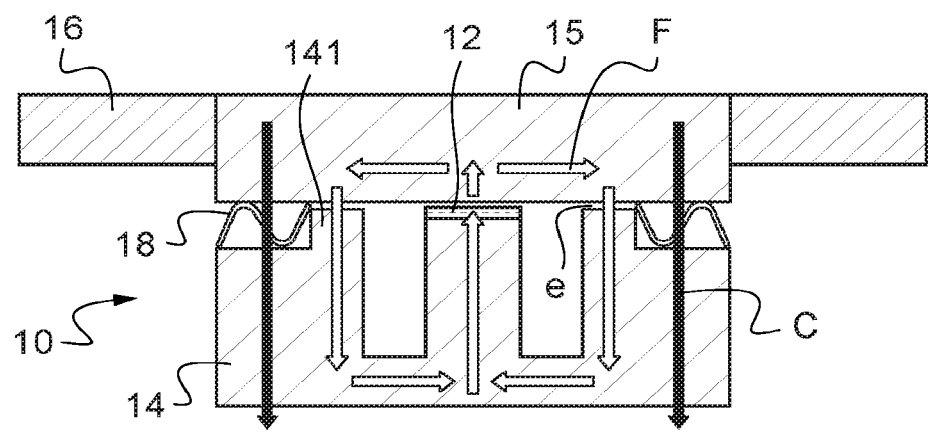
FIG. 14 is a variant of FIG. 12.

FIG. 14 shows an advantageous embodiment of the ferromagnetic part 14 with a magnet 12 in the form of a disk as in FIG. 12.

The ferromagnetic part 14 is made with a shoulder to obtain a difference in height 141 which allows both to obtain a magnetic contact zone and to establish a good electrical contact via an elastic washer 18 between the two parts 14, 15 of the magnetic casing, that is to say on the external magnetic circuit C. The arrangement of the washer 18 makes it possible not to add an air gap in the overall magnetic circuit which would be detrimental to the mechanical strength (reduction of the force).

In this configuration, the elastic washer 18 allows a point electrical contact with a sufficient contact pressure. The washer 18 may be coated with one or more suitable contact materials, typically based on a silver coating, to improve the contact resistance and prevent oxidation.

The permanent magnet 12 in the configuration of FIG. 14 is preferably a sintered magnet.

Thus, the configuration of FIGS. 13 and 14 is advantageous because the magnetic circuit consisting of ferromagnetic parts 14, 15, typically made of soft iron, is highly electrically conductive and can pass a high intensity current through the device, via of the conductive elastic washer 18. This therefore ensures good electrical conduction between the closure plate and the magnetic circuit.

Figure 15:
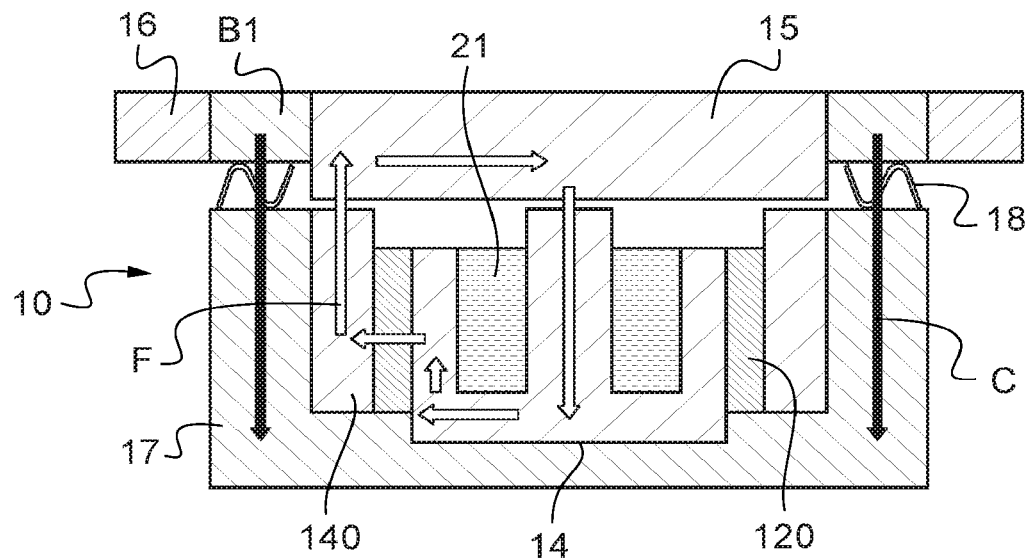
FIG. 15 is a variant of FIG. 13.

We can also consider passing a strong current through a non-magnetic carcass as shown in FIG. 15.

In this FIG. 15, the current no longer passes through the ferromagnetic parts 14, 15 but through the non-magnetic carcass constituted by the parts 17, B1 which are made of copper, for example.

It should be noted that in this configuration of FIG. 15, the mechanical connection piece 100 can be omitted because the electrical conduction part 17 mechanically holds the various elements in its cavity.

The magnetic connection/disconnection devices which have just been described can be partly incorporated directly in the accumulator output terminals.

The aim of this incorporation is to produce a magnetic lock between at least one accumulator output terminal and one busbar, the lock comprising a permanent magnet and a control coil cooperating with a magnetic closure plate.

As will emerge hereinbelow, a magnetic lock is incorporated in an output terminal and the closure plate is on the side of the busbar. Except for the configurations in which an electrical shunt of the accumulator is sought, it is also perfectly possible to consider incorporating the lock on the side of the busbar and the magnetic closure plate in the output terminal of an accumulator.

Figure 16:
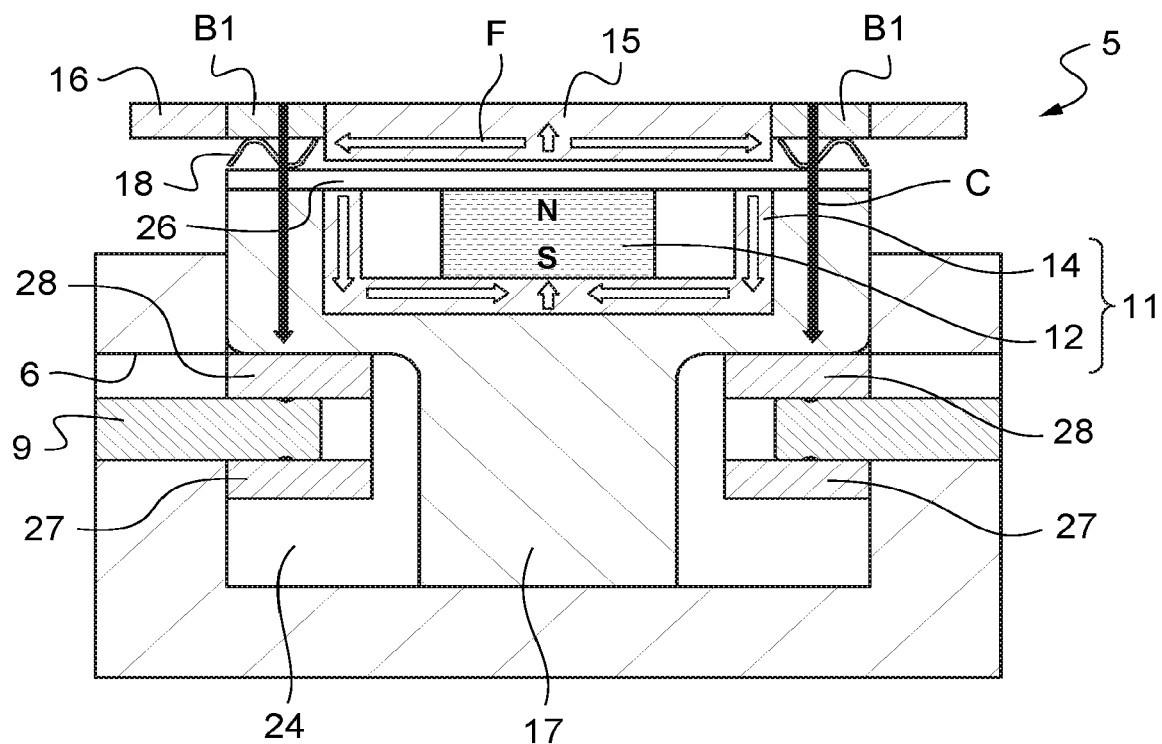
FIG. 16 is a longitudinal cross-sectional schematic view of an advantageous embodiment of a power current device, with incorporation of a part thereof in a bushing forming an output terminal of a metal-ion accumulator.

An exemplary embodiment of an output terminal 5 according to the invention formed by a bushing is shown in FIG. 16.

The bushing 5 is produced through an orifice emerging on either side of the cover 9 of the housing 6 of an accumulator A, which comprises two opposite faces.

The bushing 5 comprises an electrically conductive female part 24, and an electrically conductive male part 17 which comprises the cavity 25 in which the permanent magnet 12 is housed and which is closed by a blocking cap 26 which is also electrically conductive.

The cavity 25 also houses the ferromagnetic part 14 which here complements the permanent magnet 12 to form the magnetic lock.

A portion of the male part 17 is tightly fitted into a blind hole of the female part 24.

Two electrically insulating washers 27, 28 each comprise a bearing portion surface-bearing with pressure against one of the faces of the cover 9 and a guiding portion protruding relative to the bearing portion and in contact with the edge of the orifice.

Furthermore, each of the conductive portions 17, 24 comprises a bearing portion surface-bearing with pressure against a bearing portion of the washers 27.

As shown in FIG. 16, in closed configuration of the magnetic circuit, the magnetic flux F circulates in a loop in the terminal 5 through the ferromagnetic part 14 and the ferromagnetic part 15 inserted into the busbar B1, which guarantees the mechanical connection between terminal 5 and busbar B1. Simultaneously, the circulation of the power current C takes place from the busbar B1 through the cap 26 and the male part 17 of the terminal via the tooth lockwasher 18.

Figure 17:
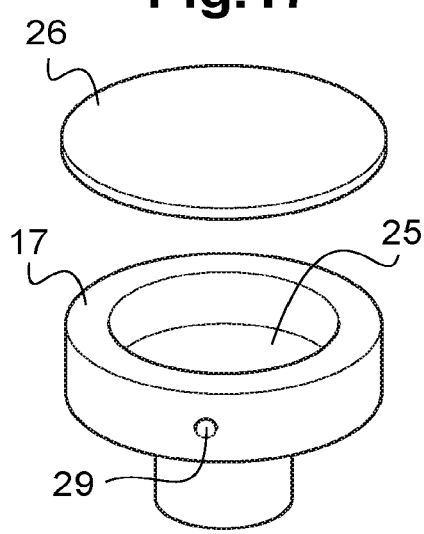
FIG. 17 is a perspective schematic view of the male part with its cap blocking a bushing according to FIG. 17.

FIG. 17 shows in detail the conductive male part 17 whose cavity 25 houses the permanent magnet 12 and which is closed by the cap 26, in particular fixed by welding. The cap 26 is preferably made of the same material as the male part 17. The thickness of this cap has to be defined according to the air gap desired with respect to the application.

Although not represented, a coil 21 or an electrical heating resistor 22 for the magnetic disconnection of the terminal 5 can be housed in the cavity 25.

A through-orifice 29 provided in the male part 17 makes it possible to pass through an electrical wire powering such a coil or electrical heating resistor.

Figure 18:
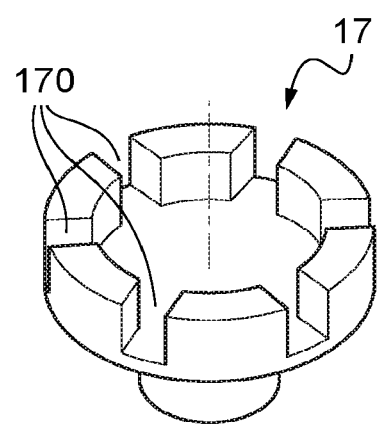
FIG. 18 is a perspective schematic view of a variant embodiment of a male part of a bushing according to the invention.

Instead of a conductive male part 17 with a quasi-blind cavity 25 apart from a through-hole 29 as illustrated in FIG. 17, it is possible to produce the conductive male part 17 with one or more slots 170 on its periphery as shown in FIG. 18. This variant is advantageous because, on the one hand, it allows for a weight-saving for the part 17 and, on the other hand, it allows the possibility of passing the wire powering the coil or electrical heating resistor at several points.

Figure 19:
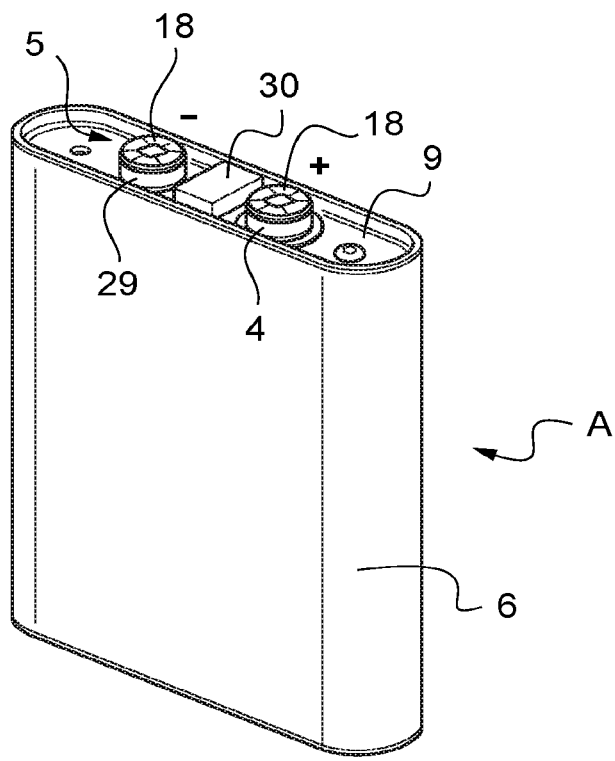
FIG. 19 is a perspective schematic view of a metal-ion accumulator of prismatic format incorporating two output terminals with magnetic lock according to the invention on the cover of the accumulator housing.

FIG. 19 shows a metal-ion accumulator A of prismatic format whose two output terminals 4, 5, both arranged on the cover 9 of the housing 6, incorporate the magnetic lock with permanent magnet 12. Preferably, each magnetic lock comprises a ferromagnetic part 14 and a coil 21 or electrical heating resistor 22 for the possible disconnection of the accumulator from busbars B1 and/or B2.

Thus, in closed configuration of each of their magnetic circuits, each of the two output terminals 4, 5 is magnetically locked respectively to a busbar B1 and/or B2.

As can be seen in this FIG. 19, the tooth lockwashers 18 can be mounted directly on the output terminals 4, 5.

The electrical powering of a coil 21 or heating resistor 22, with a view to the magnetic disconnection between an accumulator A and the busbars B1 and/or B2, can be produced from the power of the accumulator A or from another accumulator of a battery pack, by a BMS which makes it possible in particular to first detect the failure of the accumulator.

As shown in FIG. 19, such a BMS 30 can be fixed directly onto the cover 9 of the housing and powered directly by wires passing into the through-orifice 29 of the male parts 17 of the terminals 4, 5.

Figure 20:
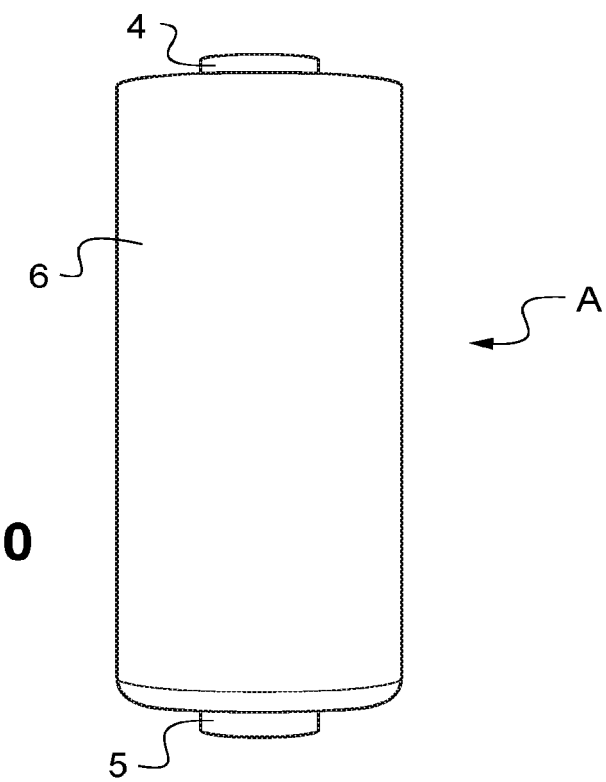
FIG. 20 is a perspective schematic view of a metal-ion accumulator of cylindrical format incorporating two output terminals with magnetic lock according to the invention one on the cover of the accumulator housing, the other on the bottom.
Figure 21:
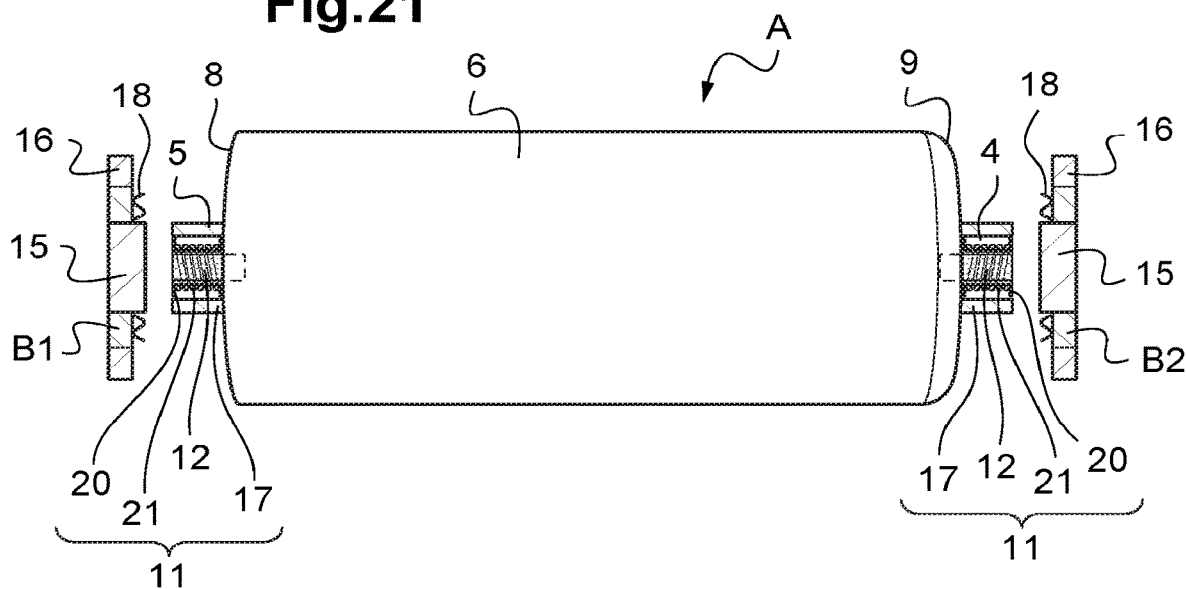
FIG. 21 is a side and partially cross-sectional schematic view of a metal-ion accumulator according to FIG. 16, with the ferromagnetic parts inserted into busbars forming closure plates of the circuit with the magnetic locks incorporated in the output terminals of the accumulator.

FIGS. 20 and 21 illustrate a metal-ion accumulator A of cylindrical format with the two output terminals 4, 5 which incorporate the magnetic lock with permanent magnet 12, one being arranged on the cover 9 of the housing 6, and the other, opposite, on the bottom of the housing 6.

Figure 22:
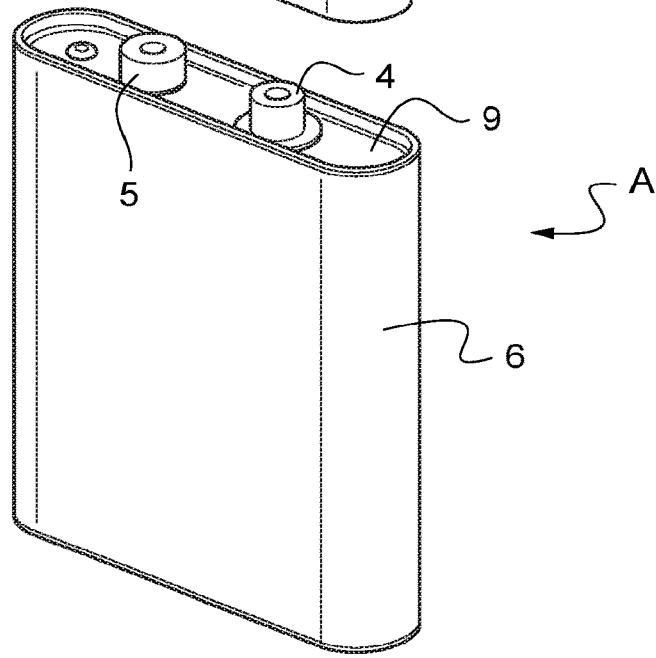
FIG. 22 is a perspective and partially exploded schematic view of an existing metal-ion accumulator of prismatic format with an interface adapter incorporating magnetic locks according to the invention.
Figure 23:
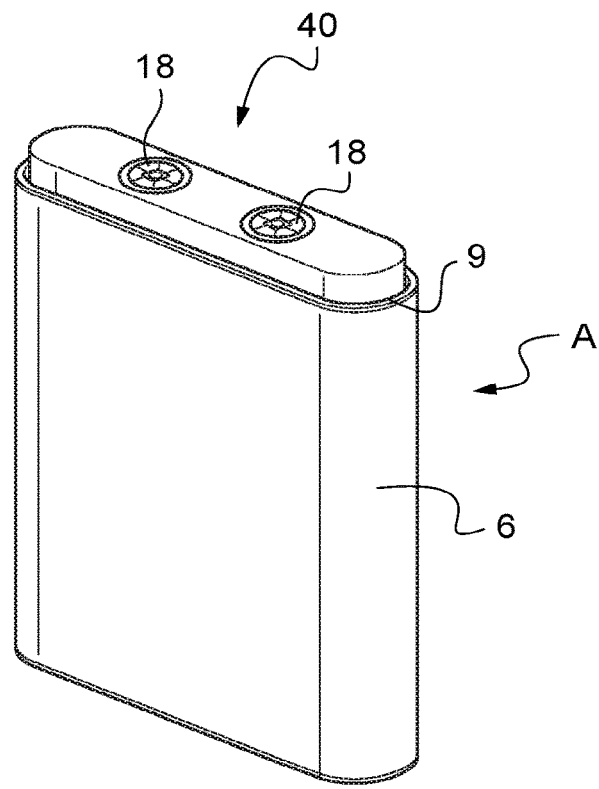
FIG. 23 is a perspective schematic view of the accumulator with its interface adapter according to FIG. 22, in its configuration installed on the housing of the accumulator.
Figure 24:
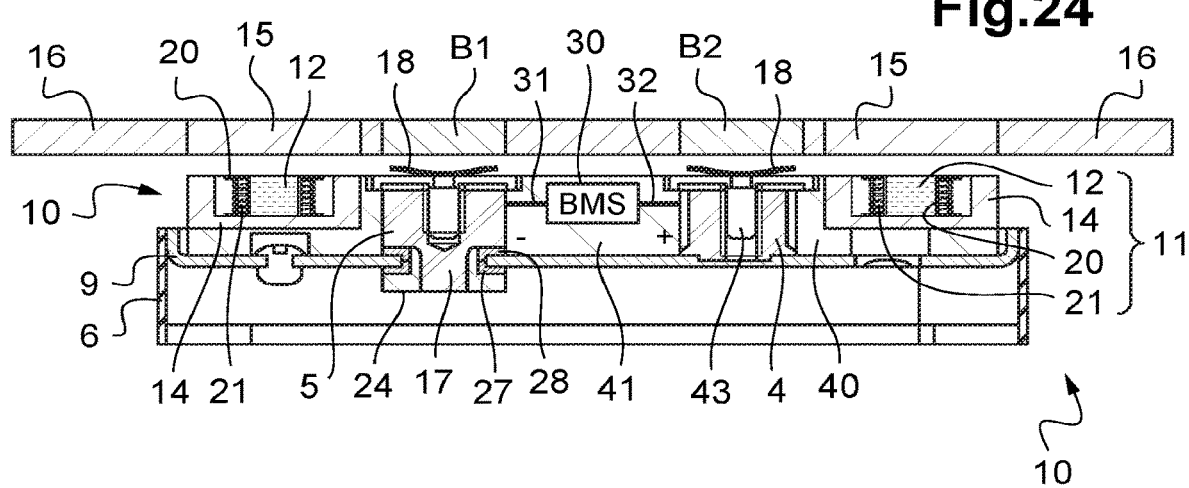
FIG. 24 is a partial longitudinal cross-sectional schematic view of an accumulator and its interface adapter according to FIGS. 22 and 23 facing ferromagnetic parts inserted into busbars forming closure plates of the circuit with the magnetic locks incorporated in the adapter.

When wanting to implement the magnetic connection/disconnection devices 10 in existing accumulators, it is possible to incorporate the latter in interface adapters 40 as illustrated in FIGS. 22 to 24.

Such an interface adaptor 40 comprises, first of all, a body 41 of a form preferably at least partly complementary with the bottom 8 or the cover 9 of the housing of the metal-ion accumulator. This body 41 is then mounted by fitting onto the bottom 8 and/or the cover 9.

In the embodiment illustrated in FIGS. 22 to 24, the body 41 comprises two through-recesses 42 inside each of which an output terminal 4, 5 of the metal-ion accumulator can be housed. The body is insulating or electrically insulated from one of the 2 terminals.

Two magnetic locks 11 each comprising a permanent magnet 12 surrounded by an insulating mandrel 20 with its wound coil 21, are incorporated in the body 41. The body 41 can be overmolded around the magnetic locks 11.

The magnetic locks 11 are, here, arranged at the lateral ends of the interface adapter 40, on the outside and side-by-side with the output terminals 4, 5.

The electrical connections between the output terminals 4, 5 and the busbars B1 and/or B2 opposite are ensured by electrically conductive parts 43 each suitable for being fixed with electrical contact to an output terminal of the accumulator. Furthermore, to guarantee an optimal electrical contact, two electrically conductive tooth lockwashers 18 are arranged on either side of a part 43.

A BMS 30 can be inserted inside the body 41 of the interface adapter 40. This BMS 30 is connected to the two magnetic locks 11 and to the output terminals 4, 5 by conductive tongues 31, 32.

The side-by-side arrangement of the magnetic locks 11 and of the output terminals 4, 5 with an interface adapter 40 makes it possible to obtain a higher contact pressure upon a shunt by lever effect, and between the accumulator and the busbars B1 and/or B2 by virtue of the magnetic surfaces available between magnetic locks 11 and ferromagnetic parts 15 which can be greater.

The interface adapters 40 according to FIGS. 22 to 24 can be adapted to all existing accumulator types, whatever the mechanical architecture of the terminals.

Moreover, an interface adapter 40 adds an extra thickness, which can make it possible to better manage the forces involved at the interface between accumulator and busbars.

Another type of interface adapter 40 is shown in FIGS. 21 to 23.

This interface adapter 40 comprises an enclosure 44 made of electrically insulating material, for example produced in insulating plastic material. The enclosure can also be made of conductive material, taking care to manage the different insulations required between parts at different potentials such as between terminals and housing for example. The form of the enclosure is matched to the form of the terminal which can be cylindrical, parallelepipedal or another form.

The enclosure 44 comprises an open central opening 45, which is adapted to be fixed, fitted or screwed or welded around an output terminal of an accumulator A and a cavity 46 suitable for housing a magnetic lock 11 according to the invention, with at least one ferromagnetic part 14 of complementary form which is fitted inside the cavity 46.

A blocking cap 47 closes the enclosure 44 housing the magnetic lock 11.

In the embodiment illustrated in FIG. 27, the interface adapter 40 incorporates a magnetic lock 11 comprising a permanent magnet 12 surrounded by an insulating mandrel 20 with its wound coil 21.

The interface adapter 40 is, here, arranged around an existing output terminal formed by a bushing 5, advantageously produced according to the teaching of the patent application FR2989836.

Thus, the bushing 5 is produced through an orifice emerging on either side of the cover 9 of the housing 6 of an accumulator A.

The bushing 5 comprises an electrically conductive female part 24, and an electrically conductive male part 17 of which a portion is tightly fitted into a hole of the female part 24.

Two electrically insulating washers 27, 28 each comprise a bearing portion, surface-bearing with pressure against one of the faces of the cover 9 and a guiding portion protruding relative to the bearing portion and in contact with the edge of the orifice.

Furthermore, each of the conductive parts 17, 24 comprises a bearing portion, surface-bearing with pressure against a bearing portion of the washers 27.

In this configuration of FIG. 27, the magnetic lock 11 is arranged concentrically around the output terminal 5.

The assembly between interface adapter 40 and output terminal according to the concentric configuration of FIG. 27 can be done by force-fitting or welding or screwing around the output terminal 5 provided in the latter case with an external threading not represented.

Here also, the interface adapters 40 according to FIGS. 25 to 27 can be adapted to all existing accumulator types, whatever the mechanical architecture of the terminals. In particular, these annular adapters 40 can be implemented with lead accumulators whose packaging is made of electrically insulating plastic material. The illustration is of an accumulator with rigid housing. This type of adapter is applied also to the accumulators with flexible packaging.

The magnetic disconnection which has just been described with no other measure can create electrical arc problems for currents of high power.

Indeed, the connection/disconnection of electrochemical accumulators that are charging can lead to the occurrence of an electrical arc at their connections. This arc is very hot, typically several thousands of degrees, which can lead to a runaway of the chemistry and therefore thermal runaway of the battery. This arc is all the more problematical when a metal-ion accumulator is operating in direct current mode, the absence of natural passage of the current through 0 does not necessarily allow for the rapid extinction of the arc.

A first solution for achieving a rapid extinction consists in elongating the electrical arc by using the magnetic fields. The elongation of the arc will increase the exchange surface with the ambient medium and will lead to the cooling of the arc. As the temperature of the arc decreases, its resistance increases until the current becomes nil and the medium becomes insulative.

A first magnetic elongation device is illustrated in FIGS. 28A, 28B and 29A, 29B.

The magnetic connection/disconnection device 10 here necessarily incorporates an electrically conductive tooth lockwasher 18 around the ferromagnetic part 15.

Thus, the electrical contact is made between the conductive tooth lockwasher 18 and a conductive contact of the conductive part 17, which is of cylindrical revolution in the example illustrated. The contact takes place at multiple points of contact.

When the contact opens during the disconnection, several electrical arcs will be triggered at these different points of contact (FIGS. 28A, 29A).

The current in these arcs, which behave as electrical conductors, is in the same direction. These electrical arcs will therefore be attracted according to the Laplace law, which will deform them as shown in FIG. 28B and, thereby, elongate the path and increase the exchange surface with the ambient medium to achieve the extinction of the arcs.

Through the choice of dimensioning of the tooth lockwasher 18, it is ensured that the arcs are sufficiently close to one another, typically a few mm, in order for the Laplace force between the arcs to be sufficient.

A second magnetic elongation device is illustrated in FIGS. 30, 31 and 32. This second device can be complementary to the first device of FIGS. 28A and 28B.

Here, the ferromagnetic part 15 is produced with notches 150, for example V-shaped, when seen from above.

An electrical contact washer of particular form 50 is provided. This washer 50 is in the form of a ring linked electrically to one of the busbars.

The washer 50 is provided with flexible barbs 51 on its internal periphery, each arranged in a notch 150 of the ferromagnetic part 15.

In the configuration of closure of the magnetic connection circuit, each barb 51 is in electrical contact with the conductive part 17 of an output terminal 4 or 5. In fact, the flexible barbs 51 are a little depressed by virtue of their elasticity to compensate for the plays and obtain the desired contact pressure.

Upon the mechanical disconnection between output terminal and busbar, with elimination of the electrical contact between washer 50 and output terminal, electrical arcs between barbs 50 and conductive part 17 of the output terminal will be created. These arcs will generate magnetic fields which will deform the arcs toward the closure ferromagnetic part 15, which will thus cool them until they are extinguished.

More specifically, upon the opening of the contact, electrical arcs will occur as previously which will generate magnetic fields particularly in the ferromagnetic part 15 in proximity. A Laplace force F will be exerted between each electrical arc and this magnetic field which is channeled by the part 15 of very much higher permeability than that of the air.

As previously, the electrical arc will be deformed inward and will be attracted toward the ferromagnetic part 15. The latter, being a good conductor of heat relative to the air, will absorb a large portion of the thermal energy of the arc and will cool it very strongly, leading to its extinction. There may even be a local melting of this closure part 15, which will absorb a considerable energy (slow liquefaction, even vaporization, heat). Care of course must be taken to dimension the parts to compensate for the gradual wear possibly induced by the absorption of the thermal energy of the arc.

A second solution for achieving a rapid extinction consists in generating, at the moment of the occurrence of the electrical arc, a gas under pressure at the center of the contact which will drive the latter outward. The arc is thus elongated outward to cool it and to blow it out.

An arc extinguishing device based on the blowing of pressurized gas is illustrated in FIGS. 33A and 33B. To do this, a part 52 made of electrically insulating material, having a low vaporization point typically lower than 250° C., for example a thermoplastic material of polyethylene type, is arranged at the center of the magnetic lock on top thereof. The melting point of this part 52 should preferably be lower than the Curie temperature of the permanent magnet to be able to blow out the arc without damaging the magnetic properties of the magnet.

Upon the occurrence of the electrical arc, this part 52 with low melting point will be vaporized under the effect of the heat generated by the arc and thus generate gas locally under pressure. Indeed, since the heating due to the arc is rapid, the pressurized gas generated does not have time to be dissipated. This pressurized gas will drive the arc outward from the electrical contact and thus elongate it leading to its extinction (FIG. 33B).

The part 52 with low melting point can be arranged in the air gap, between magnetic lock 11 and ferromagnetic part 15, inside the washer 18. It is possible to provide for this part 52 to constitute, with the insulating mandrel 20 for winding of the coil 21, one and the same part.

FIG. 34 shows an example of magnetic shunt device 60 according to the invention, intended to ensure a shunt within a battery pack and to thus ensure a continuity of operation thereof.

The shunt device 60 comprises a flexible electrically conductive blade 61, fixed at one of its ends to a fixing point 62 on a conductive part of one of the busbars. The blade 61 can be made of copper-beryllium.

At the other end of the flexible blade 61 there is inserted a magnetic lock 11 which comprises a conductive cavity 17 within which is housed a ferromagnetic part 14 which itself houses a permanent magnet 12 and a coil 21 around the magnet 12.

In open position, as represented, the elasticity of the conductive blade needs to be sufficient to compensate for the attraction of the magnet to the ferromagnetic plate on the fixed part, such that the device remains open.

When wanting to close the contact between conductive parts 17, B1, a current is applied in the coil 21 in the appropriate direction, such that the magnetic field generated by the coil reinforces that of the permanent magnet 12. The force generated by the magnetic field of the coil and the magnet combined must then be greater than that of the flexible blade 61. The contact can then be closed and its magnetic locking performed by the magnetic lock 11 with the fixed ferromagnetic part 15.

When the current controlling closure in the coil 21 is cut, the permanent magnet 12 can on its own ensure that the closure is maintained because the air gap between the magnetic lock 11 and the ferromagnetic part 15 is reduced, which implies a magnetic locking force greater than that of the flexible blade 61. The shunt device 60 then remains in closed position, even in the absence of current in the control coil.

To open the shunt device 60, an opposite current must be injected into the coil 21, such that the magnetic field generated thereby is opposite to that of the permanent magnet 12 and cancels the resulting field. When the maintaining force due to this resultant field becomes lower than that of the flexible blade 61, the shunt device 60 can open. The current controlling opening in the coil can then be cut because the blade 61 reverts to the initial position, that is to say that the magnetic attraction force of the magnet 12 is lower than the opening force of the blade 61.

FIG. 35 illustrates a variant which has just been described according to which the shunt device 60 is duplicated apart from the fixing of the blades: two flexible blades 61 are each fixed at one of their ends to an electrically insulating fixing point and incorporate, at the other of their ends, a magnetic lock 11. The operation of the duplicated shunt device 60 is identical to that described with reference to FIG. 34.

Furthermore, the duplicated shunt device 60 advantageously makes it possible to produce the simultaneous disconnection of the two terminals 4, 5 of an accumulator, whereas in the example of FIG. 34, a single terminal 5 is affected by the lock system, the other terminal being linked for example by a flexible cable 63 to the busbar B2.

Another variant of the shunt device 60 is illustrated in FIG. 36: the magnetic locks 11 are, here, inserted into the fixed bottom part, the conductive parts forming the cavities housing the permanent magnets 12, coils 21 and ferromagnetic parts 17 then being produced in the busbars B1, B2 or in conductive parts linked thereto. This variant of FIG. 36 can make it possible to simplify the connecting of the control coils to the electronic control unit, in particular the BMS of an accumulator.

FIGS. 37 and 38 show an example of magnetic shunt device 70 according to the invention, intended to constitute a reversing switch within a battery pack and to ensure not only a continuity of operation thereof but also to shunt a circuit of one or more accumulators.

As illustrated in FIG. 38, the reversing switch device 70 comprises a rigid blade 71 articulated at its center by an articulation 72. The articulation 72 of this rigid blade does not make it possible to simply produce a power electrical connection of quality. Also, the current can be brought to this blade 71 using a metal braid 73, preferably made of copper electrically spot welded to improve this electrical link.

The rigid blade 71 incorporates, at each of its ends, a ferromagnetic part 15, each intended to close a magnetic circuit with one of the magnetic locks 11 arranged in the bottom part of the device as already described.

In FIG. 38, when the contact on the right between blade 71 and conductive part 17 is closed and locked by the magnetic lock 11, the contact on the left is open.

Since the permanent magnet of the contact on the right is much closer to the ferromagnetic part 15 compared to that of the contact on the left with its part 15 on the left facing, the magnetic attraction force is very much greater on the right side and the reversing switch device 70 remains locked in this position.

To make the pivoting rigid blade 71 switch over and therefore achieve the reversal, the method is as follows.

A BMS commands the injection of a current into the coil 21 on the right, such that the magnetic field generated by the coil opposes that of the permanent magnet 12 on the right.

The force maintaining the contact on the right decreases strongly and is canceled out at the end of a certain time.

At one moment, the attraction torque, defined as being the product between the attraction force and the length of one of the parts of the blade, exerted by the permanent magnet 12 on the left, becomes greater than the torque maintaining the contact on the right and the blade 71 then switches over, opening the contact on the right and closing the contact on the left.

The BMS can possibly command the injection of a current into the coil of the contact on the left to transiently increase the magnetic field generated by the permanent magnet on the left. That makes it possible to manage the speed of switchover of the rigid blade 71.

When the rigid blade 71 has switched over, the magnetic lock 11 on the left keeps the contact on the left locked in this new position and the powering of the control coils 21 can be cut.

A reverse operation of the device 70 is of course possible to revert to the initial state.

Instead of arranging the magnetic locks 11 in the bottom fixed part of the reversing switch device 70, they can be located in the rigid blade 71.

FIGS. 39A to 39E show the different phases of a device 80 both for connection/disconnection between an accumulator A and busbars B1, B2, and for shunt of this accumulator A disconnected because it has failed.

Here, a magnetic lock 11.1 is incorporated in each of the output terminals 4, 5, of the accumulator.

Each lock 11.1 of a terminal 4, 5 comprises a conductive cavity 17 within which is housed a ferromagnetic part 14 which itself houses a permanent magnet 12.1 and a coil 21 around the magnet 12.1.

Two ferromagnetic parts 15 are each inserted into one of the two busbars B1, B2, forming closure plates of a magnetic circuit with the magnetic lock 11 of one or other of the output terminals 4, 5.

Two flexible electrically conductive blades 81 are each fixed at one of its ends to a fixing point 82. Each blade 81 comprises a cavity within which is housed only a permanent magnet 12.2 forming a magnetic lock 11.2.

As can be seen in these FIGS. 39A to 39E and as explained hereinbelow, a permanent magnet 12.2 of a flexible blade 81 is facing a permanent magnet 12.1 of a magnetic lock 11.1 of a terminal 4, 5, with their poles of the same sign, positive in the example illustrated, facing one another.

The operation of a connection/disconnection and magnetic shunt device 80 is as follows.

When the BMS 30, incorporated in the accumulator housing, detects a normal operation of the accumulator, the magnetic attraction force of the permanent magnets 12.1 of the output terminals 4, 5 respectively on the facing closure plates 15, in the closed magnetic circuit configuration, ensures the mechanical connection between said output terminals 4, 5 and the busbars B1 and/or B2 with electrical contact between them (FIG. 39A).

In this configuration, the permanent magnets 12.2 of the flexible blades 81 are repulsed by the permanent magnets such that the flexible blades 81 cannot be in electrical contact with the busbars B1, B2, that is to say away from them (FIG. 39A).

When the BMS 30 detects a failure of the accumulator A, it powers, from the voltage and the energy of the accumulator, the coils 21 of the output terminals 4, 5, through electrical power supply wires incorporated in the accumulator A (FIG. 39B).

The failure of the accumulator can be detected from at least one of the following parameters: the skin temperature, the internal temperature, the voltage and the resistance of the cell.

The powering of the coils 21 is done in a direction such that they each generate a magnetic force opposite to the magnetic attraction force of the permanent magnets 12.1 of the terminals 4, 5 until the mechanical and electrical disconnection between output terminals 4, 5 and, respectively, the two busbars B1, B2 is ensured (FIG. 39C).

This disconnection causes the accumulator to drop through gravity.

For the powering of the coils 21, advantageously, the current is made to increase from 0 to a predefined value with a ramp that is sufficiently slow, 1 to 2 s for example, to allow time for the accumulator to fall through gravity, when the resulting magnetic field, that is to say that resulting from the permanent magnets 12.1 and the coils 21, becomes insufficient to compensate for the weight of the accumulator.

The magnetic fields generated by the coils 21 can continue to increase a little when the accumulator has dropped, and that is inconsequential. The current is cut after a fixed time, 2 s for example.

Simultaneously or quasi-simultaneously with the dropping of the accumulator, because of the absence of magnetic repulsion, the magnetic circuit is closed between the permanent magnets 12.2 of the flexible blades 81 and the closure plates 15 and the electrical connection is made between the busbars B1 and B2 through the flexible blades 81 (FIG. 39D).

In other words, the mechanical and electrical disconnection between output terminals 4, 5 and busbars B1 and B2 is accompanied simultaneously by the electrical connection to the busbars B1 and B2 by the conductive flexible blades 81. This electrical connection to the busbars B1 and B2 constitutes a shunt of the accumulator A while reestablishing the electrical continuity in place of the accumulator A.

To finalize the operation of the device, the dropping of the accumulator A can be done guided in a recess containing a heat-transfer liquid L (FIG. 39E). Thus, the accumulator A embedded in the heat-transfer liquid L is made inert. The heat-transfer liquid can be that of a cooling circuit of a battery pack in which the accumulator is incorporated or a liquid independent of said cooling circuit brought into the recess under the control of the BMS or a liquid resulting from the change of state of a phase change material (PCM) obtained by heating up the accumulator.

Depending on the voltage and current of the accumulator, in case of risk of electrical arc when the accumulator drops through gravity provoking its mechanical and electrical disconnection, it is possible to implement the means previously described with reference to FIGS. 28A to 33B.

Instead of a coil 21, it is possible to arrange in each output terminal 4, 5 an electrical heating resistor. The power supply of this heating resistor is designed to heat up the permanent magnets 12.1 to a temperature higher than their Curie temperature. The permanent magnets 12.1 are then demagnetized, and definitively so.

The advantage over the coils 21 is that the definitively demagnetized permanent magnets cannot prevent magnetic locking of the flexible blades 81, even if the accumulator disconnected for any reason remains close to the closure plates 15. Here, in case of significant heating of the failing accumulator, for example following a thermal runaway, the demagnetization of the permanent magnets 12.1 can be obtained by the heating itself without requiring electronic control or BMS.

Whether the disconnection is provoked by a coil 21 or an electrical heating resistor, a failing accumulator exhibits a voltage and a capacity that are minimal for the electrical power supply. This minimal energy is therefore advantageously exploited for the disconnection of the faulty accumulator.

Typically, as an indication, a magnetic lock commonly used for closing gates with a contact force of 300 daN requires, for its unlocking, a pulse of 12V/550 mA for a few seconds.

In the case of an Li-ion accumulator, this unlocking energy for a 3V accumulator corresponds to a current of 2 A for a few seconds that the failing accumulator can supply without difficulty.

In place of the BMS 30 specific to the failing accumulator, it is possible to use other electronic monitoring systems which will control the electrical powering of the coils 21 or electrical heating resistors. It may be a general BMS of a battery pack or of a non-failing accumulator which will be dedicated to that within a battery pack.

FIGS. 40 and 41 illustrate a concrete exemplary embodiment of a magnetic connection/disconnection and shunt device 80 which has just been described: the blades or tongues 81, of the type made of copper-beryllium, are fixed by a rivet 82 to an insulating substrate 16 into which the busbars B1 and/or B2 are inserted.

FIGS. 42A and 42B illustrate a variant of passive detection of a magnetic disconnection of an accumulator A from the busbars B1 and/or B2. Here, the fixed part of the connection/disconnection device 10 incorporates a relay switch 90, commonly called reed switch.

This reed switch 90 is facing a permanent detection magnet 91 arranged in the accumulator.

More specifically, the permanent detection magnet 91 facing the reed switch 90 closes the latter when the accumulator A is connected to the busbars B1 and/or B2 (FIG. 42A).

When the accumulator A is disconnected, the permanent magnet 91 is too far away to close the switch 90 which therefore opens (FIG. 42B). This opening provokes an opening of the circuit formed with a BMS 30 and the electrical links 33, 34. Thus, completely passively, the BMS 30 can detect the fact that the accumulator A is disconnected from the busbars B1, B2. The detection magnet 91 can be a dedicated magnet or else the permanent magnet of the magnetic lock of the accumulator.

FIG. 43 shows an advantageous implementation of a reversing switch 70 illustrated in FIG. 38. In this implementation, the magnetic disconnection of an accumulator A with shunt can be done by just one of its terminals 5.

In the example illustrated in FIG. 43, the accumulator A is of cylindrical geometry and comprises an output terminal 5 on one side of the packaging 6, for example the cover 9, and the other output terminal 4 is on the other of the sides of the packaging 6, for example on the bottom 8.

In this example of FIG. 43, the accumulator is arranged vertically. However, it is also perfectly possible to envisage arranging it horizontally.

Here, the output terminal 5 on the top is electrically connected to the busbar B1 by one of the magnetic locks 11 of the reversing switch 70 (on the left in FIG. 39). This connection ensures the mechanical strength of the accumulator A.

The other output terminal 4 is electrically connected to the busbar B2 by an electrically conductive wire or foil 74, typically made of copper, which can advantageously be surrounded by an electrically insulating sheath, not represented.

Just like that represented in FIG. 38, the reversing switch 70 comprises a rigid blade 71 articulated at its center by an articulation 72. The current is also brought to this blade 71 by a metal braid 73, preferably made of copper electrically spot welded to improve this electrical link.

The rigid blade 71 incorporates, at each of its ends, if necessary in a conductive part 17, a magnetic lock 11 with permanent magnet 12 provided with a coil 21.

Ferromagnetic parts 15 each intended to close a magnetic circuit with one of the magnetic locks 11 is arranged on the busbars B1 and B2 and in the output terminal 5.

In connection configuration, the contact on the left between blade 71 and the output terminal 5 is closed and locked by the magnetic lock 11, the contact on the right is open.

Since the permanent magnet of the contact on the left is much closer to the ferromagnetic part 5 compared to that of the contact on the right with its part 15 on the right facing, the magnetic attraction force is very much greater on the left side and the reversing switch device 70 remains locked in this position.

To make the pivoting rigid blade 70 switch over and therefore achieve the disconnection of the accumulator with production of the shunt by reversal, the method is as follows.

A BMS commands the injection of a current into the coil 21 on the left such that the magnetic field generated by the coil opposes that of the permanent magnet 12 on the left.

When the magnetic lock 11 on the left opens, only the output terminal 5 is magnetically disconnected and the accumulator drops through gravity.

Simultaneously, the rigid blade 71 has switched over, the magnetic lock 11 on the right keeps the contact on the right locked in this new position (FIG. 43) and the powering of the control coil 21 can be cut.

Thus, in this embodiment, the mechanical and electrical disconnection of the accumulator A is produced only on one of the output terminals, which causes the latter to drop through gravity. The simultaneous reversal produced on the busbar B2 by the reversing switch 70 constitutes a shunt of the accumulator A while reestablishing the electrical continuity in place of the accumulator A.

Here again, instead of arranging the magnetic locks 11 in the rigid blade 71, of the reversing switch device 70, they can be located in the busbars B1 and B2.

It goes without saying that a sufficient length of the foil or wire 74 is provided so as not to hamper the accumulator A when it drops.

With all of the magnetic connection/disconnection devices 10, 60, and, if appropriate, the magnetic shunt device 80 with, if appropriate, a reversing switch device 70, which have just been described, following a failure of an accumulator or the need for a modification of the electrical architecture of a battery pack, it is possible to implement an electrical and/or mechanical disconnection of an accumulator, reconfigure an electrical architecture of a battery pack, if necessary by producing a shunt of one or more accumulators of the pack.

Some embodiments allow a deactivation of the permanent magnet or magnets with no BMS intervention, that is to say completely passive embodiments. These embodiments can advantageously be implemented if a maximum safety is desired for the operation of an individual accumulator or of a battery pack.

In other words, with all of the magnetic connection/disconnection devices 10, 60, and, if appropriate, the magnetic shunt device 80 with, if appropriate, a reversing switch device 70, it is possible to envisage producing different battery pack P architectures, for the purposes of active control on demand and/or for the purposes of safety with continuity of operation of the pack.

FIGS. 44 to 46 show the production, by means of magnetic connection/disconnection devices 10, of a battery pack P1 comprising the parallel connection of a plurality of accumulators A1, . . . Ax by busbars B1, B2 to form a branch M1 linked electrically in series through busbars B3 with other similar branches M2, M3.

For each branch M1, M2, M3, a connection assembly 100 comprising an electrically insulating substrate 16 in which busbars B1, B2 are inserted is produced (FIG. 44).

After having housed the plurality of the accumulators A1 . . . Ax of each branch in recesses 102 of a honeycomb structure 101, the connection assembly 100 is fixed by the plurality of magnetic connection/disconnection devices 10 (FIG. 45).

Then, the series connection of the branches M1, M2, M3 is produced by means of busbars B3.

If only the unit disconnection of failing accumulators is wanted, each accumulator A1, . . . Ax of each branch M1, M2, M3 here comprises a BMS 30 which is specific to it.

In the case where an active control of such a battery pack P1 is wanted, for example to increase the power of the pack P1 on demand, it is possible to cut or temporarily power a branch by means of one or more magnetic connection/ disconnection devices with shunt 60 and/or one or more reversing switches 70. In this case, preferably, each branch M1, M2, M3 comprises a single BMS which can command the injection of an electrical current into the magnetic locks 11.

A battery pack P1 with two magnetic connection/disconnection devices with shunt 60.1, 60.2 is thus shown in FIGS. 47 and 48.

In full-power operation of the pack P1, one of the devices 60.1 (the outermost of the pack in FIGS. 47 and 48) is not activated and the other of the devices 60.2 (the innermost of the pack in FIGS. 47 and 48) acts as a serial link busbar B3 between two branches M1, M2 (FIG. 47). The set of the branches is then connected. The direction of the current is indicated in FIG. 47.

In case of need or desire for lower-power operation of the pack P1, the overall BMS of the pack P1 activates the device 60.1 which is inactive in full-power mode and opens the device 60.2 which is active in full-power mode (FIG. 48). The branch M1 is then shunted to provide less power.

If wanting to further improve the dependability of the pack upon the switchover from full power to lower power, it is possible to implement, instead of the two devices 60.1, 60.2, a single reversing switch 70 which, in one of its switchover positions, produces the electrical connection between the busbars B1 and B2 to connect all of the branches M1, M2, etc. and, in the other of its switchover positions, produces the shunt of one of the branches M1, M2 etc.

This embodiment is illustrated in FIGS. 49 and 50. In full-power operation illustrated in FIG. 49, the connection in electrical series between two branches M1-M2, M2-M3 is ensured by a reversing switch 70.1, 70.2, 70.3 described and illustrated with reference to FIG. 43. Thus, the metal braid 73.1, 73.2, 73.3 ensures the electrical link between the busbar B2 of the preceding branch to the busbar B1 of the next one. In case of necessity, particularly in case of failure of the branch M2, or of desire for the pack P1 to operate at lower power, the overall BMS of the pack P1 activates the reversing switch 70.2 such that its rigid blade pivots (FIG. 46). The branch M2 is then shunted and the pack P1 can operate with the power of the other branches M1 and M3 still connected in series.

FIGS. 51 to 53 show the production, by means of magnetic connection/disconnection devices 60, of a battery pack P2 comprising the parallel connection of a plurality of accumulators A1, . . . Ax by busbars B1, B2 to form a branch M1 linked electrically in series through busbars B3 with other similar branches M2, M3.

In this architecture, a failure of an accumulator A1 can have a high impact on its accumulator in parallel A2, . . . Ax. Indeed, the loss of capacity of the failing accumulator A1 will not be compensated by the adjacent accumulator A2.

It is therefore necessary to shunt the branch M1, M2 or M3 of the failing accumulator in order to ensure the electrical performance levels of the battery pack P2 and ensure a continuity of operation or of service of P2.

The actuation of a device 60 at the end of the branch, containing the failing accumulator, produces the desired magnetic shunt and therefore the continuity of operation of P2.

FIGS. 55 to 57 show the production, by means of magnetic connection/disconnection devices with shunt 80, of a battery pack P3 comprising the series connection of a plurality of accumulators A1, . . . Ax by busbars B1, B2 to form a branch M1 linked electrically in parallel through busbars B3 with other similar branches M2, M3.

In this battery pack P3 architecture, each accumulator A1, . . . Ax of each branch M1, M2, M3 comprises a BMS 30 which is specific to it.

In this architecture, a failure of a given accumulator can have a great impact on all of the pack P3. Indeed, the loss of an accumulator in series can cause a reduction of the voltage of the branch which contains the failing accumulator, with, ultimately, an imbalance between the branches. An imbalance can lead to an overvoltage internal to the pack P3, which can cause the general runaway thereof.

In this architecture, it is important to consider the chemistry of the accumulators, which must be capable of withstanding an overvoltage. For example, in the case of an Li-ion accumulator, the lithium iron phosphate LFP has a so-called "flat" discharge curve, which makes it possible to have a uniform range during charging or discharging. Also at least twice the nominal voltage has to be reached in order to perceive a start of runaway, which makes it possible to absorb a voltage difference between the two branches and to rebalance all of the system.

Each failing accumulator can be disconnected then shunted by means of a device 80.

Thus, the safety and the continuity of service of the battery pack P3 are constantly ensured whatever the failing accumulator by means of the devices 80 individually dedicated to each accumulator of the pack P3.

By virtue of the magnetic connection/disconnection devices, if appropriate with magnetic shunt which have just been described, an assembly time and a production cost of a battery pack are obtained that are truly reduced compared to the methods of assembling accumulators according to the state of the art by one or more busbars by welding, screwing or any other methods.

The steps of assembly of a battery pack P3, of which some of the components are illustrated in FIGS. 58 and 59, can be as follows.

Step a/: a connection assembly 100 incorporating busbars B1, B2 is positioned in an electrically insulating substrate 16 upside down, with the flexible blades 81 ensuring the continuities of service positioned under the substrate 16. Given the magnetic forces involved, the blades 81 are in closed position, that is to say magnetically locked on the busbars B1, B2.

Step b/: a honeycomb structure 101 made of electrically insulating material, comprising recesses in the form of cells 102 suitable for each housing an accumulator, is fixed by snapfitting onto the connection assembly 100.

Step c/: the accumulators A1, . . . Ax are inserted into the cells 102, each of a form suitable for producing a guiding of an accumulator of complementary form. At this stage, each accumulator is in magnetic levitation above the busbars B1, B2 by virtue of the passive repulsion between permanent magnets 12.1, 12.2 of the magnetic locks 11.1, 11.2 of the devices 80.

Step d/: there is then applied in succession, below each accumulator, a magnetic field that can be varied to cancel the field in the lock 11.2 of the shunt. The latter will open under the effect of the spring of the flexible blade 81 and the accumulator will lower into position. The decreasing of the mounting magnetic field under the accumulator will allow it to be connected with locking onto the busbars B1, B2 through the magnetic locks 11.1. The control of the magnetic field makes it possible to obtain a soft and gradual connection. The forces involved in the magnetic locks 11.1 are sufficient to support the weight of the accumulators and have a low contact resistance.

Step e/: The battery pack P3 thus formed is then closed by a base 103 including the battery-pack cooling system.

In addition to the reduced assembly time and cost, the method with the steps described has the important advantage of not handling the bare live parts which usually require restrictive accreditations (of TST type).

The invention is not limited to the examples which have just been described; it is in particular possible to combine with one another the features of the examples illustrated within variants that are not illustrated.

Other variants and enhancements can be envisaged without in any way departing from the scope of the invention.

Generally, the magnetic locks 11 according to the invention can be arranged either in the fixed parts, or in the mobile parts of the assembly of the magnetic connection/disconnection devices with shunt and reversing switches illustrated.

More specifically, except for the configurations in which the shunt of an accumulator is sought, it is possible to envisage incorporating a magnetic lock, either in an output terminal of an accumulator, or alongside a busbar, and respectively the magnetic closure plate cooperating with the magnetic lock, either on the side of the busbar, or in the output terminal of an accumulator.

In the context of the invention, any coil can be powered by any of the accumulators of a battery pack. According to an advantageous variant, when it is incorporated in an output terminal of an accumulator, it can be powered directly thereby.

Regarding the advantageous mounting of a battery pack according to the invention, initially prior to their mechanical and electrical connection with locking, the accumulators are each in magnetic levitation to avoid the undesirable contact which would be due to a magnetic force opposing the weight of the accumulator. The applied magnetic field which allows this levitation must be variable to be able to manage a gradual approach between the accumulator and the busbar to which it must be connected mechanically and electrically and locked.

It is possible to envisage several ways of applying this variable magnetic field:
through external tooling provided with a permanent magnet whose magnetic field is then made to vary either by moving it away from the accumulator, or by using an external coil, or by using the coil of the lock incorporated in one of the terminals of the accumulator;
through blades on the side of the busbar, which then incorporate a magnetic lock comprising a permanent magnet and a coil whose magnetic field is then made to vary.

While, throughout the examples illustrated, the packagings of the accumulators according to the invention are rigid packagings (housings), the invention applies obviously to all the accumulators with flexible packaging in which a magnetic lock or a corresponding magnetic closure plate can be incorporated.

While, throughout the examples illustrated, the housings of the accumulators according to the invention are electrically conductive, the invention applies obviously to all the accumulators with electrically insulating housings.

Furthermore, while, throughout the examples illustrated, the output terminals of the accumulators according to the invention have a generally cylindrical form, the invention applies obviously to all the geometrical forms of terminals (square or rectangular, hexagonal, or other section).

LIST OF REFERENCES CITED

[1] Xuning Fenga, et al. "Key Characteristics for Thermal Runaway of Li-ion Batteries" Energy Procedia, 158 (2019) 4684-4689.
[2] M. Soka et al. «Role of thermomagnetic curves at preparation of Ni Zn ferrites with Fe ions deficiency», Journal of Electrical Engineering, Vol. 61 No. 7/s, 2010, pp 163-165.
[3] K Murakami «The characteristics of Ferrite cores with low Curie temperature and their application», IEEE Transactions on magnetics, Volume: 1, Issue: 2, June 1965.

The invention claimed is:
1. A battery pack comprising:
a plurality of electrochemical batteries or accumulators, each comprising:
a housing or a flexible packaging,
a first output terminal and a second output terminal of an opposite polarity to the first output terminal;
at least one of the output terminals comprising:
an electrically conductive part,
a magnetic lock comprising a permanent magnet;
at least one ferromagnetic part secured to an electrical connecting busbar, called busbar, forming a closure plate of a magnetic circuit with the magnetic lock of the output terminal;
the battery pack being configured such that:
i/ in normal operation of the accumulator, magnetic attraction force of the permanent magnet of the output terminal on the closure plate of a first busbar, in a closed magnetic circuit configuration, ensures the mechanical and electrical connection between the output terminal and the first busbar,
ii/ upon a failure of the accumulator provoking an overheating thereof, the permanent magnet of the output terminal heats up and at least to a temperature from which it loses its magnetic properties, to the point of mechanical disconnection between the output terminal and the first busbar, which causes the accumulator to drop through gravity.
2. The battery pack according to claim 1, comprising:
at least one flexible electrically conductive blade fixed at one of its ends to another busbar or other portion of busbars, comprising a permanent magnet;

the battery pack being configured so that:
- during step i/, the permanent magnet of the flexible blade is repelled by that of the output terminal such that the flexible blade cannot be in electrical contact with the first busbar,
- during step ii/, because of absence of magnetic repulsion of a faulty accumulator having fallen, the electrical connection between the first and the other busbar through respectively the flexible blade, which realizes hence a shunt of the accumulator.

3. The battery pack according to claim 1, wherein a Curie temperature of the permanent magnet is chosen to be between a value close to 90% of a self-heating temperature and a value close to 110% of a thermal runaway temperature of the pack accumulators.

4. The battery pack according to claim 1, wherein the permanent magnet is a sintered magnet or a plasto-magnet.

5. The battery pack according to claim 4, wherein the sintered magnet or the plastomagnet is based on rare earths, including samarium-cobalt or neodymium-iron-boron, or is made of ferrite.

6. The battery pack according to claim 4, wherein the sintered magnet is made of aluminum-nickel cobalt alloy.

7. The battery pack according to claim 1, wherein at least one of the two output terminals comprises at least one second ferromagnetic part arranged around or inside the electrically conductive part, the second ferromagnetic part being closed by the closure plate in a configuration of closure of the magnetic circuit.

8. The battery pack according to claim 7, comprising at least a third ferromagnetic part arranged around the second ferromagnetic part forming an annular housing in which is housed a plasto-magnet, coil being arranged inside the first ferromagnetic part.

9. The battery pack according to claim 1, wherein each ferromagnetic part is made of soft iron.

10. The battery pack according to claim 2, wherein each flexible blade is made of copper-beryllium.

11. The battery pack according to claim 1, wherein each electrically conductive part of each lock is made of the same material as an accumulator output terminal.

12. The battery pack according to claim 1, wherein each electrically conductive part of each lock is made of aluminum or of copper.

13. The battery pack according to claim 1, comprising an electrically conductive crinkle washer or tooth lockwasher, arranged such that, in the configuration of closure of the magnetic connection circuits, it ensures an electrical contact between one of the output terminal equipped with a lock and one of the busbars.

14. The battery pack according to claim 2, comprising an electrically conductive crinkle washer or tooth lockwasher, arranged such that, in a configuration of closure of the magnetic shunt circuits, it ensures an electrical contact between the blade and one of the busbars.

15. The battery pack according to claim 13, wherein each washer is made of copper-phosphorus alloy.

16. The battery pack according to claim 1, wherein the first or second output terminals are arranged on one face of a case or the flexible packaging, while, respectively, the second or the first output terminal is arranged on an opposite face of the case or the flexible packaging, the accumulator being arranged horizontally so that its fall by gravity along ii/ takes place perpendicularly to its longitudinal axis.

17. The battery pack according to claim 1, wherein the first and second output terminals are both arranged on a same face of the housing or the flexible packaging, the accumulator being arranged vertically so that its fall by gravity along ii/ takes place along its longitudinal axis.

18. The battery pack according to claim 1, wherein each accumulator comprises a battery management system fixed on the housing or the flexible packaging of the accumulator and electrically powered by the latter.

19. The battery pack according to claim 1, comprising a honeycomb structure comprising a plurality of recesses each suitable for receiving an accumulator falling by gravity; each recess being capable of being filled with a heat transfer liquid at least once the fall of the accumulator carried out, in order to cool the latter.

20. The battery pack according to claim 19, wherein the heat transfer liquid is that of a cooling circuit of the battery pack, or a liquid independent of said cooling circuit, a supply of which in each housing is controlled by a battery management system of the battery pack, or a liquid resulting from a change of state of a phase change material obtained by heating of the accumulator.

21. The battery pack according to claim 1, each electrochemical battery or accumulator comprising:
- a negative electrode(s) material chosen from the group comprising graphite, lithium, titanium oxide $Li_4Ti_5O_{12}$;
- a positive electrode(s) material chosen from the group comprising $LiFePO_4$, $LiCoO_2$, $LiNi_{0.33}Mn_{0.33}Co_{0.33}O_2$.

* * * * *